(12) United States Patent
Tour et al.

(10) Patent No.: US 12,227,420 B2
(45) Date of Patent: Feb. 18, 2025

(54) LASER-INDUCED GRAPHENE SENSORS AND METHODS OF MAKING AND USING SAME

(71) Applicants: B.G. NEGEV TECHNOLOGIES AND APPLICATIONS LTD., AT BEN-GURION UNIVERSITY, Beer-Sheva (IL); WILLIAM MARSH RICE UNIVERSITY, Houston, TX (US)

(72) Inventors: James Mitchell Tour, Bellaire, TX (US); Duy X. Luong, Houston, TX (US); Kaichun Yang, Houston, TX (US); Christopher John Arnusch, Midreshet Ben-Gurion (IL); Swatantra Pratap Singh, Midreshet Ben-Gurion (IL); Amit Kumar Thakur, Beer-Sheva (IL); Michael G. Stanford, Houston, TX (US); John T. Li, Houston, TX (US); Steven E. Presutti, Houston, TX (US)

(73) Assignees: B.G. NEGEV TECHNOLOGIES AND APPLICATION LTD., AT BEN-GURION U SUNIVERSITY STATE OR COUNTRY), Beer-Sheva (IL); WILLIAM MARSH RICE UNIVERSITY, Houston, TX (US)

( * ) Notice: Subject to any disclaimer, the term of this patent is extended or adjusted under 35 U.S.C. 154(b) by 526 days.

(21) Appl. No.: 17/419,231

(22) PCT Filed: Dec. 30, 2019

(86) PCT No.: PCT/US2019/068933
§ 371 (c)(1),
(2) Date: Jun. 28, 2021

(87) PCT Pub. No.: WO2020/197606
PCT Pub. Date: Oct. 1, 2020

(65) Prior Publication Data
US 2022/0055904 A1 Feb. 24, 2022

Related U.S. Application Data

(60) Provisional application No. 62/786,000, filed on Dec. 28, 2018.

(51) Int. Cl.
*C01B 32/194* (2017.01)
*C01B 32/184* (2017.01)
(Continued)

(52) U.S. Cl.
CPC .......... *C01B 32/194* (2017.08); *C01B 32/184* (2017.08); *H01M 4/587* (2013.01); *H01M 4/625* (2013.01); *H10B 63/00* (2023.02)

(58) Field of Classification Search
CPC ..................................................... C01B 32/194
See application file for complete search history.

(56) References Cited

U.S. PATENT DOCUMENTS

2017/0062821 A1  3/2017  Tour et al.

FOREIGN PATENT DOCUMENTS

WO  2020197606 A9  10/2020

OTHER PUBLICATIONS

Zang, X., Shen, C., Chu, Y., Li, B., Wei, M., Zhong, J., Sanghadasa, M., Lin, L., Adv. Mater. 2018, 30, 1800062. https://doi.org/10.1002/adma.201800062 (Year: 2018).*

(Continued)

*Primary Examiner* — John A Bodnar
(74) *Attorney, Agent, or Firm* — Dickinson Wright PLLC; Ross Spencer Garsson

(57) ABSTRACT

Gas sensors having laser-induced graphene (LIG) and/or LIG composites, and methods of making and using gas sensors having LIG and/or LIG composites.

18 Claims, 64 Drawing Sheets

(51) Int. Cl.
   H01L 27/24    (2006.01)
   H01M 4/587    (2010.01)
   H01M 4/62     (2006.01)
   H10B 63/00    (2023.01)

(56) References Cited

OTHER PUBLICATIONS

Dosi et al., "Design of a Solid-State Electrochemical Methane Sensor Based on Laser-Induced Graphene for Deployment in the Natural Gas Distribution Network" The Electrochemical Society Meet. Abstr. MA2018-01,233rd ECS Meeting May 13, 2018-May 17, 2018 Seattle, WA, 2610, 2018. (Year: 2018).*

Dosi Design of a solid state (Year: 2018).*

Chu, K. H., et al., "Evaluation of Humic Acid and Tannic Acid Fouling in Graphene Oxide-Coated Ultrafiltration Membranes," ACS Appl. Mater. Interfaces., 2016, 8, 22270-22279 ("Chu 2016").

Faria, A. F., et al., "Elucidating the Role of Oxidative Debris in the Antimicrobial Properties of Graphene Oxide," ACS Appl. Nano Mater., 2018, 1 1164-1174 ("Faria 2018").

Fu, C., et al., "Fabrication of Graphene/Titanium Carbide Nanorod Arrays for Chemical Sensor Application," Mater. Sci. Eng. C., 2017, 72, 425-432 ("Fu 2017").

G. Jessop, "Katharometers," J. Sci. Instrum. 1966, 43(11), 777-782 ("Jessop 1966").

Hu, W. et al., "Graphene-based Antibacterial Paper," ACS Nano., 2010, 4, 4317-4323 ("Hu 2010").

Lai, Y., et al: "Stretchable organic memory: toward learnable and digitized stretchable electronic applications", NPG Asia Materials, vol. 6, No. 2, Feb. 1, 2014 (Feb. 1, 2014), pp. e87-e87.

Lamberti, A., et al: "A highly stretchable supercapacitor using laserinduced graphene electrodes onto elastomeric substrate", Advanced Energy Materials, Wiley-V CH Verlag Gmbh & Co. KGAA, DE, vol. 6, No. 10, Mar. 10, 2016.

Li, Y, et al., "Laser-Induced Graphene in Controlled Atmospheres: From Superhydrophilic to Superhydrophobic Surfaces," Adv. Mater. 2017, 1700496 ("Li 2017").

Lin, J., et al., "Laser-Induced Porous Graphene Films from Commercial Polymers," Nature Comm., 2014, 5:5714 ("Lin 2014").

Liu, G. et al., "Graphene-based Membranes," Chem. Soc. Rev., 2015, 44, 5016-5030 ("Liu 2015").

Peng, Z. et al., "Flexible Boron-Doped Laser-Induced Graphene Microsupercapacitors," ACS Nano., 2015, 9, 5868-5875. ("Peng 2015").

Singh, S. P., et al., "Laser-Induced Graphene Biofilm Inhibition: Texture Does Matter," ACS Appl. Nano Mater., 2018, 1, 1713-1720 ("Singh II 2018").

Singh, S. P., et al., "Laser-Induced Graphene Layers and Electrodes Prevents Microbial Fouling and Exerts Antimicrobial Action," ACS Appl. Mater. Interfaces., 2017, 18238-18247 ("Singh 2017").

Singh, S. P., et al., "Sulfur-Doped Laser-Induced Porous Graphene Derived from Polysulfone-Class Polymers and Membranes," ACS Nano., 2018, 12, 289-297 ("Singh I 2018").

Wang, Y., et al: "Laser-Induced Freestanding Graphene Papers: A New Route of Scalable Fabrication with Tunable Morphologies and Properties for Multifunctional Devices and Structures", vol. 14, No. 36, Aug. 7, 2018, p. 1802350.

Ye, R., et al: "Laser-Induced Graphene", Accounts of Chemical Research., vol. 51, No. 7, Jun. 20, 2018, pp. 1609-1620.

Zhang, L., et al., "Nanocomposite Membrane with Polyethylenimine-Grafted Graphene Oxide as a Novel Additive to Enhance Pollutant Filtration Performance," Environ. Sci. Technol., 2018, 52, 5920-5930 ("Zhang 2018").

Zhou, F., et al., "Electrochemically Scalable Production of Fluorine-Modified Graphene for Flexible and High-Energy Ionogel-Based Microsupercapacitors," J. Am. Chem. Soc., 2018, 140, 8198-8205 ("Zhou 2018").

International Searching Authority, International Search Report and Written Opinion for PCT/US2019/068933, dated Nov. 23, 2020; 22 pages.

Patent Cooperation Treaty, International Preliminary Report on Patentability for PCT/US2019/068933, dated Jul. 8, 2021; 14 pages.

* cited by examiner

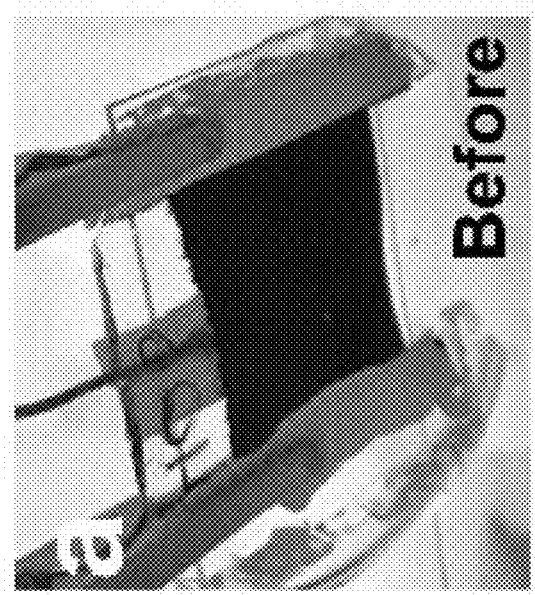
FIG. 4A Before
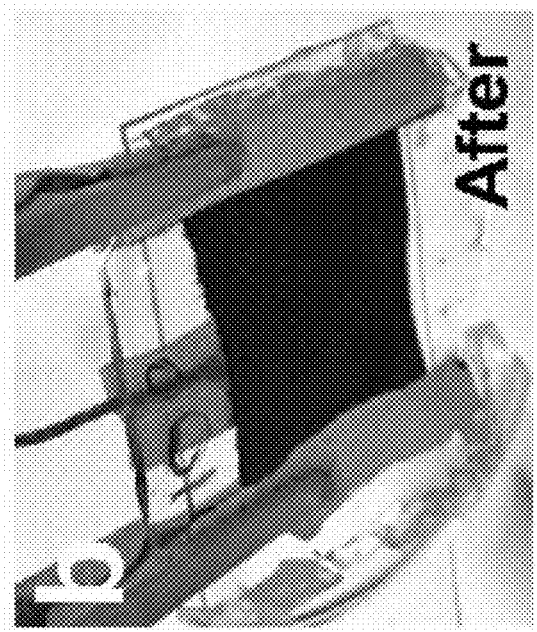
FIG. 4B After
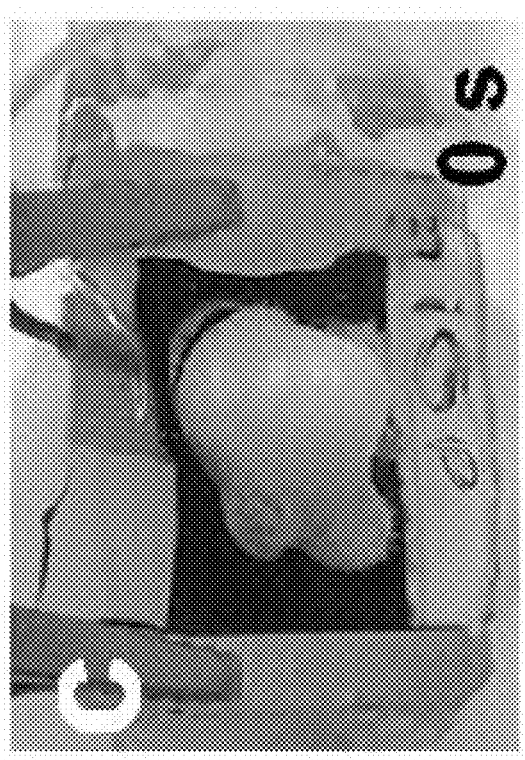
FIG. 4C 0 s
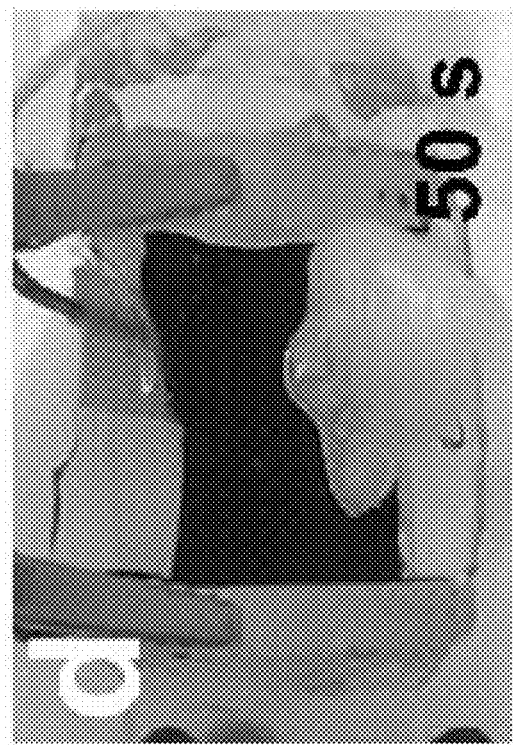
FIG. 4D 50 s

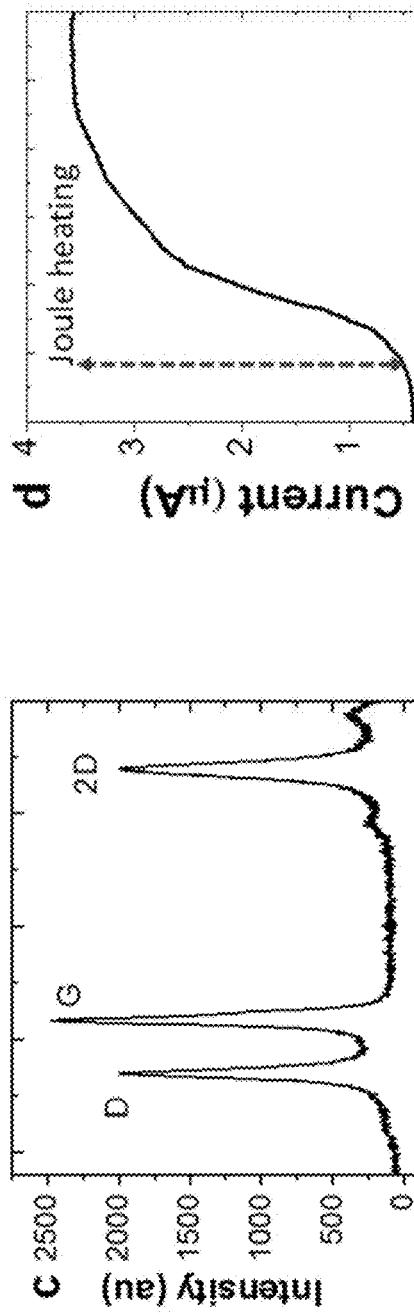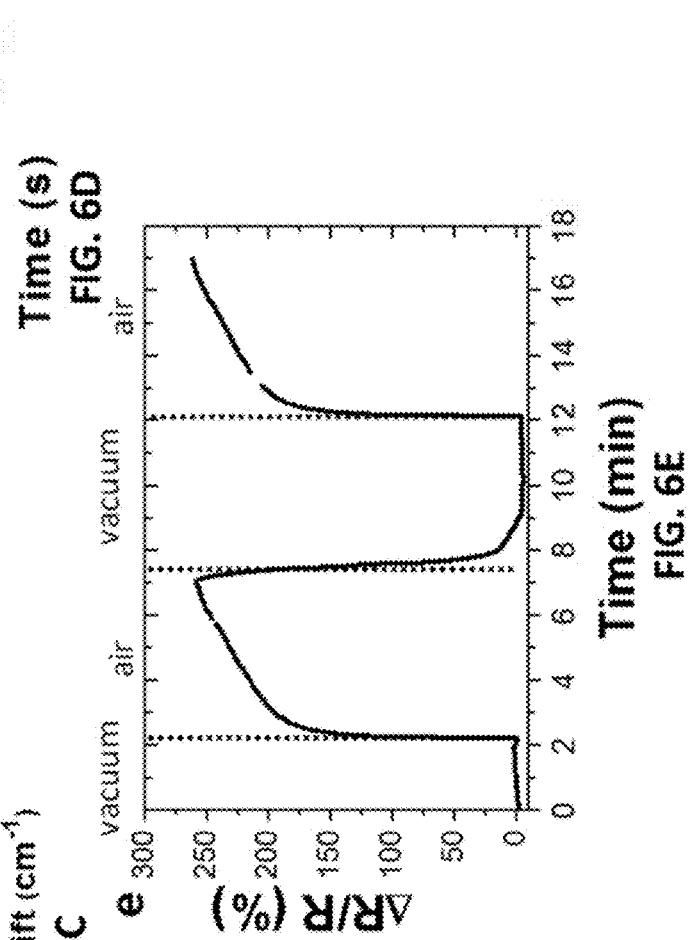
FIG. 6C
FIG. 6D
FIG. 6E

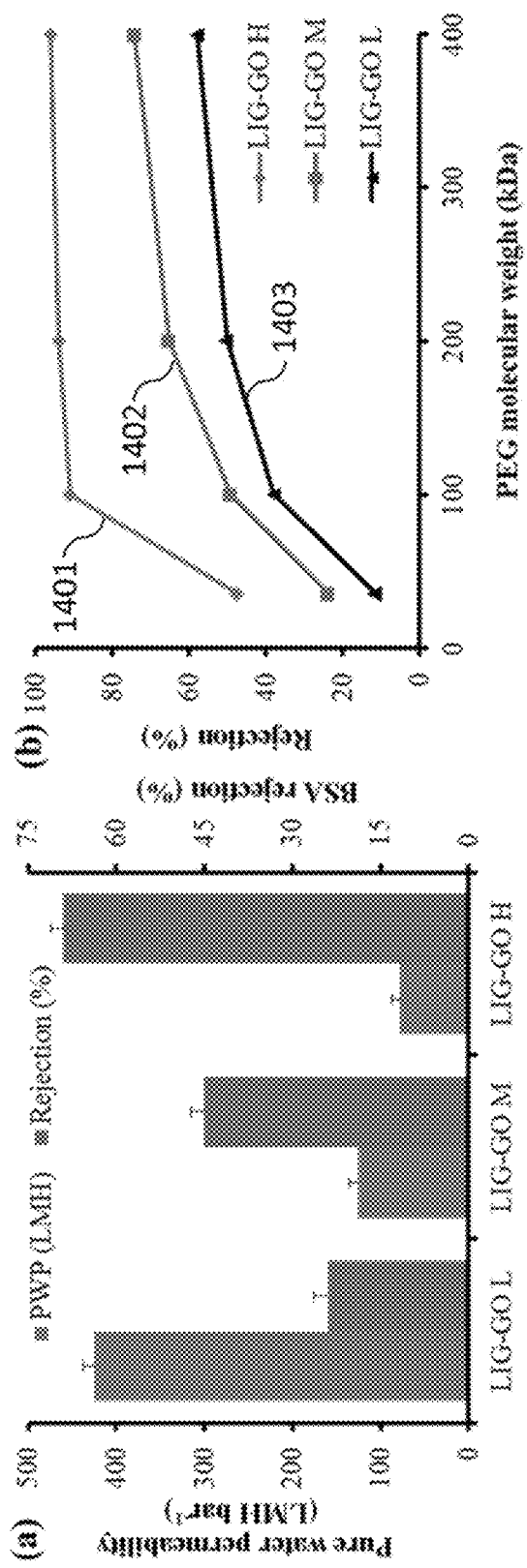
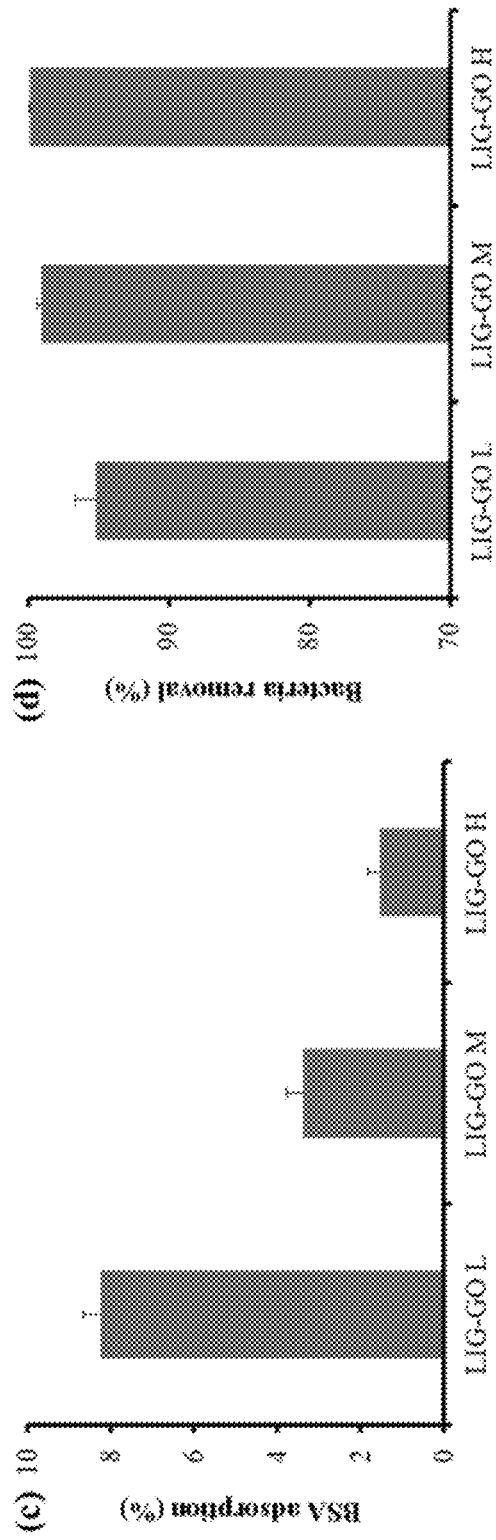
FIG. 14A
FIG. 14B
FIG. 14C
FIG. 14D

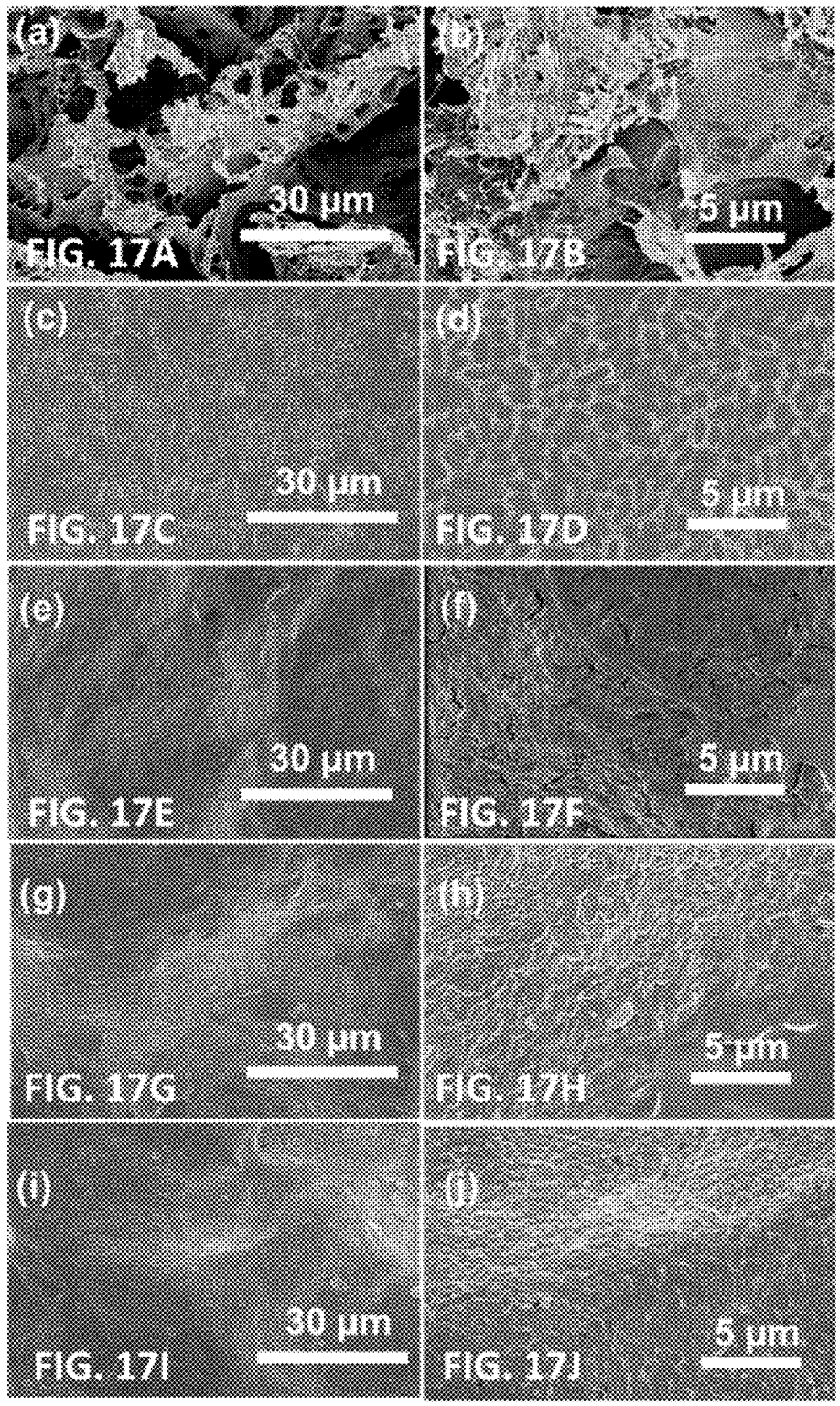

(a)

(b)

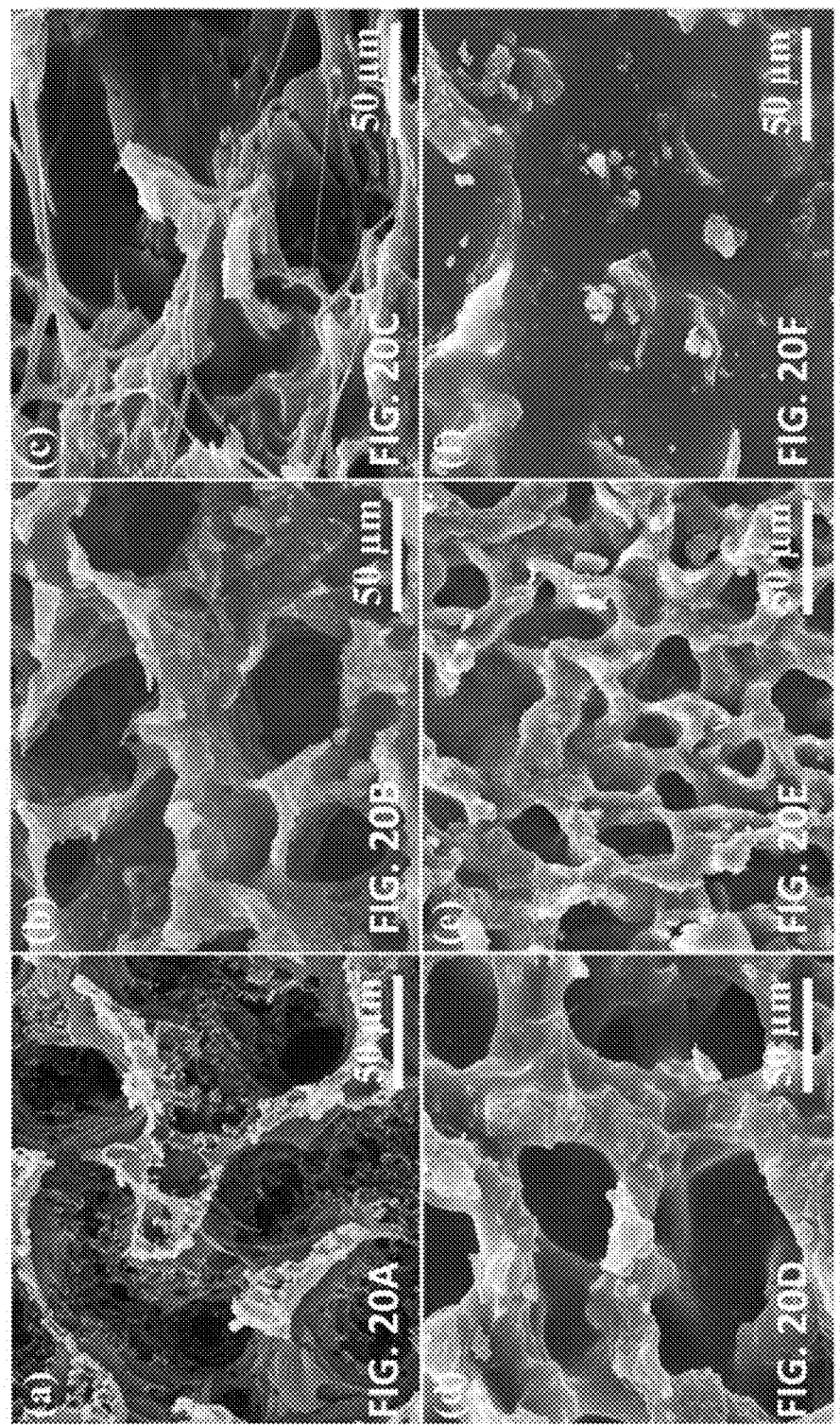

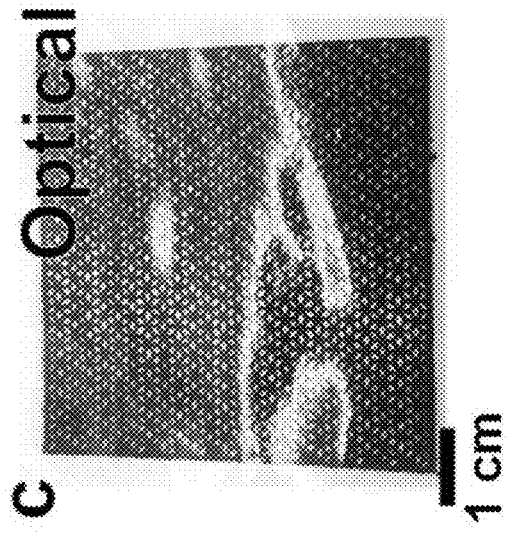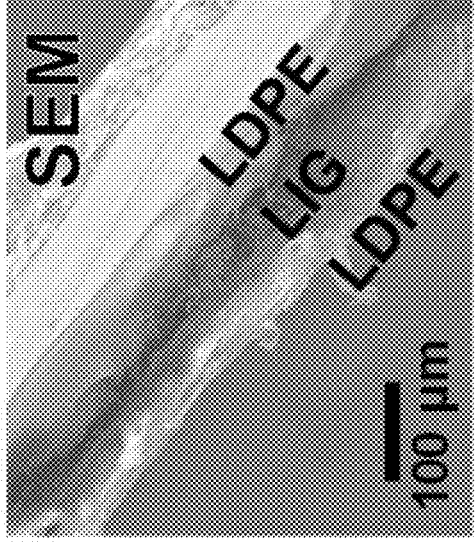
FIG. 27C
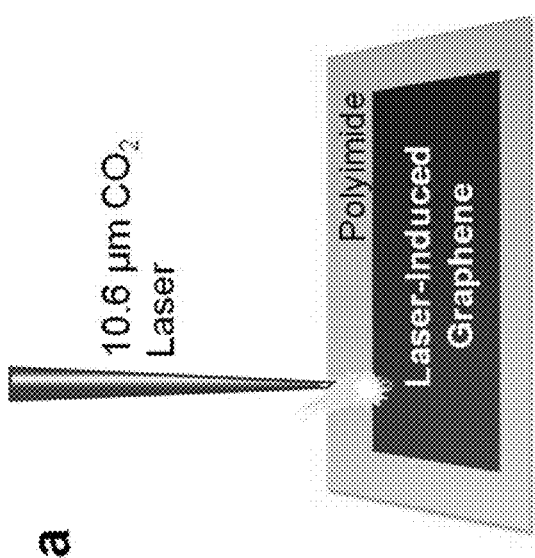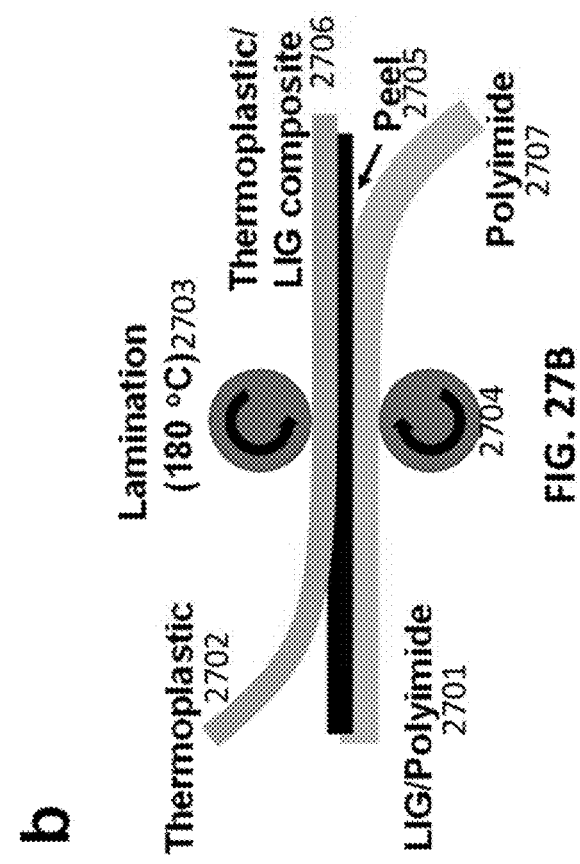
FIG. 27A
FIG. 27B

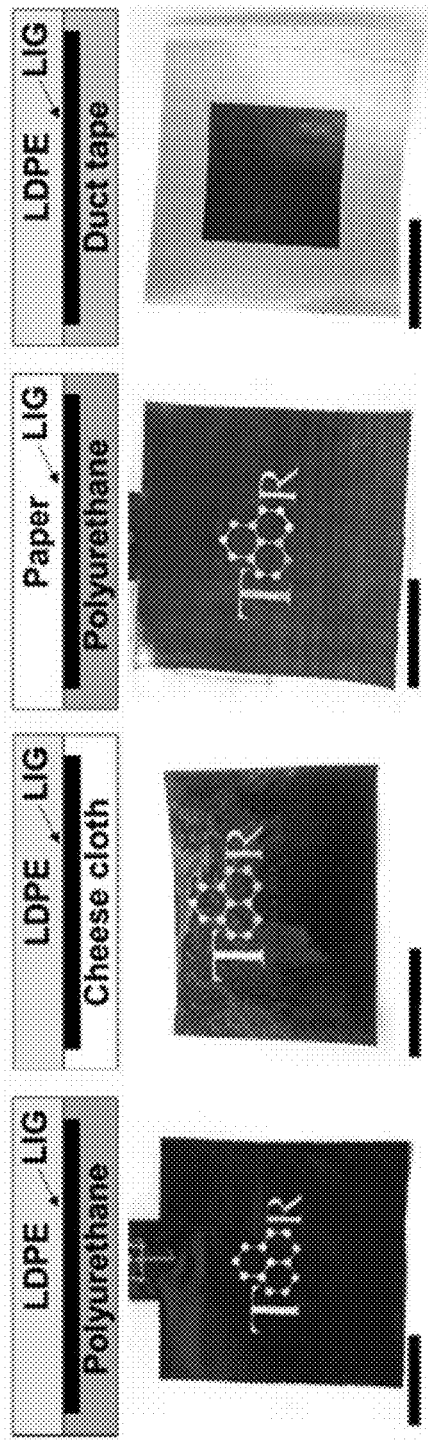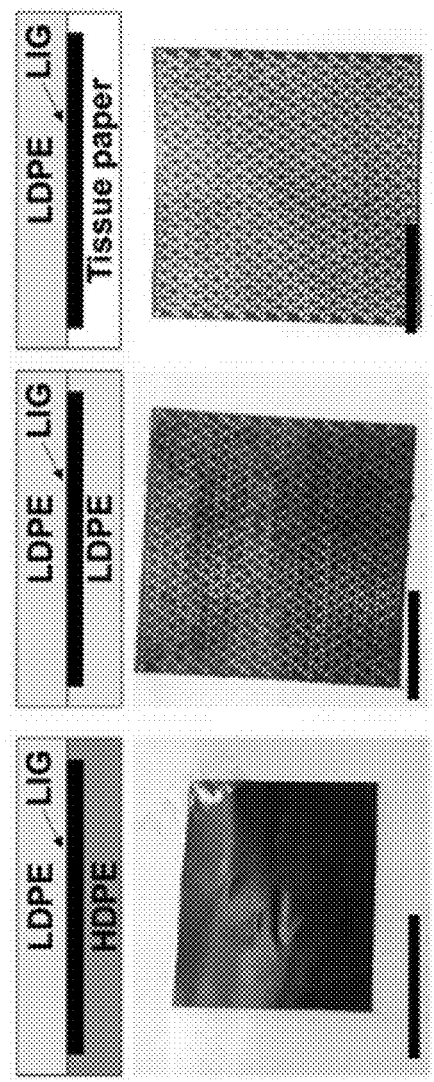
FIG. 28A  FIG. 28B  FIG. 28C  FIG. 28D
FIG. 28D  FIG. 28E  FIG. 28F

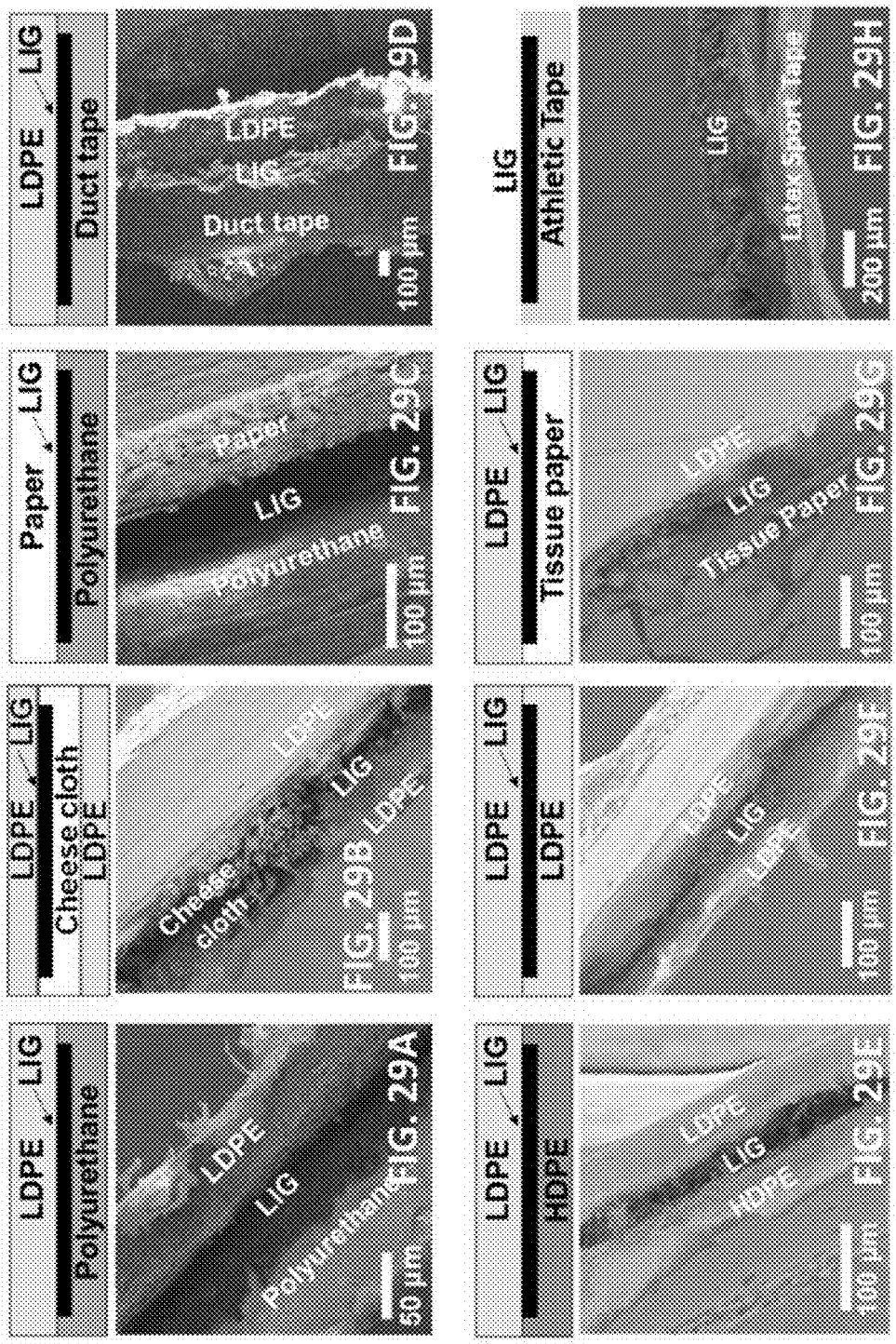

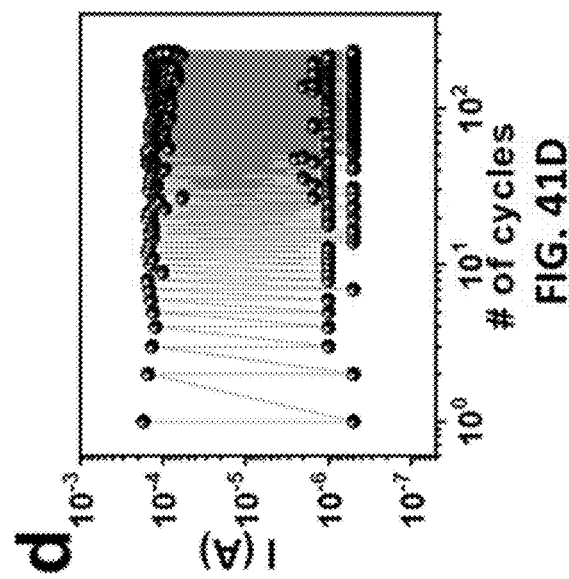
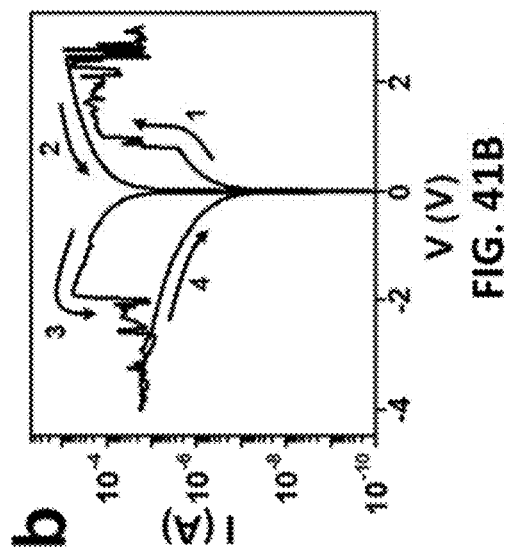
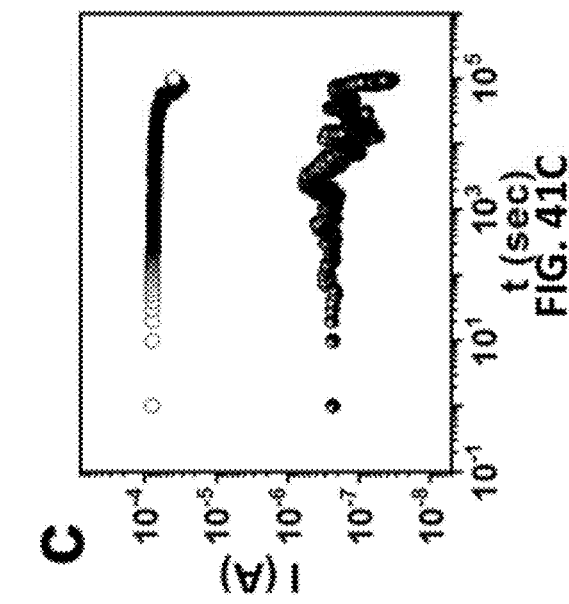
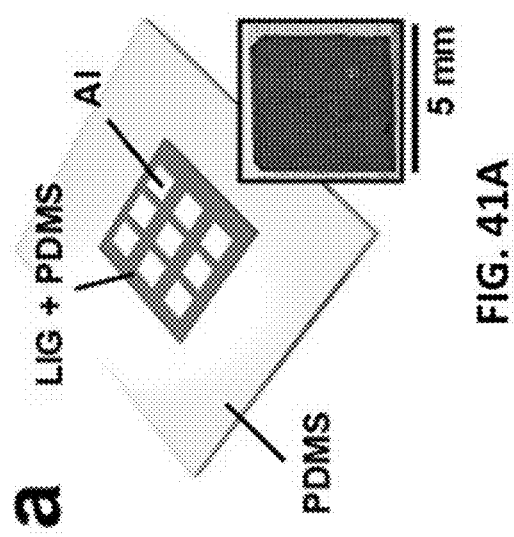
FIG. 41A
FIG. 41B
FIG. 41C
FIG. 41D

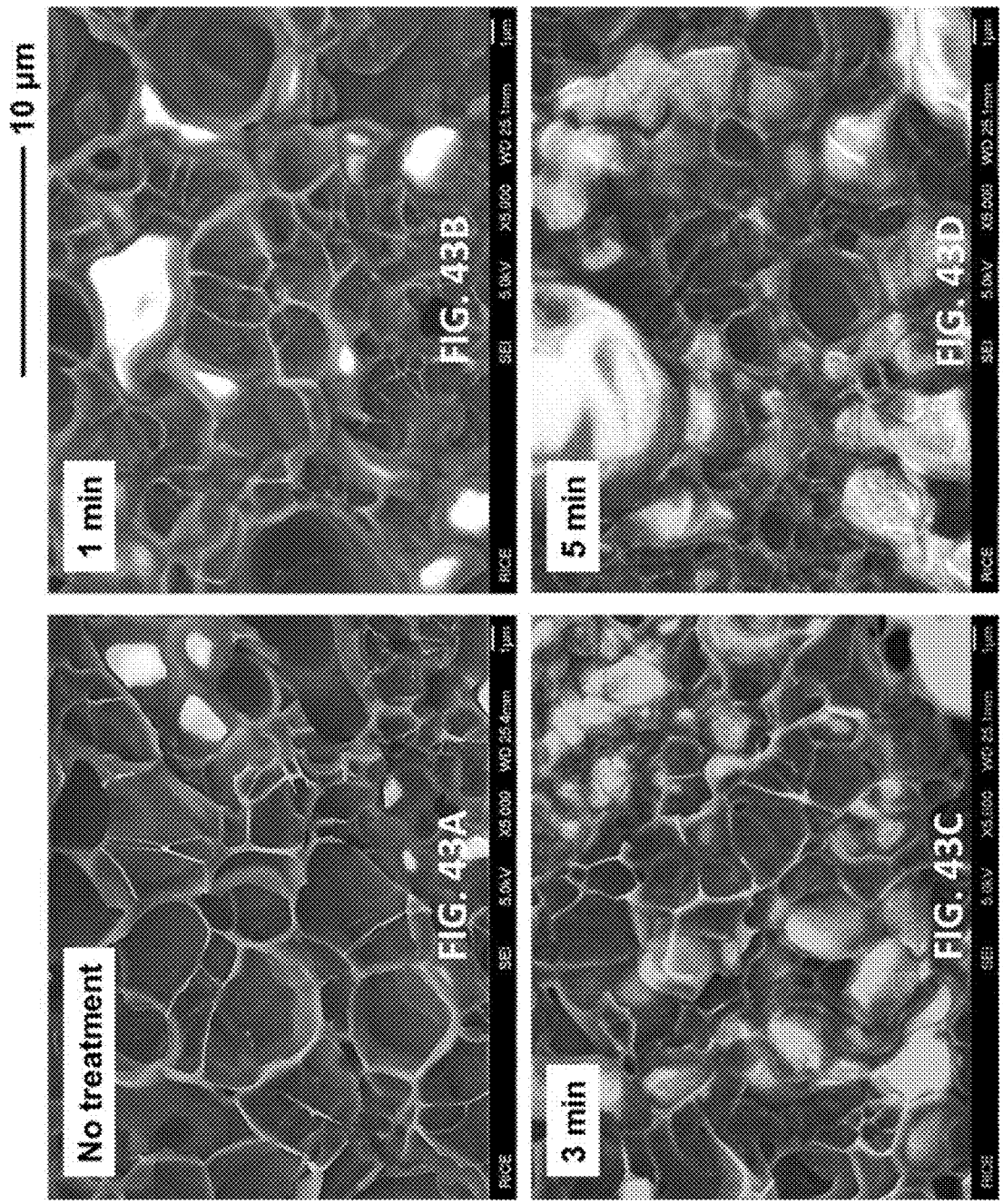

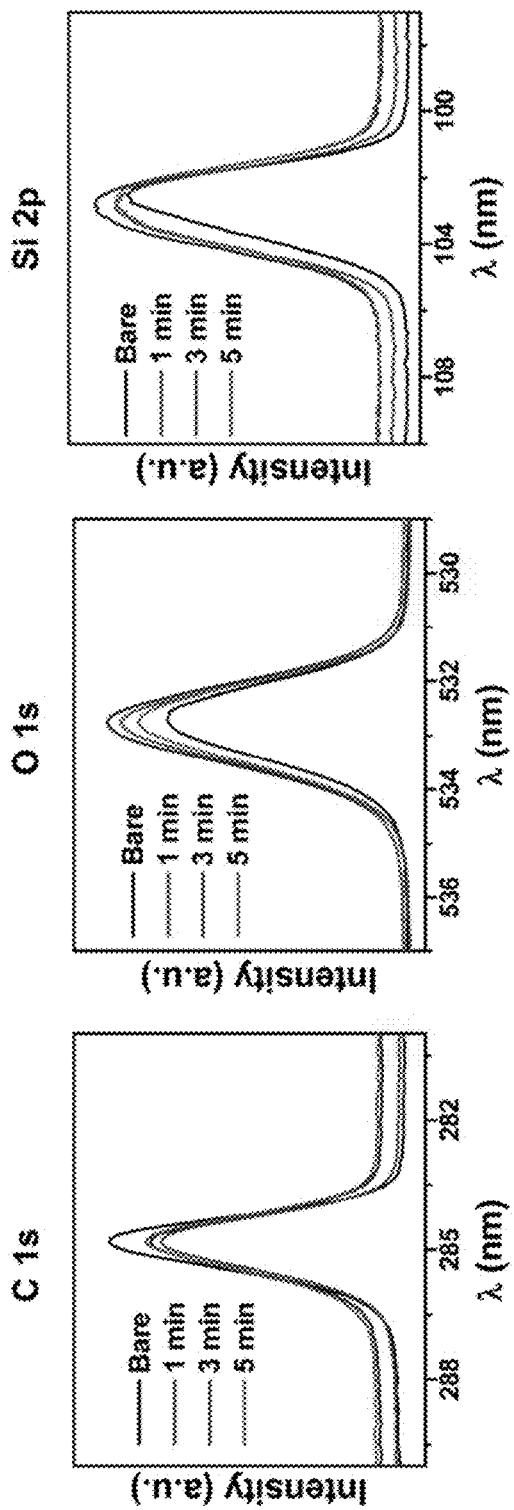

Initial ($\varepsilon = 0\%$)

$\varepsilon = 3.8\%$ $\varepsilon = 7.7\%$ $\varepsilon = 11.5\%$

LASER-INDUCED GRAPHENE SENSORS AND METHODS OF MAKING AND USING SAME

CROSS-REFERENCE TO RELATED PATENT APPLICATION

This application claims priority to U.S. Patent Appl. 62/786,000, entitled "Laser-Induced Graphene Composites And Sensors And Methods Of Use Thereof," filed Dec. 28, 2018, which patent application is commonly owned by the owners of the present invention. This patent application is hereby incorporated by reference in its entirety for all purposes.

GOVERNMENT INTEREST

This invention was made with government support under Grant No. FA9550-14-1-0111, awarded by the United States Department of Defense/Air Force Office of Scientific Research. The United States government has certain rights in the invention.

TECHNICAL FIELD

The present invention relates to laser-induced graphene (LIG) composites and LIG sensors. More particularly, methods for stabilizing laser-induced graphene (LIG) through composite formation and compositions thereof and methods for making and using LIG in flexible and embeddable gas sensors.

BACKGROUND

Graphene, a two-dimensional carbon nanomaterial that has exhibited exceptional properties, such as mechanical strength, high thermal conductivity, good electrical conductivity, ballistic transport, among other, and is a promising material for a variety of applications in energy storage, flexible electronic and electrochemical catalysis. To commercialize graphene, technologies have been developed for synthesizing bulk quantities, as well as for producing roll-to-roll compatible films. Recently, laser photothermal conversion has emerged as a roll-to-roll compatible method to generate laser-induced graphene (LIG) films.

LIG is a porous graphene conductive graphene foam that is produced from a variety of carbon sources through a direct-write process using a commercial $CO_2$ laser cutter. The process enables patterning of various desired geometries, and proper adjustment of laser parameters leads to the formation of several useful morphologies. The most convenient substrate that is used as the carbon precursor is polyimide (PI), which is converted through a one-step direct-write lasing procedure.

The physical properties of LIG can be controlled by varying experimental conditions including the laser pulse parameters and lasing atmosphere. Applications of LIG for energy storage, electrocatalysis, thermal conduction and water treatment have been demonstrated, including exceptional resistance to biofilm growth in water purification applications. LIG has evolved into a platform material upon which numerous commercial applications can be envisioned. However, the weak adherence of LIG to the PI substrate hinders its use in some technology applications.

Previous studies of polydimethylsiloxane (PDMS)/LIG composites have shown potential applications in soft electronics for strain sensors and supercapacitors. There remains, however, a need to transfer LIG onto a variety of commercial materials (such as from polymers to sub-micro sized particles) and for increase robustness of the LIG materials. There also remains a need for further uses involving LIG.

SUMMARY OF THE INVENTION

The present invention is directed to methods for stabilizing laser-induced graphene (LIG) through composite formation and compositions thereof. Using an infiltration method, LIG composites (LIGCs) with physical properties can be engineered on various substrate materials. The physical properties include surface properties, such as superhydrophobicity and antibiofouling; the LIGCs are also useful in antibacterial applications, Joule-heating applications, and as resistive memory device substrates.

The present invention is also directed to new uses for LIG (both with and without being part of a composite formation). LIG is used to create a gas sensor that detects the thermal conductivity of surrounding gaseous media, similar to a katharometer. This enables the gas sensor to detect a broad range or gases and gas mixtures. The gas sensors can be direct-written on a flexible polyimide (PI) substrate. Sensors are also embeddable within cement, which enables the incorporation of sensors directly into construction materials.

In general, in one embodiment, the invention features a method of fabricating a LIG composite material. The method includes the step of exposing a first side of a polymer to a laser source. The step of exposing results in formation of laser-induced graphene (LIG) on the first side of the polymer. The LIG is derived from the polymer. The method further includes the step of infiltrating the LIG with a host material to form a LIG/host material composite on the first side of the polymer. The method further includes the step of removing the LIG/host material composite from the polymer.

Implementations of the invention can include one or more of the following features:

The method can include placing a mold on the first side of the polymer before infiltrating the LIG with the host materials.

The step of removing the LIG/host material composite from the polymer can include flipping over the mold, peeling the polymer from the LIG/host material composite, and removing the mold.

The step of removing the LIG/host material composite from the polymer can include peeling the polymer from the LIG/host material composite.

The polymer can be selected from a group consisting of homopolymers, vinyl polymers, step-growth polymers, condensation polymers, polymers made through living polymer reactions, chain-growth polymers, block co-polymers, carbonized polymers, aromatic polymers, cyclic polymers, polyimide (PI), polyetherimide (PEI), polyether ether ketone (PEEK), elastomers, rubbers, recycle plastics, poly(ethylene terephthalate), polytetrafluoroethylene, polyethylene, polypropylene, polybutadiene, poly(styrene butadiene), polystyrene, polycarbonates, polyamides, polyimides, polyurethanes, thermoplastics, thermosets, and combinations thereof.

The polymer can include polyimide (PI).

The host material can be selected from a group consisting of PDMS, wax, acrylic paint, epoxy, cement, latex paint, alkaline activated geopolymers, polyethylene (PE), polypropylene (PP), polystyrene (PS), thermoplastic materials, and combinations thereof.

The host material can include cells.

The cells can be selected from a group consisting of stem cells, neurons, brain tissue cells, hydroxyapatite, wood cells, and plant cells.

The host material can be a hydrophobic material.

The LIG composite material can exhibit superhydrophobicity.

The host material can be a hydrophilic material.

The LIG composite material can have an antibiofouling surface property.

The LIG composite can have an anti-icing surface.

The method can further include applying a voltage across the LIG composite so that the LIG composite is an active de-icing material.

The LIG composite can be a highly sensitive piezoresistive material.

The LIG composite can have a gauge factor that is at least 100 at less than 5% strain.

The LIG composite can have a gauge factor that is at least 1000 at less than 5% strain.

The LIG composite can have an unstrained length and a first resistance at the unstrained length. The LIG composite can have a property that, when the LIG composite is elongated by one one-thousandth of the unstrained length, the LIG composite has a second resistance. The second resistance can be at least twice the first resistance.

The second resistance can be between two and four times the first resistance.

In general, in another embodiment, the invention features a LIG composite that includes LIG and a host material infiltrated in the LIG.

Implementations of the invention can include one or more of the following features:

The LIG composition can be made by any one of the above-described processes.

The host material can be selected from a group consisting of PDMS, wax, acrylic paint, epoxy, cement, latex paint, alkaline activated geopolymers, polyethylene (PE), polypropylene (PP), polystyrene (PS), thermoplastic materials, and combinations thereof.

The host material can include cells.

The cells can be selected from a group consisting of stem cells, neurons, brain tissue cells, hydroxyapatite, wood cells, and plant cells.

The host material can be a hydrophobic material.

The LIG composite material can exhibit superhydrophobicity.

The host material can be a hydrophilic material.

The LIG composite material can have an antibiofouling surface property.

The LIG composite can have an anti-icing surface.

The LIG composite can be an active de-icing material.

The LIG composite can be a highly sensitive piezoresistive material.

The LIG composite can have a gauge factor that is at least 100 at less than 5% strain.

The LIG composite can have a gauge factor that is at least 1000 at less than 5% strain.

The LIG composite can have an unstrained length and a first resistance at the unstrained length. The LIG composite can have a property that, when the LIG composite is elongated by one one-thousandth of the unstrained length, the LIG composite has a second resistance. The second resistance can be at least twice the first resistance.

The second resistance can be between two and four times the first resistance.

In general, in another embodiment, the invention features a device including any one of the above-described LIG composites.

Implementations of the invention can include one or more of the following features:

The device can be selected from a group consisting of flexible electronics, sensors, deicing, batteries, lightweight wiring, supercapacitors, electrochemical reaction devices, memory devices, thermal therapy devices, electrodes, Joule heating devices, and morphology control devices.

The device can be an electrochemical reaction device selected from a group consisting of devices for water splitting and fuel cells, oxygen evolution reaction, oxygen reduction reaction, hydrogen evolution reaction, hydrogen oxidation reaction, batteries, supercapacitors, pseudocapacitors, microsupercapacitors, anodes, cathodes, metal-air batteries, metal-oxygen batteries, lithium metal anodes, and lithium ion batteries.

The device can be a memory device that is a resistive memory device.

In general, in another embodiment, the invention features a gas sensor that includes laser-induced graphene (LIG).

Implementations of the invention can include one or more of the following features:

The gas sensor can be operable to sense a gas based on thermal conductivity changes.

The gas sensor can be operable to sense a gas selected from a group consisting of argon, carbon dioxide, dinitrogen, air, dioxygen, helium, dihydrogen, methane, propane, butane, benzene, and acetone, and mixtures thereof.

The gas sensor can be operable to sense a hydrocarbon gas.

The gas sensor can be operable to sense an ionic gas.

The gas sensor can be operable to sense a dipolar gas.

The dipolar gas can be hydrogen chloride.

The gas sensor can be operable to sense a volatile organic compound.

The gas sensor can be operable to sense a compound selected from a group consisting of alcohols, ketones, carboxylic acids, and combinations thereof.

The gas sensor can be operable to sense a plasma.

The gas sensor can be operable to be repeatedly cleaned by applying a voltage across the laser-induced graphene which heats the gas sensor to displace adsorbates.

The gas sensor can be operable to sense flue gas or flue gas mixtures.

The gas sensor includes the LIG in a LIG composite.

The LIG composite can include the LIG embedded in concrete or cement.

The gas sensor can be built into concrete or cement.

The gas sensor can have two patterned LIG electrodes with a less than 50 μm PI gap between the two patterned LIG electrodes.

The gas sensor can have a patterned continuous LIG filament.

In general, in another embodiment, the invention features a method that includes forming a gas sensor comprising laser-induced graphene (LIG).

Implementations of the invention can include one or more of the following features:

The gas sensor formed in the method can be any one of the above-described gas sensors.

The method can further include patterning or laser-writing a laser-induced graphene wire between two electrodes.

The electrodes can be made of a material selected from the group consisting of metal, semiconductor or laser-induced graphene and combinations thereof.

In general, in another embodiment, the invention features a method that includes selecting a gas sensor comprising laser-induced graphene (LIG). The method further includes utilizing gas sensor to sense a gas or plasma.

Implementations of the invention can include one or more of the following features:

The gas sensor can be any one of the above-described gas sensors.

The step of utilizing the gas sensor to sense the gas or plasma can be based on thermal conductivity changes.

The gas sensor can be utilized to sense a gas that is selected from a group consisting of argon, carbon dioxide, dinitrogen, air, dioxygen, helium, dihydrogen, methane, propane, butane, benzene, and acetone, and mixtures thereof.

The gas sensor can be operable to sense a hydrocarbon gas.

The gas sensor can be utilize to sense an ionic gas.

The gas sensor can be utilized to sense a volatile organic compound.

The gas sensor can be utilized to sense a compound selected from a group consisting of alcohols, ketones, carboxylic acids, and combinations thereof.

The gas sensor can be utilized to sense the plasma.

The method can further include repeatedly cleaning the gas sensor by applying a voltage across the laser-induced graphene which heats the gas sensor to displace adsorbates.

The gas sensor can be utilized to sense flue gas or flue gas mixtures.

The gas sensor can include the LIG in a LIG composite.

The LIG composite can include the LIG embedded in concrete or cement.

The gas sensor can be built into concrete or cement.

The gas sensor can have two patterned LIG electrodes with a less than 50 μm PI gap between the two patterned LIG electrodes.

The gas sensor can have a patterned continuous LIG filament.

In general, in another embodiment, the invention features a membrane comprising a LIG-GO composite.

Implementations of the invention can include one or more of the following features:

The LIG-GO composite can include LIG cross-linked to GO.

The membrane can be an antifouling, electrically conductive ultrafiltration membrane.

In general, in another embodiment, the invention features a method that includes depositing GO on a LIG membrane. The method further includes crosslinking the GO and LIG utilizing a crosslinker to form a LIG-GO composite membrane.

Implementations of the invention can include one or more of the following features:

The crosslinker can be glutaraldehyde.

The method can further include the step of forming the LIG membrane by utilizing a laser to irradiate a substrate to form LIG on the substrate.

The substrate can include PI.

The LIG can be printed on the substrate in a pattern.

The LIG-GO composite membrane can be a LIG GO UL composite membrane.

The LIG-GO composite membrane can be a LIG GO L composite membrane.

The LIG-GO composite membrane can be a LIG GO M composite membrane.

The LIG-GO composite membrane can be a LIG GO H composite membrane.

The loading of the GO deposited on the LIG membrane can be in an amount between 0.5 mg/cm$^2$ and 2 mg/cm$^2$.

In general, in another embodiment, the invention features a method that includes selecting a LIG-GO composite membrane. The method further includes utilizing the LIG-GO composite membrane for filtration of bacterial cells.

Implementations of the invention can include one or more of the following features:

The filtration of bacterial cells can filtrate at least 95%.

The filtration can be at least 99%.

In general, in another embodiment, the invention features a membrane comprising a LIG-PVA composite.

Implementations of the invention can include one or more of the following features:

The membrane can be an electrically conductive treatment membrane.

The LIG-PVC composite can include LIG cross-linked to PVC.

The LIG-PVC composite can include between 0.5% and 4% of PVC.

In general, in another embodiment, the invention features a method that includes surface coating a LIG membrane with PVC. The method further includes crosslinking the PVC and LIG utilizing a crosslinker to form a LIG-PVC composite membrane.

Implementations of the invention can include one or more of the following features:

The crosslinker can be glutaraldehyde.

The method can further include the step of forming the LIG membrane by utilizing a laser to irradiate a substrate to form LIG on the substrate.

The substrate can include PES.

The PVA can be deposited in a concentration between 0.5% and 4%.

In general, in another embodiment, the invention features a method of forming a LIG composite. The method includes selecting LIG on a substrate. The method further includes laminating the LIG on the substrate with a thermoplastic polymer to form a composite including a thermoplastic, LIG, and substrate composite. The method further includes separating the substrate from the thermoplastic, LIG, and substrate composite to form a thermoplastic-LIG composite.

Implementations of the invention can include one or more of the following features:

The method can further include utilizing a laser to irradiate the substrate to form the LIG on the substrate.

The method can further include incorporating the thermoplastic-LIG composite in a device.

The device can be a triboelectric nanogenerator.

The device can be a puncture detector.

The thermoplastic can be duct tape or a polyurethane film tape.

The method can further include incorporating the thermoplastic-LIG composite in a biomedical material or a bandage.

The method can further include converting the thermoplastic-LIG composite to a superhydrophilic wound-contacting surface.

The method can be a continuous process.

The laminating step can be performed at a temperature at most 180°.

The thermoplastic-LIG composite can further include a reinforcement material.

The reinforcement materials can be tissue paper or cheesecloth.

The thermoplastic polymer can be selected from a group consisting of polypropylene, LDPE, HDPE, polystyrene, ethylene vinyl acetate, PVC, polyurethane, and combinations thereof.

In general, in another embodiment, the invention features a thermoplastic-LIG composite made by any one of the above-described methods.

In general, in another embodiment, the invention features a method of making a resistive memory device. The method includes selecting a LIG composite. The method further includes depositing a metal by e-beam evaporation on the LIG composite.

Implementations of the invention can include one or more of the following features:

The method can further include performing an $O_2$ plasma treatment on LIG composite before the step of depositing.

The metal can include Al.

The LIG composite can include LIG-PDMS composite.

The method can further include utilizing a laser to irradiate a substrate to form LIG on the substrate, and forming the LIG composition from the LIG on the substrate.

The step of depositing can include utilizing a shadow mask.

The resistive memory device can be capable of resistive switch behavior at a tensile strain of 7.7% without degradation.

In general, in another embodiment, the invention features a resistive memory device comprising a LIG composite.

Implementations of the invention can include one or more of the following features:

The resistive memory device can be made by any one of the above-described methods.

The LIG composite can include LIG-PDMS composite.

The resistive memory device can be capable of resistive switch behavior at a tensile strain of 7.7% without degradation.

In general, in another embodiment, the invention features a triboelectric nanogenerator comprising a LIG composite.

Implementations of the invention can include one or more of the following features:

The LIG composite can include LIG-PDMS composite.

The triboelectric nanogenerator can be selected from a group consisting of LDPE/LIG/PU TENGs and PU/LIG/Paper TENGs

BRIEF DESCRIPTION OF THE DRAWINGS

FIGS. 4A-4B are photographs of a LIG composite before and after, respectively, an anti-icing test at −20° C.

FIGS. 4C-4D are photographs of a LIG composite before and after, respectively, the application of an applied voltage for 50 seconds.

FIG. 6C is the Raman spectra of LIG, which confirm graphene formation.

FIG. 6D is a graph showing device current after applying a voltage source (5 V) that then results in Joule heating.

FIG. 6E is a graph showing response (change is resistance) of the gas sensor when exposed to air. Sensor voltage (Vs)=5 V.

FIGS. 14A-14D show performance parameters for LIG-GO L, M, and H membranes. FIG. 14A shows the water permeability and BSA rejection. FIG. 14B shows rejection of various PEG compounds with LIG-GO membranes. FIG. 14C shows BSA static adsorption. FIG. 14D shows bacterial cells removal.

FIG. 15A shows compaction at 1.5 bar for 3 hours. FIG. 15B shows rejection of BSA with LIG-GO H membrane. FIG. 15C shows a BSA fouling test including two cycles with flux recovery after 30 min DI water wash.

FIGS. 17A-17J are SEM images showing biofilm extent on different surfaces after biofilm growth experiments. FIGS. 17A-17B are LIG at low and high magnification, respectively. FIGS. 17C-17D are UP010 polymeric membrane at low and high magnification, respectively. FIGS. 17E-17F are LIG-GO L at low and high magnification, respectively. FIGS. 17G-17H are LIG-GO M at low and high magnification, respectively. FIGS. 17I-17J are LIG-GO H at low and high magnification, respectively.

FIGS. 20A-20F are surface SEM images of (a) LIG (b) LIG-PVA-0.5 (c) LIG-PVA-1 (d) LIG-PVA-2 (e) LIG-PVA-3 and (f) LIG-PVA-4 membranes, respectively.

FIG. 27A is a schematic of LIG synthesis on the surface of a substrate (PI).

FIG. 27B is a schematic showing lamination process of LIG into various thermoplastics with removal from the substrate (PI).

FIG. 27C is an optical image and SEM cross-section of LPDE/LIG Pattern/LDPE that was generated with two lamination steps.

FIGS. 28A-28F are optical images of various multilayer and multicomponent LIG composites made utilizing a lamination process.

FIGS. 29A-29H are SEM cross-sections of various multilayer and multicomponent LIG composites made utilizing a lamination process.

FIGS. 41A-41D shows a resistive memory device. FIG. 41A is a schematic diagram and photograph of the fabricated device. FIG. 41B is a graph showing resistive switching characteristics of the fabricated memory device. FIGS. 41C-41D are graphs showing retention and endurance characteristics of the device.

FIGS. 43A-43D are SEM images of the surface of LIGC-PDMS samples with and without $O_2$ plasma treatment.

FIGS. 45A-45C are the XPS spectra of the LIGC-PDMS surfaces with and without $O_2$ plasma treatment.

FIG. 48A shows resistive switching characteristics of the memory device at ε=0, 3.8 and 7.7%. FIG. 48B shows endurance characteristics of the memory device at =7.7%.

FIG. 50A shows a schematic diagram of cross-sectional view of the fabricated LIGC-PDMS device. FIGS. 50A-50B shows resistive switching mechanism of the memory device under positive and negative bias, respectively. The dark dots are oxygen ions, while the light dots are oxygen vacancies.

DETAILED DESCRIPTION

Stabilization of LIG Through Composite Formation and Compositions Thereof
Method of Fabricating LIG Composite Applicants have previous discovered a process and composition for laser-induced porous graphene from commercial polyimide films. [Li 2014; Tour '821 Application]. The present invention relates to a process, composition and device in which the laser-induced graphene (LIG) can be stabilized by filling its porous structure with various fillers to form a laser-induced graphene composite.

To fabricate laser-induced graphene composites (LIGC), filler materials are infiltrated into the freshly made porous LIG on a substrate (such as PI) by gravity or through hot pressing into a polymer sheet. The final cured or solidified product is flipped upside down and the PI layer is peeled off to reveal the composite surface. The flipping is convenient for hand processing. If automated, the flipping would not be an essential step. LIG forms composites with a wide variety of common materials include solid hydrocarbon, elastomer, epoxy, cement and geopolymer. Particularly, constructional materials such as latex paint (LP), Portland cement (PC), alkaline activated geopolymer (AAG) and commercial plastics such as polyethylene (PE), polypropylene (PP), and polystyrene (PS) successfully form composites with LIG. The infiltration process is optimized with each material to maximize the amount of LIG transferred to the composite.

Figure 1A:
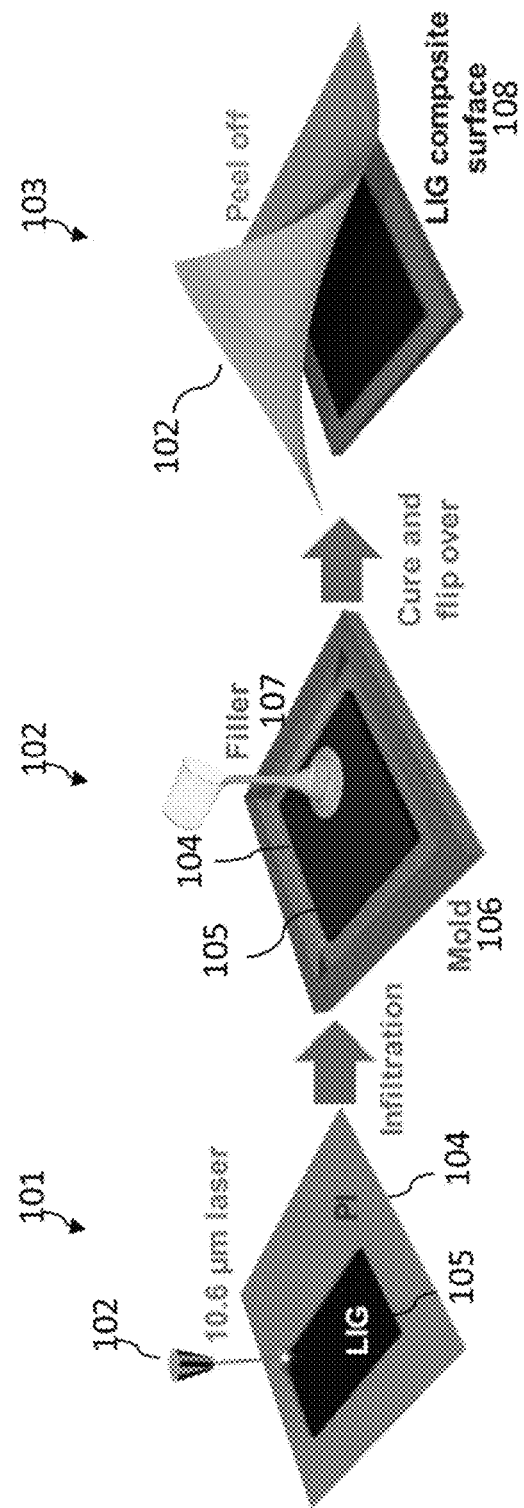
FIG. 1A is a schematic shows the steps for fabricating a LIG composite of the present invention.

FIG. 1A shows a schematic of a process to make the laser-induced graphene composite.

The laser-induced graphene can be made from a commercial polyimide film, such as described in Li 2014. As shown in step 101, laser induction can be conducted on a polyimide (PI) film substrate 104 using a laser 102 (75 W 10.6 μm $CO_2$ laser Universal Laser System's XLS10MWH platform operating in pulse width modulation) to induce the LIG 105. For example, the laser speed can be 5%, image density of 500 pulse per inch, and duty cycle at 12%.

As shown in step 102, an infiltration step is performed in which a mold 106 is positioned upon the side of PI 104 that has been laser treated (and upon which the LIG 105 was induced). A filler 107 is then applied within the mold 106 (such as by a step of pouring the filler 107). The filler 107 is then cured.

As shown in step 103, after curing the mold 106 is flipped over, and the unlased PI is then peeled off, leaving the LIG composite 108.

Such process can be referred to as an easy "tape and peel" process, which can be used to attach to the LIG on any surface.

Figure 2:
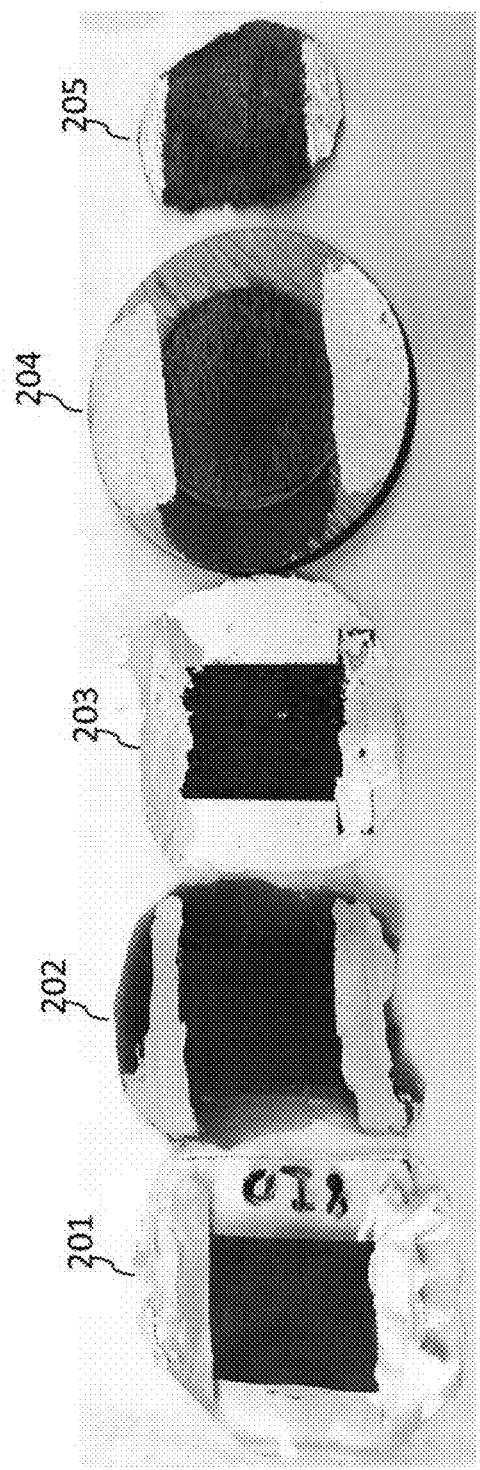
FIG. 2 is a photograph of various LIG composites.

FIG. 2 is a photograph of various LIG composites, namely a LIG/PDMS composite 201, a LIG/wax composite 202, a LIG/acrylic paint composite 203, a LIG/epoxy composite 204, and a LIG/cement composite 205.

The process to make these various LIG composites can be as follows:

LIG/PDMS composite 201: To infiltrate the LIG with PDMS for composite devices, a SYLGARD® 184 SILICONE ELASTOMER KIT was mixed at the appropriate component ratios described in the kit's specifications. The uncured mixture was poured on the LIG, then both are put inside a vacuum desiccator. Air bubbles rapidly diffused out of the LIG as the polymer infiltrated the LIG. After 30 min, the composite was removed from the desiccator, and the composite was cured in air at 80° C. overnight. The PI film was easily peeled off the composite after being fully cured.

LIG/wax composite 202: LIG was heated to 80° C. then infiltrated with melted commercial wax. The composite was then cooled to room temperature. PI film was later removed.

LIG/acrylic paint composite 203: Commercial acrylic paint (latex) was simply poured on top of LIG and heated up to 80° C. The composite was fully cured after 2 days and the PI film was removed.

LIG/epoxy composite 204: To infiltrate the LIG with epoxy for composite, a 2 parts epoxy was mixed at the appropriate component ratios described in the kit's specifications. The uncured mixture was poured on the LIG, then both were put inside a vacuum desiccator. After 3 min, the composite was removed from the desiccator and the PI film was removed. The composite was cured in air at 80° C. overnight.

LIG/cement composite 205: LIG was treated with UV ozone for 5 min to make it become hydrophilic. The LIG was then pre-wetted before infiltrating with a mixture of cement and water with a 1:1 volumetric ratio. At 80° C., the composite was fully cured after a few days and the PI film was removed.

Figure 1B:
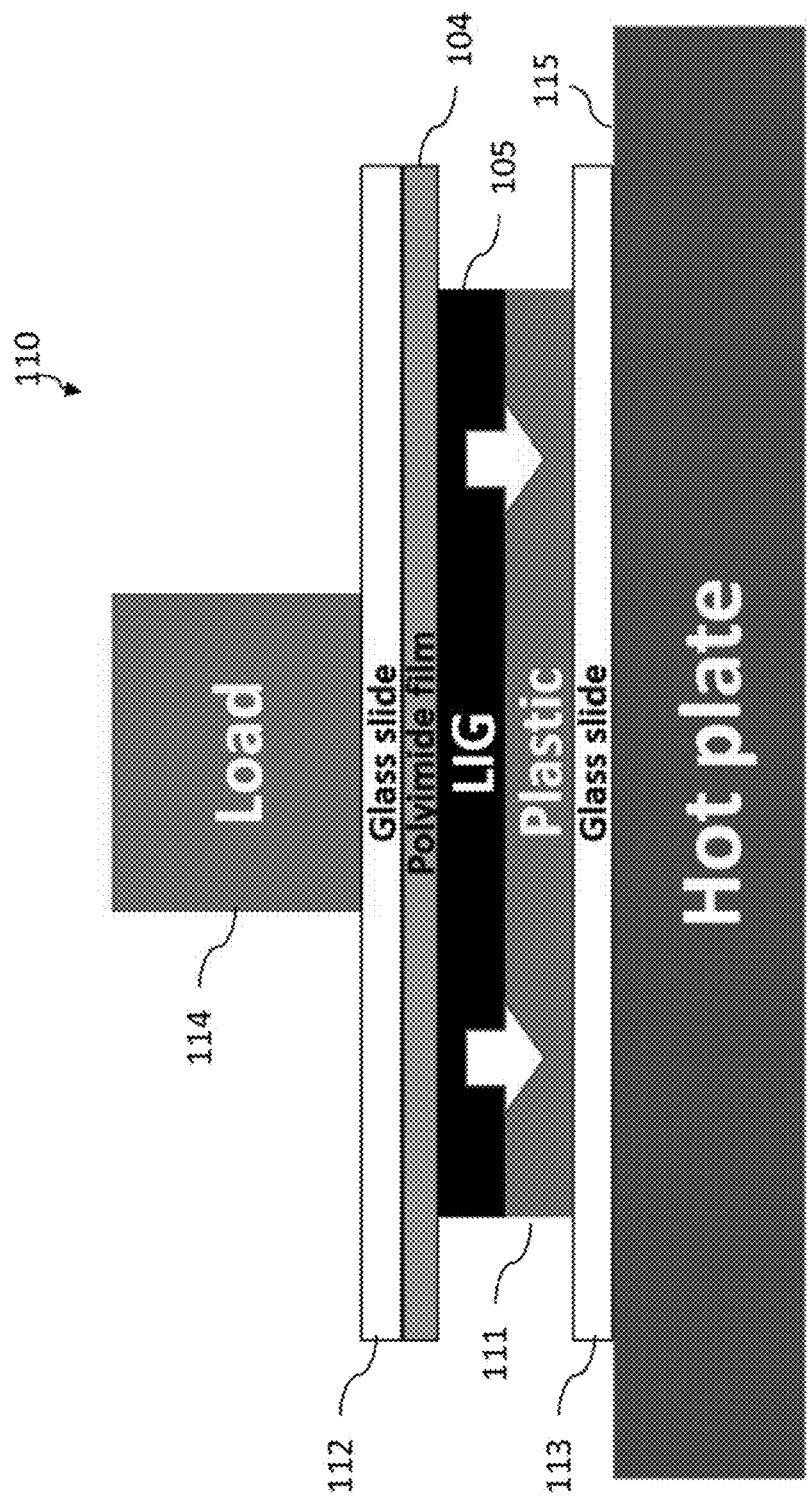
FIG. 1B is a schematic of a hot pressing process to fabricate a LIG composite of the present invention.

FIG. 1B shows a schematic of a hot pressing process to fabricate laser-induced graphene composite. By this hot-pressing process, commercial thermoplastics, such as polyethylene (PE), polypropylene (PP) and polystyrene (PS) can form robust composites with LIG.

This hot pressing process utilizes a hot press 110 in lieu of the infiltration step 102 in the process shown in FIG. 1A. For the hot pressing process, laser induction can be conducted on a polyimide (PI) film substrate similar to as described above in step 101 for the process shown in FIG. 1A. Slices of the plastic 111 facing the side of PI 104 that has been laser treated (and upon which the LIG 105 was induced) are stacked between two glass slides 112-1113 pressing from both sides. The entire setup is placed on a hot plate 115 (such as at 170° C.) and a load 114 (such as a 1 kg weight) can be placed on the top glass slide to press LIG 105 into the partially melted plastic 111. After removal from the hot plate 115 and the plastic has cooled, the unlased PI can then be peeled off (similar to as in step 103 shown in FIG. 1A), leaving the LIG composite.

Superhydrophobicity of LIG Composite

The resultant composite of LIG and hydrophobic materials (such as PDMS or wax) was discovered to exhibit superhydrophobicity. Surface engineering can be done by changing the image density of LIG to increase the superhydrophobicity.

Figure 3A:
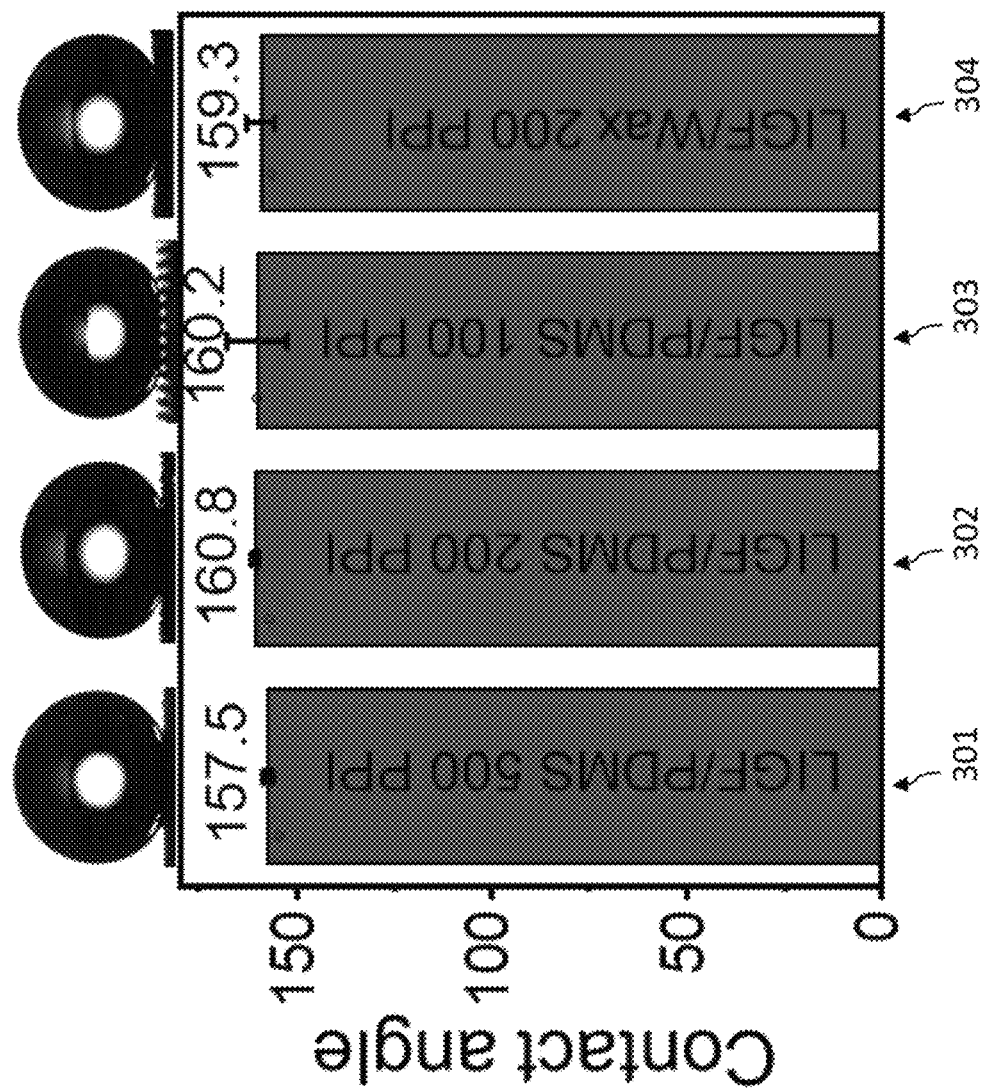
FIG. 3A is a bar chart showing the contact angle of LIG/PDMS composites with different surface engineered conditions and a LIG/wax composite.

The LIG composite hydrophobicity is more stable than the hydrophobicity of LIG synthesized in controlled environment such as Ar or $H_2$. It took more than 30 min of UV ozone treatment to destroy the hydrophobicity of the LIG composite while it took only 1 min to turn the superhydrophobicity of the LIG in controlled environment into hydrophilic material. Li 2017. FIG. 3A is a bar chart showing LIG/PDMS composites with different surface engineered conditions and a LIG/wax composite. Bars 301-304 show that the contact angle for LIG/PDMS 500 PPI composite, LIG/PDMS 200 PPI composite, LIG/PDMS 100 PPI composite, and LIG/wax 200 PPI composite were, respectively, 157.5°, 160.8°, 160.2°, and 159.3°.

Figure 3B:
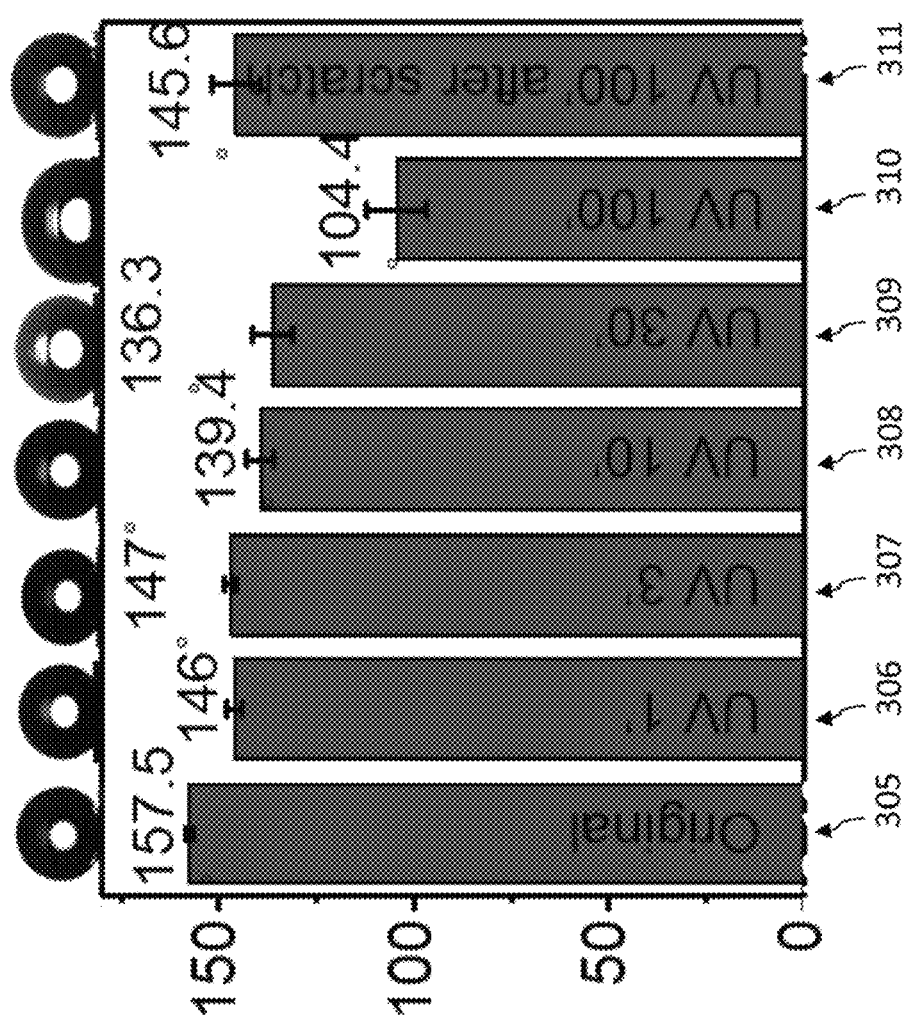
FIG. 3B is a bar chart showing the contact angle of a LIG/PDMS composite after UV ozone treatment and mechanical scratching.

It was also found that the hydrophobicity of the LIG composite could be restored by scratching the oxidized surface with 200 grit sand paper or razor to reveal the new hydrophobic composite. FIG. 3B is a bar chart showing the contact angle of a LIG/PDMS composite after UV ozone treatment and mechanical scratching. Bars 305-311 show that the contact angle for LIG/PDMS 500 PPI composite at original, UV 1, UV 3, UV 10, UV, 30, UV 100, and UV 100 (after scratch) were, respectively, 157.5°, 146°, 147°, 139.4°, 136.3°, 104.4°, and 145.6°.

Anti-Icing and De-Icing of LIG Composite

It was also found that the superhydrophobic surface of LIG and hydrophobic materials composites (such as LIG/PDMS composites and LIG/wax composites) can act as anti-icing surface. Such LIC composites were passive (no voltage needed) anti-icing materials. FIGS. 4A-4B are photographs of a LIG composite before and after, respectively, an anti-icing test at −20° C.

Furthermore, by applying a voltage to the surface, one can make an active de-icing material by applying a voltage to LIG composites, such as LIG/PDMS composites, LIG/wax composites, and LIG/acrylic paint composites. Because of the high surface conductance, the heating rate can reach as high as 70° C./min with 1.2 W/cm² applied power. FIGS. 4C-4D are photographs of a LIG composite before and after, respectively, the application of an applied voltage for 50 seconds. A de-icing test shows that the ice block rolled off the 45° angle surface after 50 seconds with an applied voltage.

Sensitive Piezoresistance of LIG Composite

Figure 5:
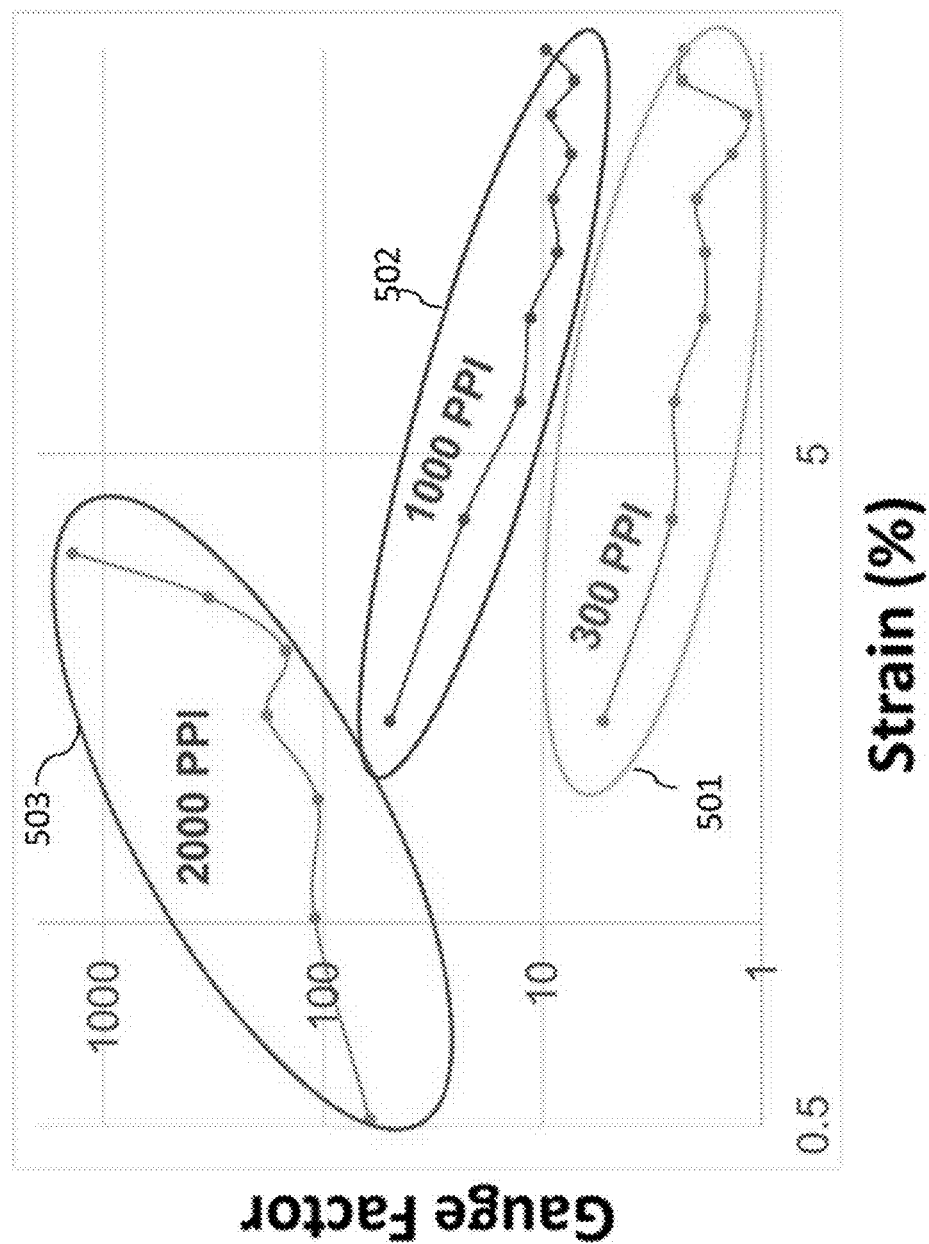
FIG. 5 is a graph showing the gauge factor of LIG/PDMS composites of the present invention with various image densities.

A LIG composite of LIG and an elastic material (such as PDMS) can result in a highly sensitive piezoresistive material. FIG. 5 shows the gauge factor of LIG/PDMS composites with various image densities (300 PPI, 1000 PPI, and 2000 PPI for plots 501-503, respectively). The gauge factor of the composite can be as high as 1200 at less than 5% strain. It is believed that this is the highest gauge factor ever reported and bodes very well for strain gauges.

In some embodiments, the LIG composite can be elongated by one one-thousandth of its original length resulting in a 2-4 times change in the electrical resistance of the LIG composite. Such property can be utilized for detecting strains in structures, such as bridges, ship hulls, aircraft fuselage, etc.

Characteristics of LIG Composites

The LIG composite is much more robust than the corresponding original LIG (such as set forth in Lin 2014).

The superhydrophobicity of the LIG composite was good and more stable than the LIG fabricated in controlled environment (such as set forth in Li 2017).

The LIG composite provides more application for LIG in flexible electronic.

The LIG composite can be made with almost any material from flexible polymers to concrete. It was found that certain materials (such as cement) provided poor infiltration. The infiltration of such materials can be improved by using smaller particles (such as smaller cement particles). The lower the viscosity of the filler materials (also called a "host" or "host material") generally infiltrated better.

The LIG composite is extremely robust against mechanical removal, quite unlike the original LIG films made upon polyimide.

The LIG composite can be made superhydrophilic or superhydrophobic.

The LIG composites can be electrically conductive.

Antibiofouling films can be made from the LIG composites.

Capacitive deionization materials can be made from the LIG composites.

The LIG compositions can include LIG with variety of polymer and building materials.

The LIG compositions can be used for electrostatic dissipation.

The infiltration material can be cells, such as stem cells or neurons for biomedical inserts and neuronal and peripheral nerve inserts, and brain tissue inserts, or infiltrated with hydroxyapatite for bone growth, or wood or plant cells for growth of conductive wood.

The LIG compositions can be used for devices such as sensors, deicing, batteries, lightweight wiring, supercapacitors, and electrochemical reactions, such as water splitting and fuel cells, oxygen evolution reaction, oxygen reduction reaction, hydrogen evolution reaction, hydrogen oxidation reaction, batteries, supercapacitors, pseudocapacitors, microsupercapacitors, anodes, cathodes, metal-air batteries, metal-oxygen batteries, lithium metal anodes, and lithium ion batteries.

The LIG composites can be made from LIG and a thermoplastic material, such as polyethylene (PE), polypropylene (PP), polystyrene (PS). A hot press can be used to make such LIG composites.

The LIG composites can be used as electrodes. Such LIG composites can have antimicrobial activity as an electrode. (Such LIG composites can be of LIG and PDMS or Portland cement).

The LIG composites can be used for Joule heating.

The LIG composites can used as multi-materials.

The LIG composites can be used for morphology control.

The LIG composites can be used in memory devices.

The LIG composites can be used for thermal therapy.

LIG For Flexible And Embeddable Gas Sensors

Some embodiments of the present invention provide for a robust direct-write LIG-based gas sensor, which senses gases based on thermal conductivity, similar to a katharometer sensor. In some embodiments, the gas sensors are fabricated by lasing polyimide substrates with a 10.6 μm $CO_2$ laser to synthesize LIG. This enables the formation of flexible gas sensors which could be incorporated on a variety of surfaces. As LIG possesses high surface area (~350 m$^2$ g$^{-1}$) due its 3D porous structure, this supplies many surface sites for gas-solid interactions. Therefore, LIG is an excellent candidate for many gas sensing applications.

LIG can be synthesized on a PI substrate to rapidly fabricate flexible arrays of gas sensors that detect a broad range of gases based on their thermal conductivity, similar to a katharometer. The resistive gas sensors exhibited fast response times of 7-8 seconds, (limited by the gas introduction time into the test chamber, for the tested gases). This fast response time is attributed to the large surface area of the LIG as well as high thermal conductivity in comparison to common filament materials. LIG/cement composites were also formed, which enables sensors to be embedded within construction or refractory materials. The flexible and embeddable gas sensors demonstrate the capability to determine gas compositions and represent a step toward realizing "smart" composite construction materials.

The sensor includes LIG electrodes that are connected by a narrow ~50 μm wide LIG channel. The operating mechanism for gas sensor relies on Joule heating of the narrow LIG channel spanning the electrodes, which subsequently transfers heat to its surroundings via convective heat loss by Newton's law of cooling. When a voltage is applied across the LIG device, Joule heating, which is proportional to the power (P) dissipated in the material (P ∝ $I^2R$, where I is current and R is resistance) is localized around the filament region due to its large resistance. Therefore, the Joule heating of the gas sensor is almost completely localized at the channel between the two LIG electrodes, where small particles of LIG span the two electrodes. Conveniently, LIG possesses high surface area (~350 m$^2$ g$^{-1}$) [Lin 2014] due its 3D porous structure, which supplies many surface sites for gas-solid interactions.

When the Joule heated gas sensor is exposed to a gas species, heat is transferred from the LIG filament to surrounding gas molecules, which subsequently cools the LIG channel via convective heat transfer. This results in a detectable change in the electrical resistivity of LIG, which is used as the method to sense the gas species. The high surface area and high thermal conductivity of LIG makes it an ideal material to achieve fast response and recovery times in thermal conductivity sensing applications.

LIG Gas Sensor Fabrication

In some embodiments, the LIG gas sensor can be fabricated by laser conversion of a carbon source to graphene. For instance, LIG was synthesized by lasing commercially available polyimide with a Universal Laser Systems XLS10MWH laser platform. The laser system was equipped with a 75 W pulsed $CO_2$ laser (10.6 μm). A scanning speed of 18 cm s$^{-1}$ was used with a duty cycle of 1%. An image density of 1000 pulses per inch (PPI, a standard setting on commercial systems; 1 inch=2.54 cm) was applied for all sensors.

Devices were fabricated with LIG serving as the electrode materials as well as the gas sensing filament. The sensing LIG filament was patterned with a width of 50 μm and a length of 300 μm.

Figures 6A, 6B:
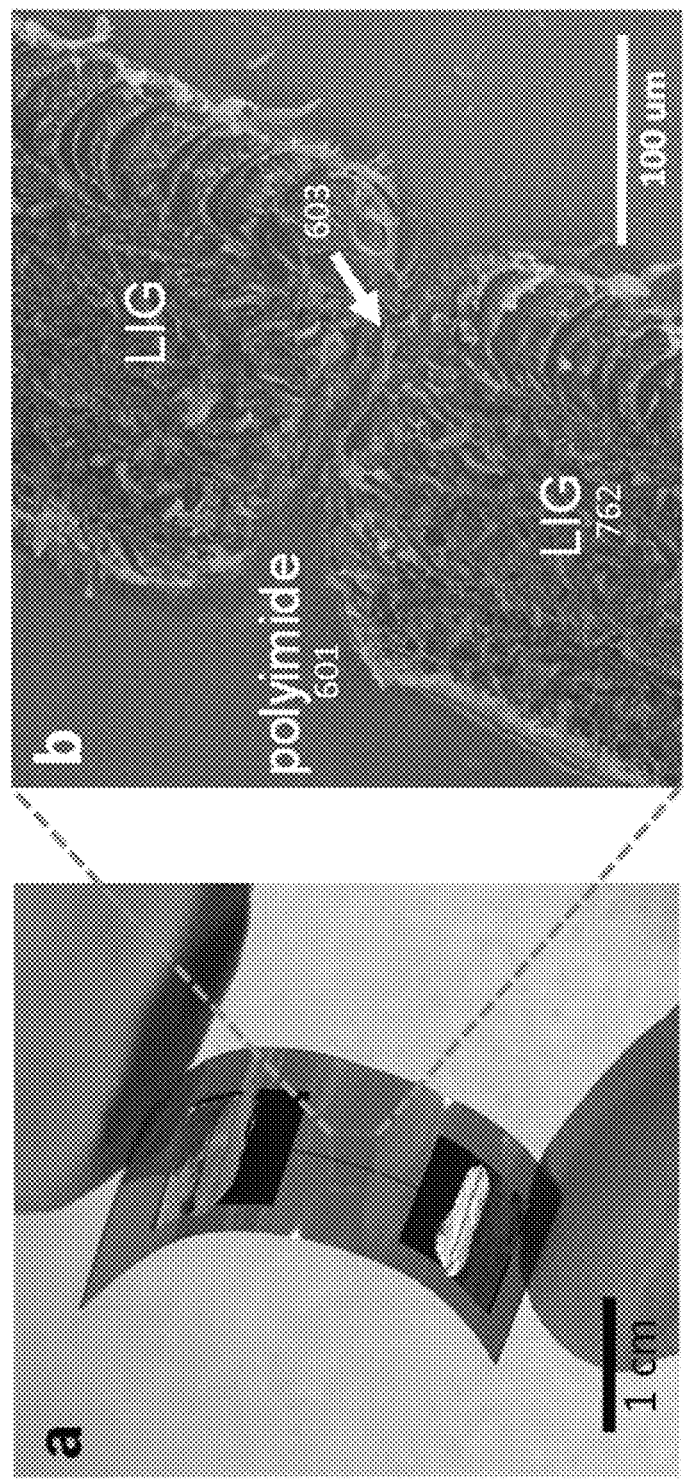
FIG. 6A is an optical image of LIG-based gas sensor on PI substrate.
FIG. 6B is an SEM image of ~20 μm channel in the LIG device shown in FIG. 6A. LIG filaments span between the LIG electrodes.

FIG. 6A shows an example of a flexible gas sensor having patterned LIG electrodes with a less than 50 μm PI gap between electrodes that has been synthesized by irradiating a PI substrate with the 10.6 μm laser to generate LIG. This device has LIG electrodes (~200 μm in width) that span between two larger pads, which are used as contacts that are also composed of LIG. The SEM image in FIG. 6B, shows PI 601, LIG 602, with LIG filaments 603. A gap of ~20 μm was intentionally left between the electrodes, however, small filaments of LIG 603 overlap the gap and provide a path for electrical transport. The LIG is also highly porous, which resulted in an extremely high surface area. A Raman spectrum shown in FIG. 6C shows a sharp 2D peak centered ~2697 cm$^{-1}$, which confirms that the LIG is composed of graphene.

The operating mechanism for gas sensor relies on Joule heating of the LIG particles spanning the device gap, which subsequently transfers heat to its surroundings via convective heat loss by Newton's law of cooling in Eq. (1):

$$q=hA(T_a-T_b) \qquad (1)$$

where q is the heat transferred, h is the heat transfer coefficient, A is the surface area of the LIG, and $T_a$ and $T_b$ are the temperature of gas molecules and LIG filament, respectively. The heat transfer coefficient, h, is dependent upon the material parameters, such as thermal conductivity (κ), viscosity (μ), and heat capacity ($c_p$).

When a voltage is applied across the LIG device, Joule heating, which is proportional to the power (P) dissipated in the material (P∝$I^2R$, where I is current and R is resistance) is localized around the filament region due to its large resistance. Therefore, the Joule heating of the gas sensor is almost completely localized at the micro-gap between the two LIG electrodes, where small particles of LIG span the two electrodes. Thermogravimetric analysis (TGA) of LIG revealed that it decomposes in air at a temperature of 850 K, hence the gas sensor should be operated below this temperature.

To confirm the presence of Joule heating under applied voltage, the current of the gas sensor was monitored as a function of time and shown in FIG. 6D in vacuum. Immediately after the potential was applied, the device resistance decreased by approximately 800%. The temperature-dependent transport properties of the LIG showed that the resistivity of the LIG decreased with increasing temperature over the relevant temperatures. This correlation confirmed that the LIG filament was increasing in temperature due to Joule heating. When exposed to air, the temperature of the LIG filament was reduced due to convective heat transfer. This resulted in increased resistance in the sensor when exposed to gas molecules. The PI is a high temperature polymer that is stable up to ~820 K; thus, the PI substrate did not experience significant degradation during sensor operation.

FIG. 6E shows the device sensitivity (change in resistance) when exposed to air after being held in vacuum. Resistivity of the sensor increased by >250% when exposed to air due to convective cooling of the LIG filament. Multiple cycles of exposure to air and vacuum are shown in FIG. 6E.

To controllably tune the resistivity of such gas sensors and increase the sensitivity, the device was exposed to oxygen plasma to etch away the LIG and finely tune the size of the LIG filaments. This enables tuning of the device resistance by increasing the extent of Joule heating in the LIG filaments. Due to the low operating current of this device, power consumption is only ~20 μW. However, there was a significant degree of variation in the sensitivity of such sensor devices fabricated under identical conditions (±90% sensor sensitivity), and only ~20% of devices were functional. This is because these type of sensors rely on the pseudo-random formation of micron-scale LIG filaments to span the channel between LIG electrodes. Subtle changes in the amount and orientation of the LIG filaments which span the gap between electrodes can result in significant variation in Joule heating and hence device sensitivity.

Figures 7A, 7B:
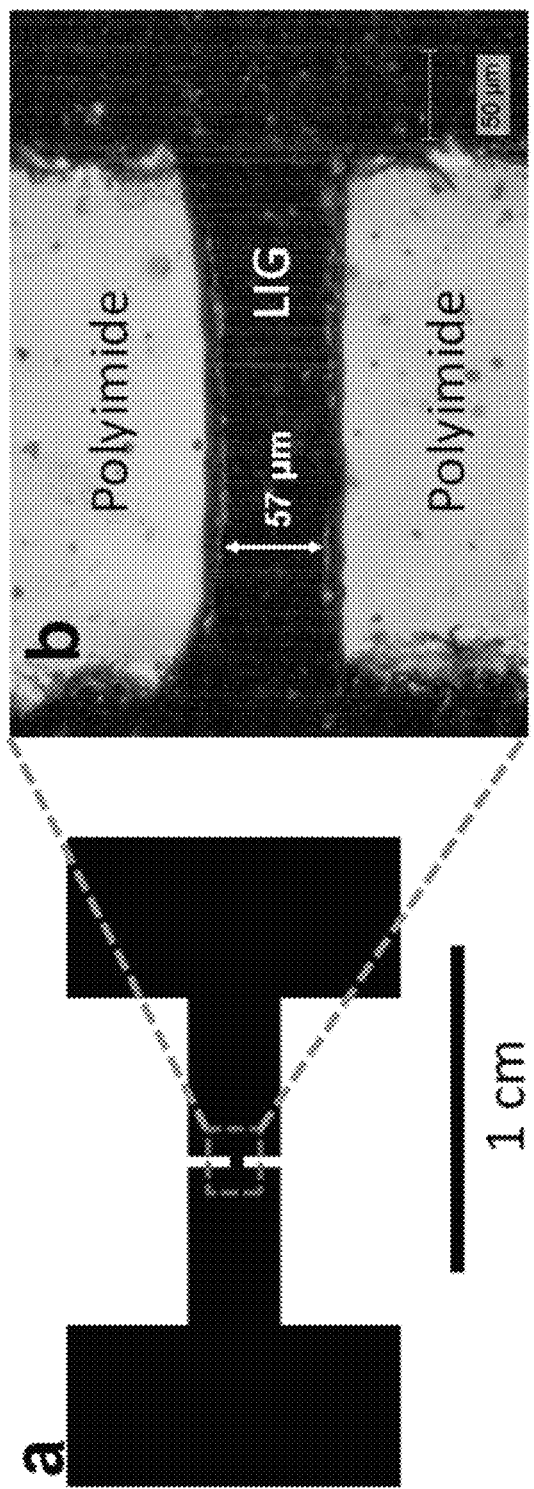
FIG. 7A is a schematic of a gas sensor with an LIG filament (with the black portions representing LIG). The active region is out of scale to increase visibility in this schematic.
FIG. 7B is an optical image of the LIG filament that is 57 μm in width.

Sensors having patterned LIG electrodes with a less than 50 μm gap (such as shown in FIG. 6A) exhibited a large degree of variation in device sensitivity. In another embodiment of the present invention (shown in FIGS. 7A-7B), sensors having a device structure with an intentionally patterned continuous LIG filament for increased reliability, with some sacrifice to device sensitivity. I.e., device sensitivities compared to vacuum of greater than 250% in air were achieved with the first type of sensors, compared to an average sensitivity of ~3.9% for these second type of sensors. However, device repeatability was improved from the first type to the second type of sensors from ~20% to 100%, respectively.

These alternative sensors include LIG electrodes that are connected by a ~50 μm wide LIG channel. The design of the second type of sensors thereby does not depend on random filament formation, such as the first type sensor, which accounts for the 100% device yield during fabrication of the second type device.

Similar to the working mechanism of the first device type, the majority of the power dissipation occurs across the narrow LIG channel. The temperature of the LIG filament during gas sensor operation was estimated to be ~500 K, based on the temperature-dependent transport characteristics of LIG, well below the decomposition temperature for LIG in air.

Figure 7C:
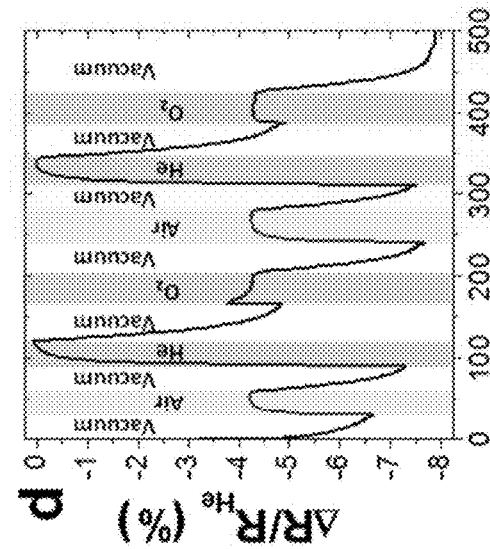
FIGS. 7C-7D are graphs showing responses of the sensor at 12 V to a variety of gases, showing repeatability. Shaded regions indicates when the sensor was exposed to the various gases.

FIG. 7C shows the response of the device with respect to vacuum when exposed to multiple cycles of $O_2$ gas. The response is highly repeatable with virtually no variation in the sensitivity. Since the thermal properties of a gas depends upon the gas composition, the extent of convective cooling of the LIG gas sensors should vary with gas composition.

Figure 7D:
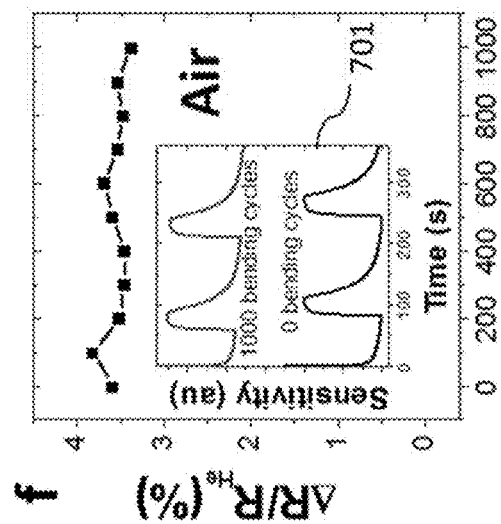

FIG. 7D shows the sensitivity of the device when exposed to cycles of Air, He, and $O_2$. The sensors exhibit a unique response sensitivity to each gas species, and the behavior is repeatable between multiple cycles. However, the vacuum quality in the measurement chamber in between each gas cycle depends on the gas history. For example, inert gas such as Ar will pump more rapidly than air due to the moisture content of the latter. Therefore, the sensor sensitivity for the various gases is reported with respect to the He sensitivity since it is an inert gas with high thermal conductivity. Device sensitivity is highest for He, which has a high relative thermal conductivity (~180 mW m$^{-1}$K$^{-1}$) compared to the other gases, while device sensitivity is lower for gases such as Ar that have lower relative thermal conductivity (~25 mW m$^{-1}$K$^{-1}$). This indicated that the extent of cooling of the LIG filament depended upon the thermal conductivity of the gas species. Due to the high porosity of LIG, the response and recovery characteristics for the sensors are rapid and easily distinguishable.

Figure 7E:
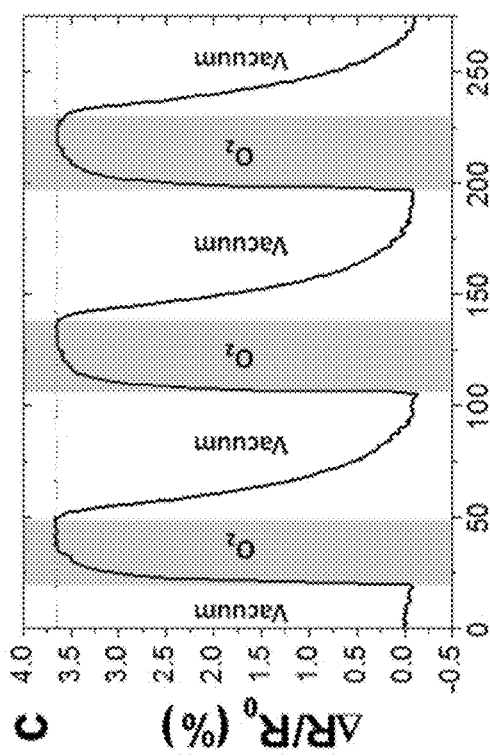
FIG. 7E is a graph showing response of the gas sensor to >50 cycles of He and vacuum.
Figure 7F:
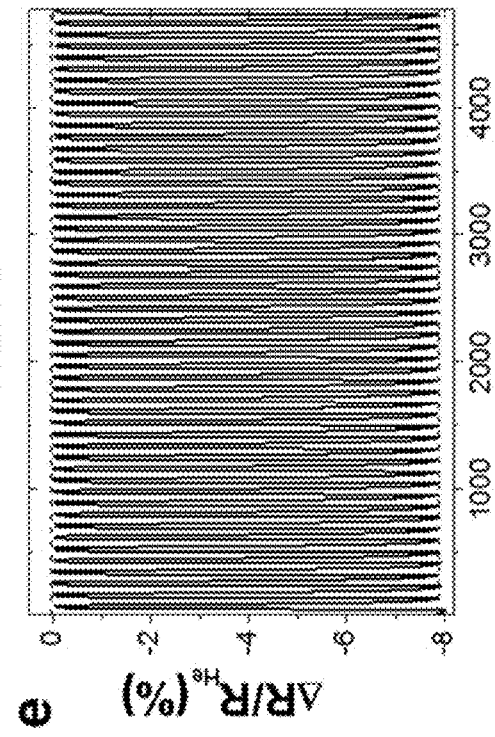
FIG. 7F is a graph showing magnitude of response of gas sensor to air after bending it with a radius of curvature of 7 mm. The inset of FIG. 7F shows the response of the gas sensor to air after 0 and 1000 bending cycles.

The repeatability of these second type of gas sensors when exposed to many cycles of gas is shown in FIG. 7E. The gas sensor was exposed to greater than 50 cycles of He gas followed by vacuum. This demonstrated that the response of the gas sensor was highly repeatable, thus enabling reliable detection of gas species. Additionally, the gas sensor, which was directly lased into a PI substrate, was subjected to bending to measure flexible sensor reliability. Specifically, the sensor was bent at a radius of curvature of 7 mm for 1000 cycles. FIG. 7F reports the sensor sensitivity to air after bending, and the inset 701 shows example sensor responses to air after 0 and 1000 cycles of bending. There are only minor variations in device sensitivity and no discernable degradation of the sensor, thus indicating robust response as a flexible sensor.

Figures 8A, 8B:
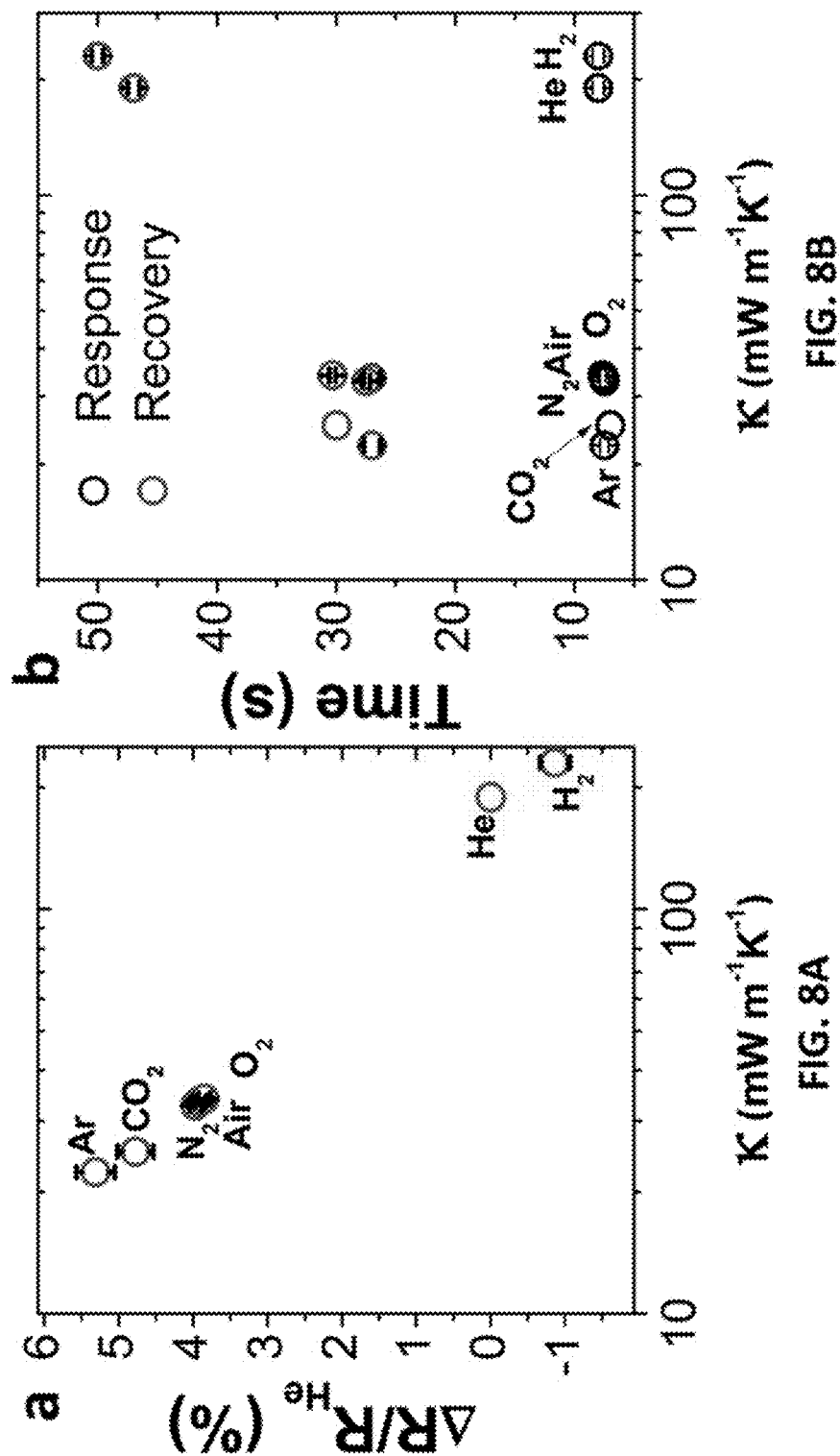
FIG. 8A is a graph showing sensitivity of various gas species normalized to the response of He gas at maximum operating voltage (12 V).
FIG. 8B is a graph showing response and recovery times for devices exposed to various gas species.

The average sensitivity of these second type of gas sensors to a variety of gases (Ar, $CO_2$, $N_2$, air, $O_2$, He, and $H_2$) is reported in FIG. 8A. The sensitivity of these devices is reported with respect to the device sensitivity to He. This was chosen as a reference as opposed to vacuum since the device current under vacuum will largely vary with vacuum quality. Errors bars report the standard error which reflect device to device variability. The sensor sensitivity scales with the thermal conductivity of the gas species for all gases measured. This enables the sensors to be used for gas detection for many gas species.

FIG. 8B reports the response and recovery times for the sensors for each gas species gases (Ar, $CO_2$, $N_2$, air, $O_2$, He, and $H_2$). The dark circles (appearing toward the bottom of the graph) are the response times of the sensors when exposed to the various gases. The light circles (appearing at the middle and toward the top of the graph) are the recovery times of the sensors when exposure to the gases is ceased. The response and recovery times are defined as the time required for the sensor to achieve 90% of its sensitivity to a given gas species. All response times are on the order of 8 seconds, and recovery times range from 25-50 seconds. The limiting factor for the response and recovery times is believed to be the speed at which the gas molecules can be injected and pumped from the test chamber. The high surface area and high thermal conductivity of LIG makes it an ideal material to achieve fast response times in thermal conductivity sensing applications. In fact, due to the porous nature of LIG, the majority of the material is suspended as opposed to supported by or contacting the substrate. Suspended graphene has demonstrated extremely high thermal conductivity on the order of ~5000 W m$^{-1}$K$^{-1}$.

Figure 9A:
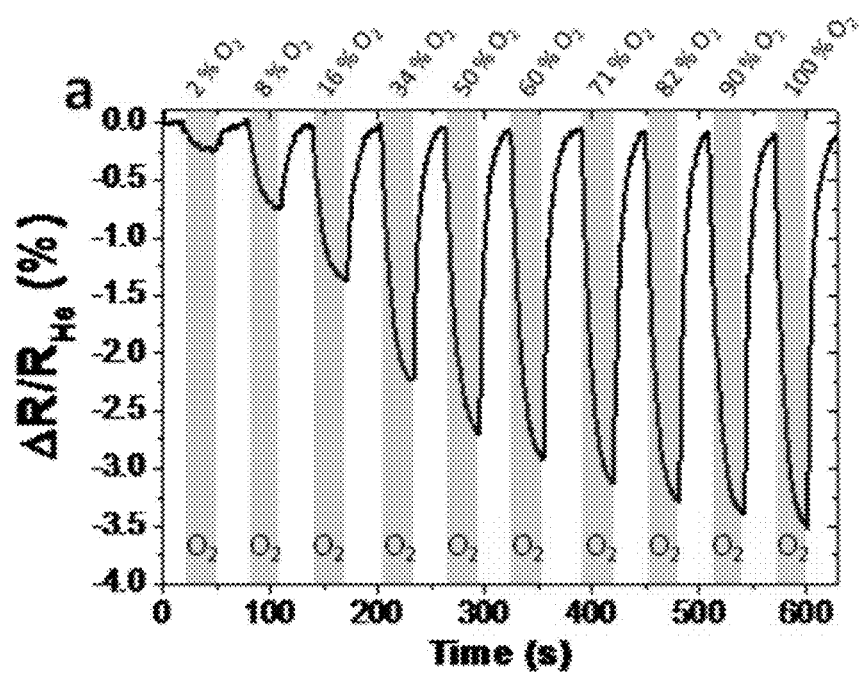
FIG. 9A is a graph showing the response of the LIG-based gas sensor to varying molar concentrations of $O_2$. He background was maintained for all measurements except for 100% $O_2$.

FIG. 9A reports the response of a LIG-based gas sensor to varying concentrations of He/$O_2$ gas mixture, from 0% to 100% $O_2$. The sensor can effectively differentiate between subtle gas concentration changes. The gas composition can be quantified by considering the thermal conductivity of a binary gas mixture in Eqs. (2)-(4):

$$\kappa_{mix} = \kappa_1 \left(1 + G_{12} \frac{x_2}{1-x_2}\right)^{-1} + \kappa_2 \left(1 + G_{21} \frac{1-x_2}{x_2}\right)^{-1} \quad (2)$$

where, $$G_{12} = \frac{1.065}{2\sqrt{2}} \left(1 + \frac{M_1}{M_2}\right)^{-1/2} \left(1 + \sqrt{\frac{\mu_1}{\mu_2}\left(\frac{M_2}{M_1}\right)^{1/4}}\right)^2 \quad (3)$$

$$G_{21} = \frac{1.065}{2\sqrt{2}} \left(1 + \frac{M_2}{M_1}\right)^{-1/2} \left(1 + \sqrt{\frac{\mu_2}{\mu_1}\left(\frac{M_1}{M_2}\right)^{1/4}}\right)^2 \quad (4)$$

κ is the thermal conductivity, x is the molar fraction, μ is the viscosity, and M is molecular weight. As the gas concentration changes, the $\kappa_{mix}$ is altered, thus tuning the extent of convective heat transfer (q) and hence the response of the gas sensor.

Figure 9B:
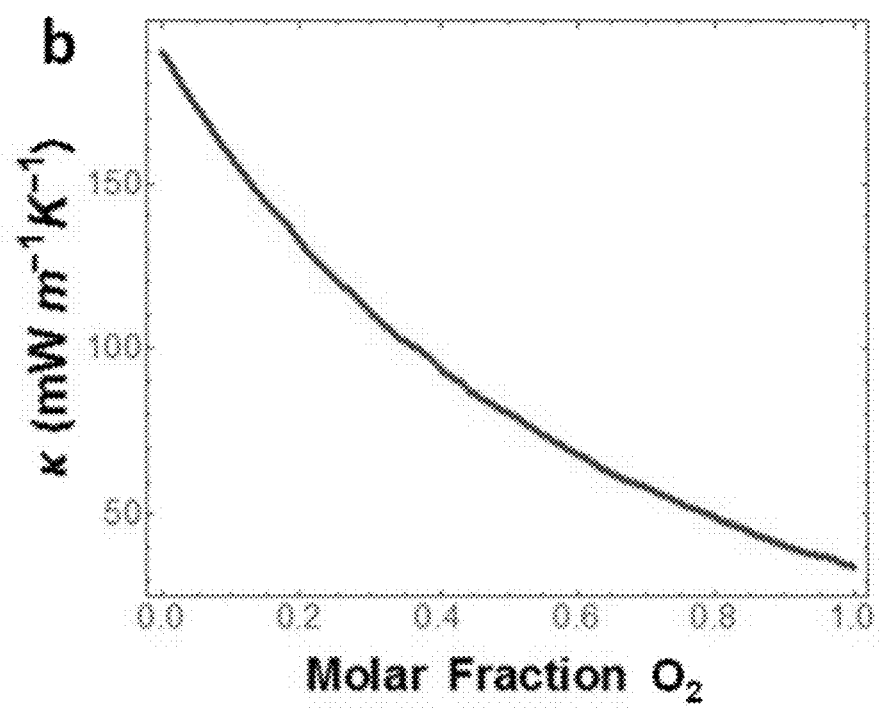
FIG. 9B is a graph showing thermal conductivity of He/$O_2$ gas mixtures.

The gas thermal conductivity as a function of $He/O_2$ concentration is plotted in FIG. 9B. $\kappa_{mix}$ varies from 180-34 mW $m^{-1}K^{-1}$ as the $O_2$ concentration increases. With the assumption that $C_p$ is independent of temperature (or experiences modest variation over this temperature range), the change in heat transfer (Δq) is largely dependent upon $\kappa_{mix}$ and hence gas composition. Therefore, the response of the gas sensor is a direct reflection of change in gas thermal conductivity, and gas molar composition can be determined in accordance with Eq. (2).

LIG Composite Gas Sensor Fabrication

Figure 10A:
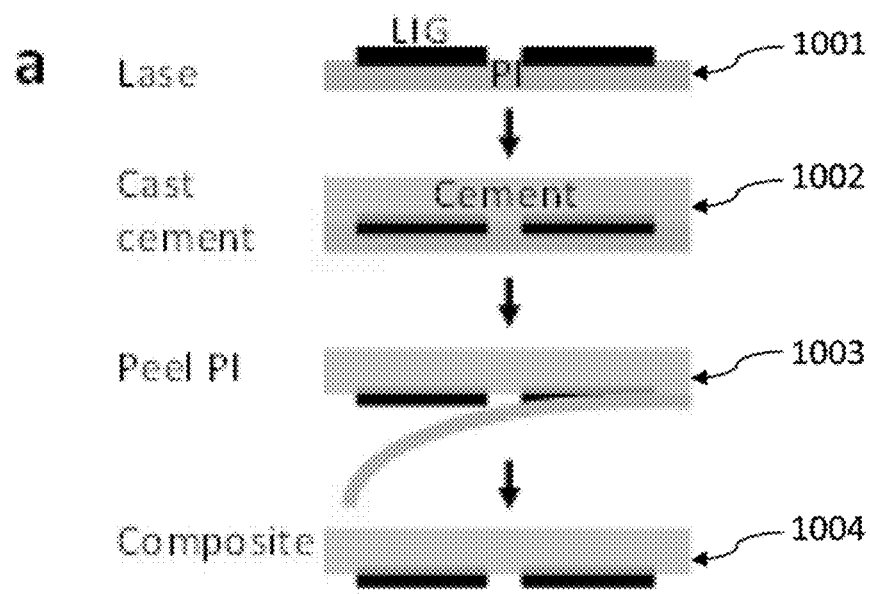
FIG. 10A is a schematic showing the process of fabricating a LIG-based gas sensor into cement. (For clarity, the active filament is not shown).

In some embodiments, LIG composites were made to embed the gas sensors within construction materials. By way of example, LIG composites can be used to generate such functional materials as follows: As shown in FIG. 10A, LIG was embedded within cement. In step 1001, LIG was made by lasing a PI substrate. For clarity, the 50 μm active filament is not shown. In step 1002, Portland cement was then cast on top of the PI substrate and allowed to infiltrate the LIG. After curing (such as for approximately 48 hours at 90° C. in the presence of water to ensure hydration of the cement), in step 1003, the PI substrate was peeled off the Portland cement. Step 1004 shows the composite after the peeling of step 1003. Cement intercalation within the large pores in the LIG effectively anchors the LIG into the cement, and the LIG pattern on the PI substrate is thereby transferred to the cement. Conveniently, this enables the formation of embedded electronics without the need to incorporate expensive precious metals. Also, the transfer of LIG into a composite is a simple mechanical process that does not require high energy cost, such as vacuum processing or electroplating.

Figure 10B:
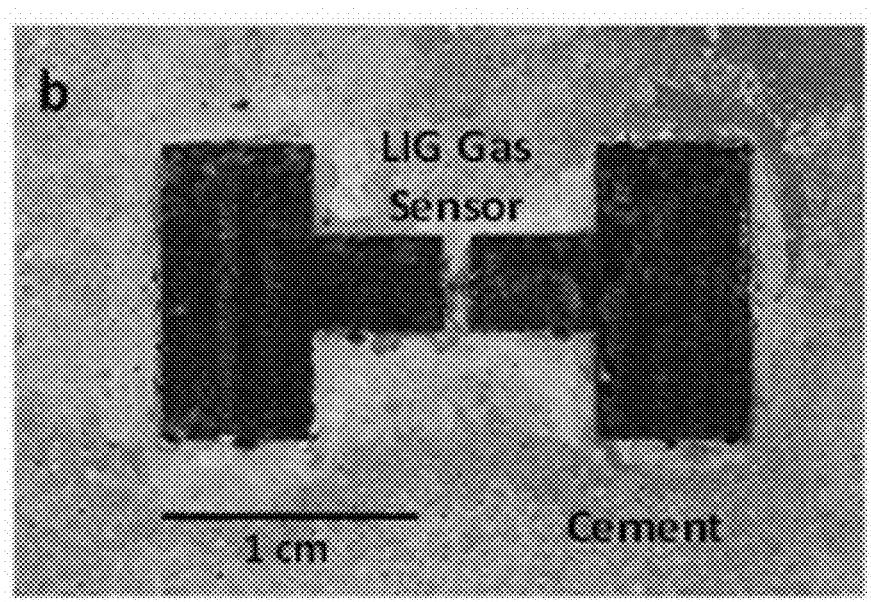
FIG. 10B is an optical image of the LIG gas sensor-embedded in cement made using the schematic of FIG. 10A.

FIG. 10B shows the LIG/cement composite-based gas sensor. The refractory nature of the cement is beneficial for operation of the gas sensor, since the Joule-heated LIG filament, which the sensor utilizes for gas detection, will not degrade the mechanical integrity of the composite over relevant operating temperatures.

Figure 10C:
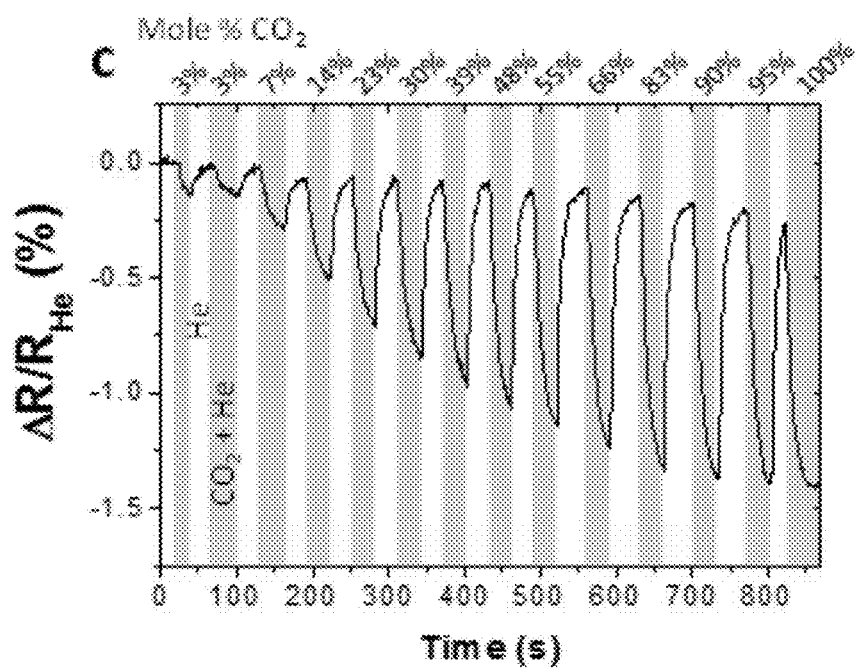
FIG. 10C is a graph showing the response of the cement-embedded gas sensor of FIG. 10B to varying molar concentrations of $CO_2$ in He ranging from 0% to 100% $CO_2$ in He.

FIG. 10C shows the composition-dependent sensor response when exposed to a gas mixture of He and $CO_2$. This demonstrates that the LIG/cement composite gas sensor can be used to determine the composition of a gas mixture. The sensor sensitivity of the LIG/cement composite differs slightly from the LIG gas sensor on PI, prior to formation of the composite. This is because the transfer process of the LIG to cement can slightly alter the morphology of the LIG as well as change the thermal mass of the sensor in comparison to PI; however, the sensor can simply be calibrated to the response of gases with varying thermal conductivity, such as in $CO_2$ vs He.

Figure 10D:
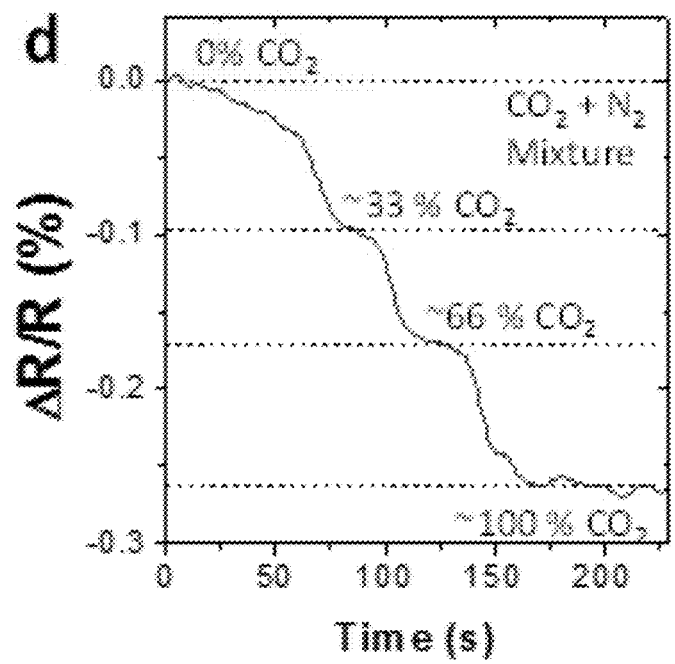
FIG. 10D is a graph showing the response of the cement-embedded gas sensor of FIG. 10B to varying molar concentrations of a $CO_2$ and $N_2$ gas mixture.

The incorporation of electronic devices directly into construction materials expands the capabilities of smart composites toward the broader application of the Internet-of-things. For example, gas sensors embedded directly into cement could be applied toward monitoring gases produced by a variety of manufacturing processes. FIG. 10D shows the response of the LIG/cement composite gas sensor to varying concentrations of $CO_2$ and $N_2$, which are the two most abundant gases in flue gas. Therefore, gas sensors could be embedded in cement and incorporated in flue gas chimneys to monitor flue gas composition in situ.

Uses and Applications of LIG Composite Gas Sensors

LIG-based gas sensors can be used to monitor the concentration of gas species in various gas mixtures. The sensing mechanism is similar to a katharometer in that it measures the thermal conductivity of a gas mixture; however, the porous structure of the LIG results in enhanced response and recovery times compared to other devices. [Jessop 1966]. The LIG/cement composite can be used to embed functional gas sensors directly into construction materials. An exemplary use and application would be embedding gas sensors into a flue-gas stack to monitor the composition of the flue-gas. This can be used to ensure emissions meet environmental regulations.

Such uses of laser-induced graphene as the sensing material in a katharometer gas sensor is a new use and application. The LIG is a porous material with high thermal conductivity, which improves the response and recovery times of the sensor in comparison to existing devices. Additionally, embeddable LIG/cement composite sensors are new device structures which enable smart construction materials.

In some embodiments, the applied voltage to the gas sensor should be monitored to ensure the filament temperature is below 850 K. This is because LIG could begin to depose if Joule heating of the LIG filament exceeds 850 K in air. Such operating temperature can exceed 850 K, if operating in an atmosphere of inert gas ($N_2$, Ar, He, etc.).

The sensors can be embedded in a variety of materials (other than, or in addition to cement). This can be done via the process to make LIG composite discussed and described above.

Graphene Oxide on LIG Filters for Antifouling, Electrically Conductive Ultrafiltration Membranes Some embodiments of the present invention provide highly porous electrically conductive LIG membranes as supports for composite membranes to tailor the selectivity of the membrane. Hybrid LIG-GO composite membranes can be generated, such as by filtration of a solution containing GO and the crosslinker glutaraldehyde on LIG support filters. It was observed that the solute selectivity and permeability of the LIG-GO composite membrane could be tuned with increasing amounts of GO used, leading to properties characteristic of ultrafiltration membranes. Moreover, since GO is a material with high chemical functionality, such coatings offer another handle to vary the surface properties and functionality of the membrane. As an electrode filter, the LIG-GO composite filter can ensure complete inactivation of filtered bacteria with no surviving bacteria remaining on the surface despite the low conductive nature of GO. Membrane composites containing LIG can be used to make functional membranes with unique separation and water treatment capabilities.

Methods of LIG-GO Membrane Fabrication

LIG on porous supports can be generated using methods such as described and taught in Singh I 2018 and Singh II 2018. For instance, PES (UP010) ultrafiltration polymer membrane supports were irradiated with a VLS 3.50 (Universal Laser Systems) laser with 0.1% power, equipped with a 10.6 μm $CO_2$ pulse laser (50 W, 2.0 in. Lens Kit). An image density of 1000 pulses per inch (PPI) and a scan rate of 25% (system image density=6) were used. A nozzle provided with the instrument was used to blow air toward the laser spot, while the general atmosphere within the laser platform was still air at ambient pressure.

For LIG-GO membrane fabrication, an aqueous GO solution (0.4 mg/mL) was prepared by 10× dilution of the commercially obtained GO (4 mg/mL) with DI, and included GA added for a final concentration of 5% w/w. The GO solution was sonicated at a frequency of 40 Hz for 30 min (MRC, Ultrasonic Cleaner) to obtain homogeneously dispersed aqueous suspensions. The circular LIG membrane filter (diameter 45 mm) was inserted into a vacuum filtration apparatus and different amounts (0.25, 0.50 1.0 and 2.0 mg/cm$^2$) of the GO/GA mixture was vacuum-filtrated onto the LIG supports. The membranes for cross-flow setup (8×3 cm) were fabricated similarly by pressure deposition however a rectangular custom made filter was used. The resultant LIG-GO membranes were dried in air at room temperature for 24 h before use and characterization. The membranes prepared with different GO contents were designated as LIG-GO UL (0.25 mg/cm$^2$ GO solution), LIG-GO L (0.50 mg/cm$^2$ GO solution), LIG-GO M (1.0 mg/cm$^2$ GO solution) and LIG-GO H (2.0 mg/cm$^2$ GO solution) membranes, where UL, L, M, H denote the amount of GO loading as ultra-low, low, medium, and high, respectively.

The LIG support membrane, and the polymeric ultrafiltration (UF) membrane were used as controls.

Characteristics of LIG-GO Membrane Surfaces

Figure 11A:
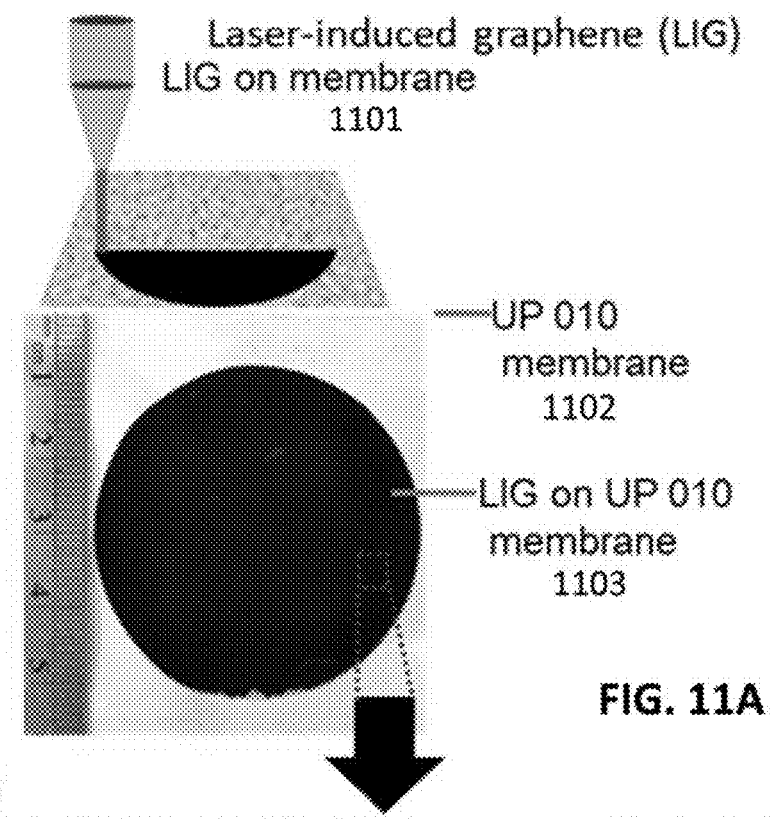
FIG. 11A shows an illustration of LIG printed on a UP010 membrane.
Figure 11B:
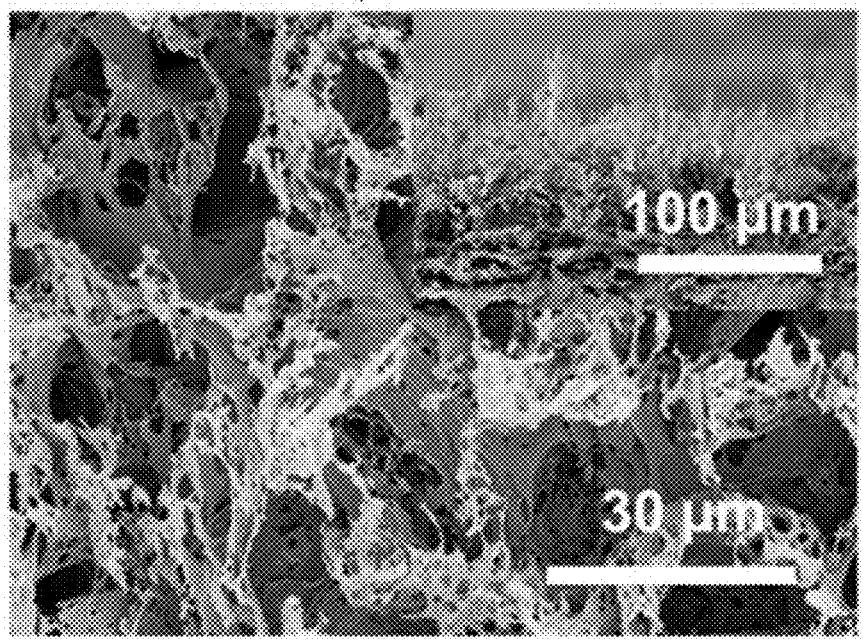
FIG. 11B is an SEM image of LIG, with the inset showing a cross-section of LIG.
Figure 11C:
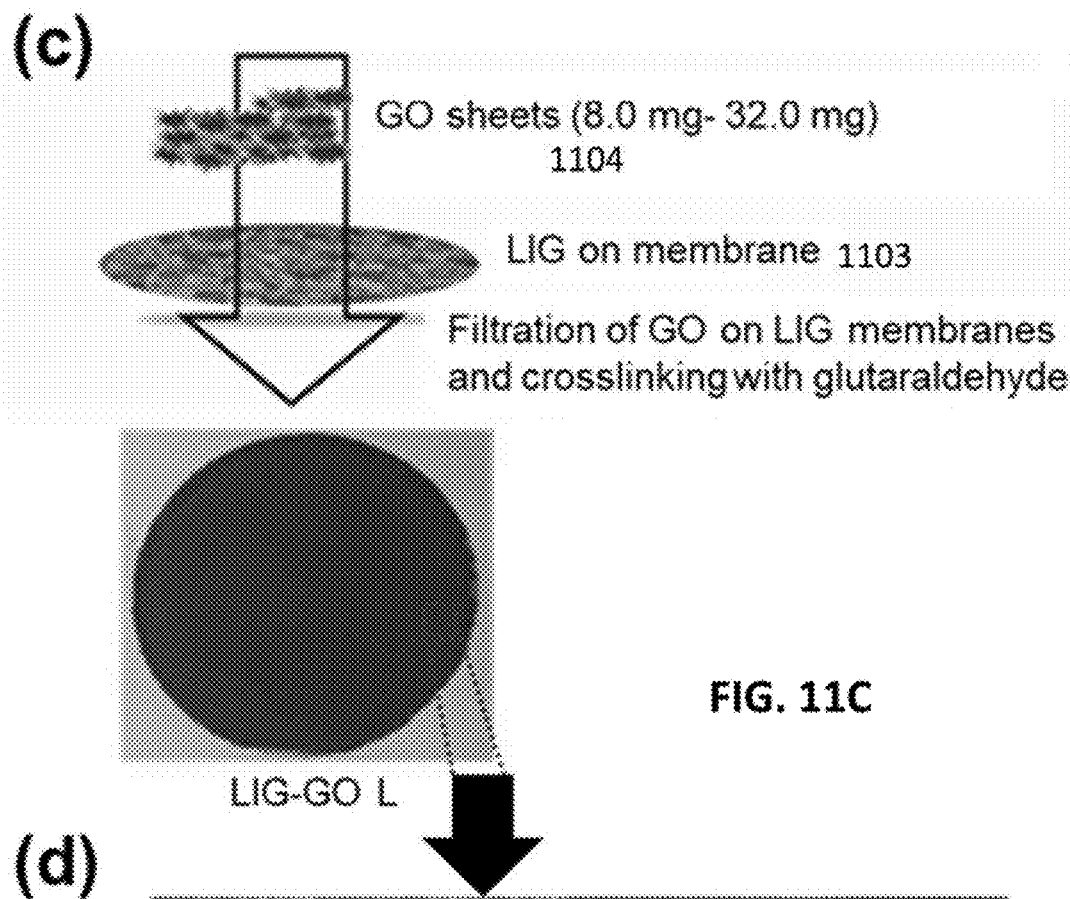
FIG. 11C is an illustration of a LIG-GO membrane fabrication on a LIG membrane.

FIG. 11A shows an illustration in which LIG 1101 was printed on a UP010 membrane 1102 (a commercial PES polymer membrane substrate) using a CO$_2$ laser in an ambient atmosphere to form a LIG membrane 1103 (also referred to as a LIG filter). LIG membrane 1103 had a 3-D porous structure, which could be seen in the SEM images (FIG. 11B). As shown in FIG. 11C, the LIG membrane 1103 was used as a support for the deposition of GO nanosheets 1104 which was done by filtrating the GO on the LIG membrane 1103 and crosslinking with glutaraldehyde.

Figure 11D:
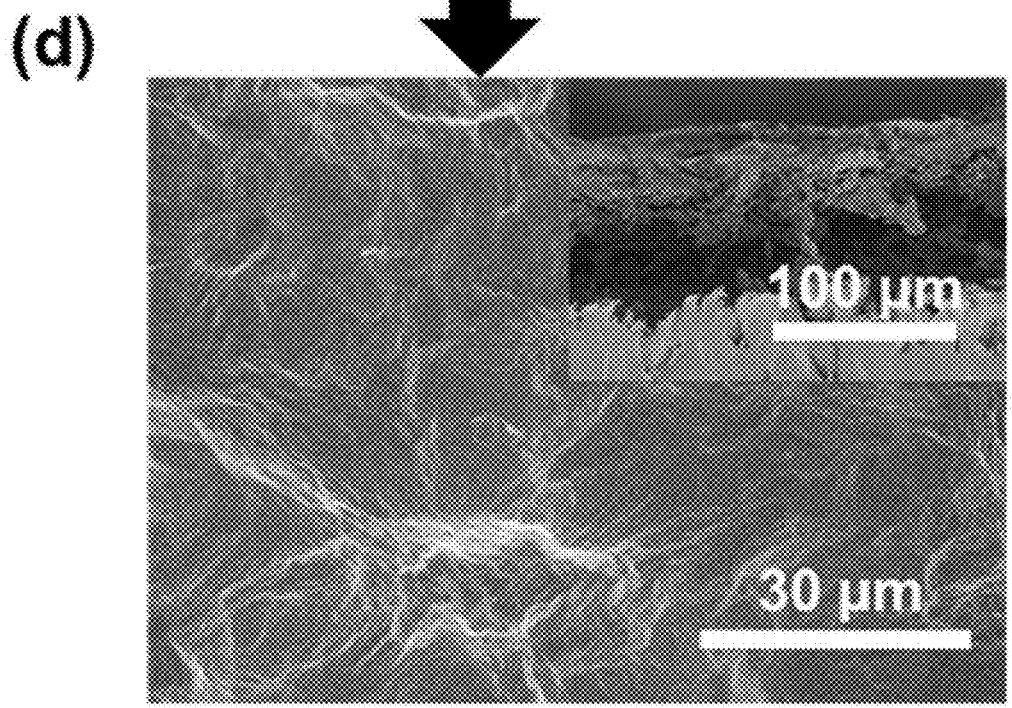
FIG. 11D is an SEM images of LIG-GO L, with the inset showing a cross-section of LIG-GO L.

Compared to a conventional polymer support layer, these LIG membrane filters 1103 are electrically conductive and have a high porosity with an interconnected pore structure. The prepared LIG-GO filters were named LIG-GO L, LIG-GO M, and LIG-GO H corresponding to a low (0.5 mg/cm$^2$), medium (1.0 mg/cm$^2$) and high (2.0 mg/cm$^2$) loading of deposited GO, respectively. The SEM image of LIG-GO L in FIG. 11D showed a wrinkled structure of GO deposited surfaces. The cross-section SEM images for LIG and LIG-GO showed GO deposition as a layer on top of the LIG. (See FIGS. 11B and 11D).

Figure 11E:
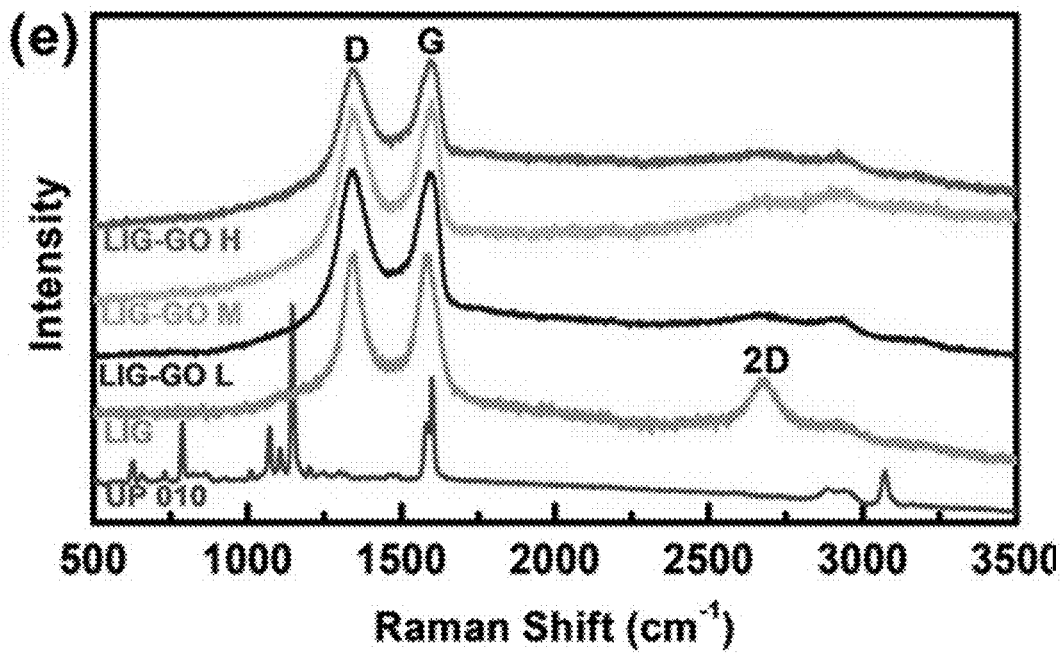
FIG. 11E is Raman spectra of the different above-surfaces.

Raman spectra of the LIG in FIG. 11E showed the D peak (~1350 cm$^{-1}$, local disorder), the G peak (1580 cm$^{-1}$, graphitized structure), and the 2D peak (2700 cm$^{-1}$, second order disorder), whereas only D and G peaks were observed in the LIG-GO membranes. The disappearance of the 2D peak because of the deposition of GO on the LIG filters confirmed that the LIG filter was completely covered with GO. The LIG-GO covered membranes were similar to previously reported GO Raman spectra.

Figure 11F:
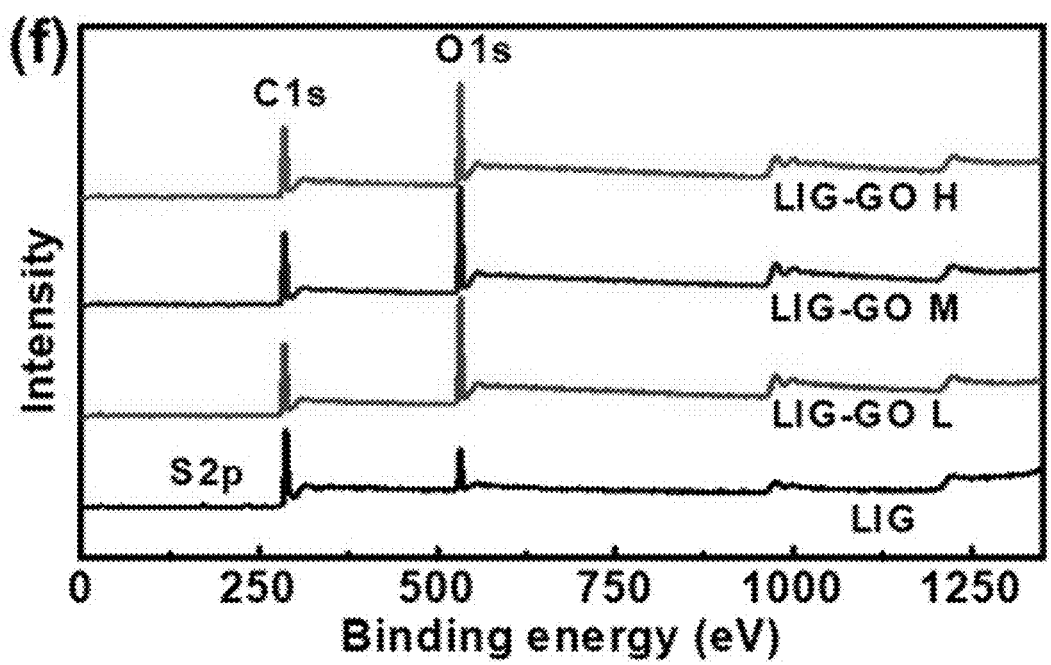
FIG. 11F is X-ray photoelectron spectra (XPS) of the different above-surfaces.

XRD patterns of the LIG-GO membranes showed peaks similar to the LIG membrane support, but with a new peak at ~9.5° (2θ), which is a characteristic peak for GO. This peak was more intense for LIG-GO H and M, compared to LIG-GO L and suggest an increased deposition of GO. In FIG. 11F, X-ray photoelectron spectroscopy (XPS) spectra of the prepared LIG showed C 1s, O 1s, and S 2p peaks for the LIG at ~285.5, ~534, and ~167 eV, respectively. In comparison, for LIG-GO membranes only C 1s, and O 1s peaks could be observed and this confirmed the GO deposition and complete covering of the LIG filters. The intensity of the O 1s peak increased from LIG-GO L to LIG-GO H and corresponded to an increased oxygen content from 17% (LIG filter) to 31% (LIG-GO H).

Figure 12A:
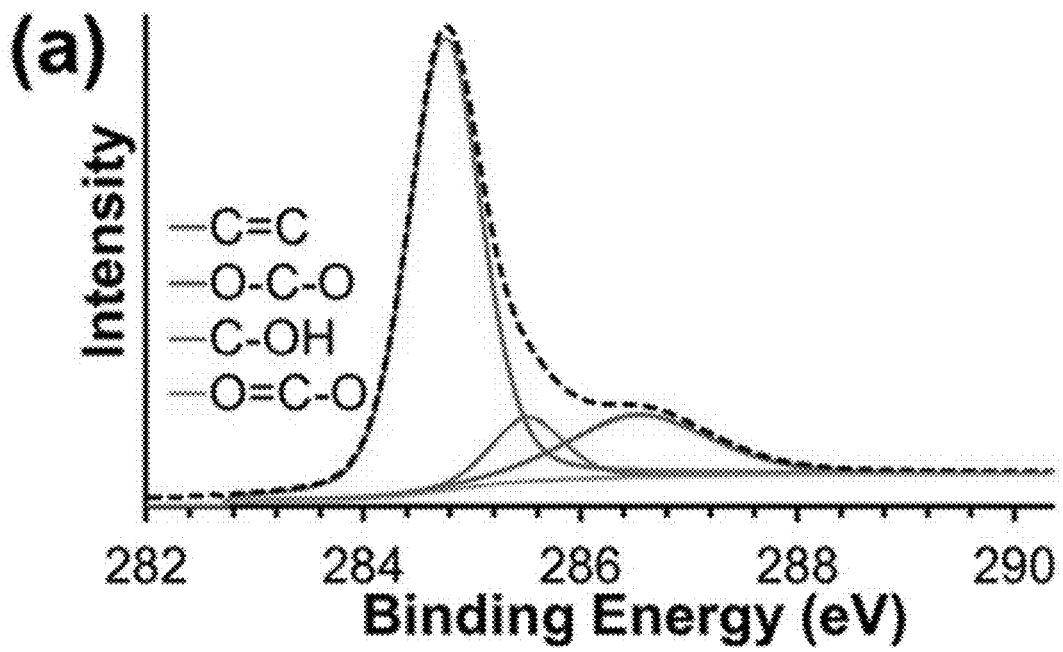
FIGS. 12A-12D are graphs showing, respectively, the deconvoluted XPS for C is for LIG, LIG-GO L, LIG-GO M, and LIG-GO H membranes.
Figure 12B:
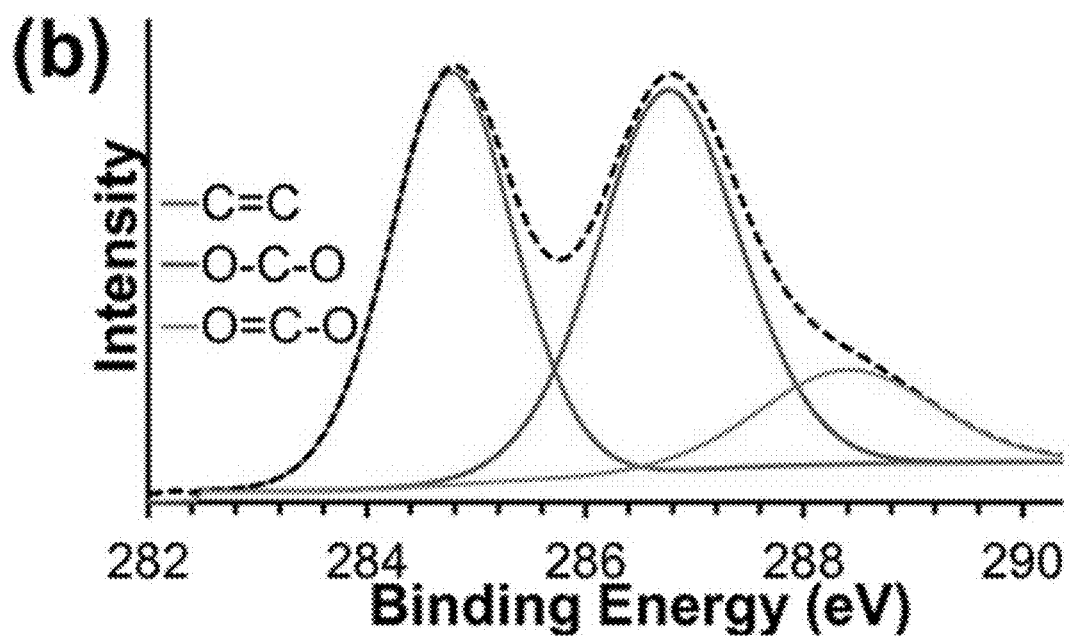
Figure 12C:
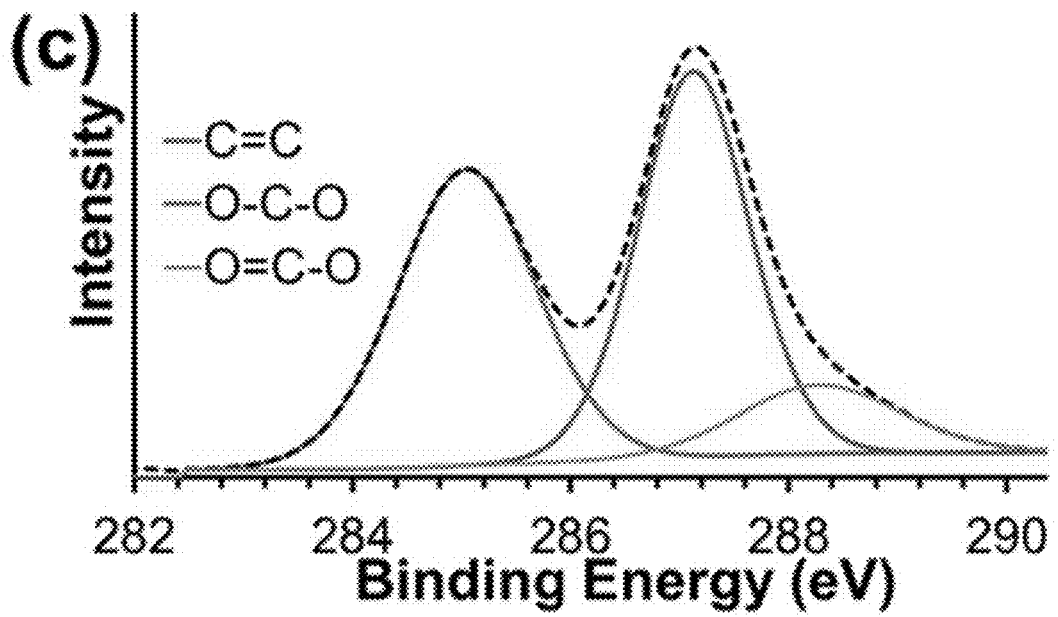
Figure 12D:
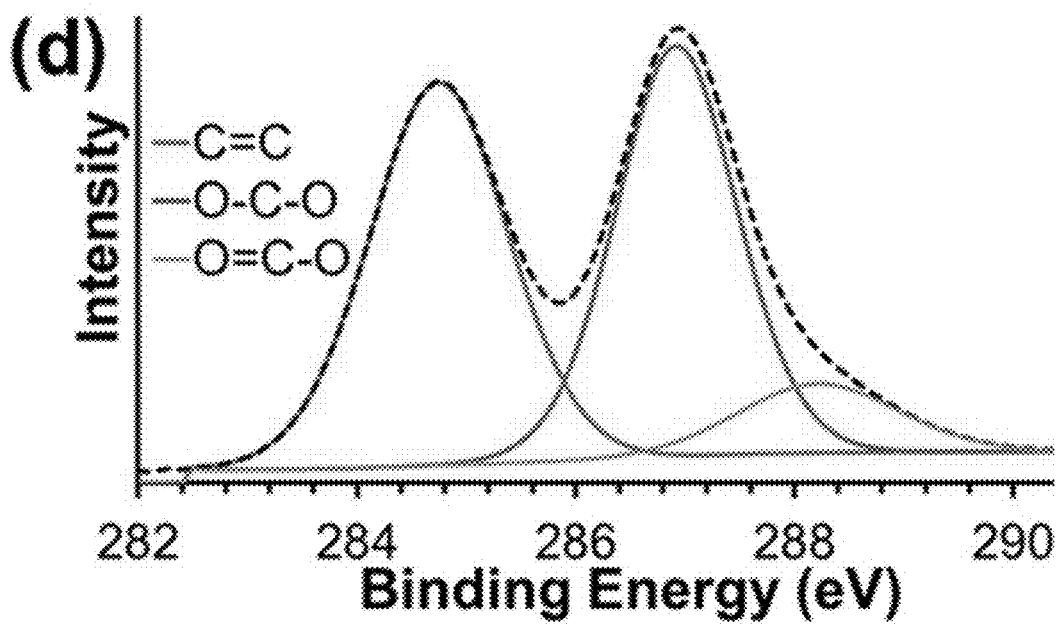
Figure 13A:
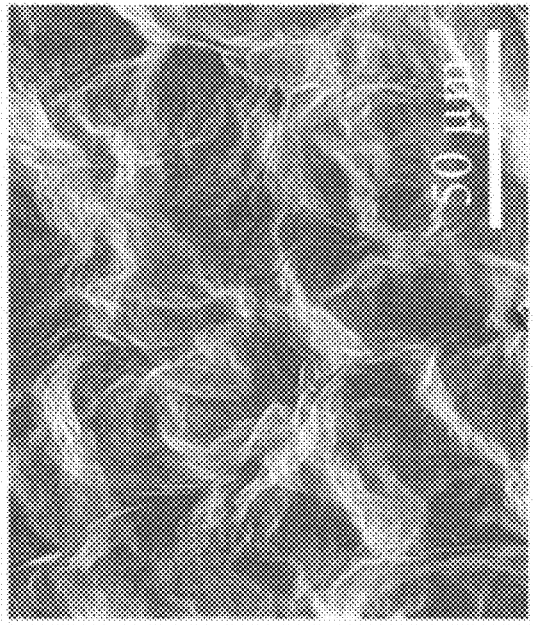
FIGS. 13A-13D are surface SEM images of LIG, LIG-GO L, LIG-GO M, and LIG-GO H membranes, respectively.
Figure 13B:
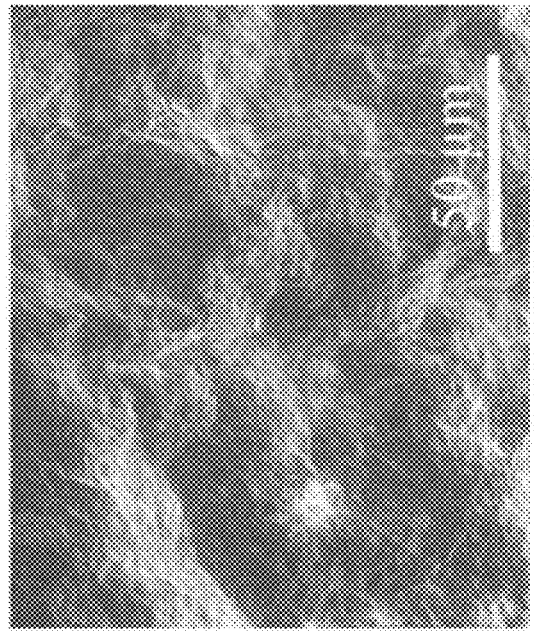
Figure 13C:
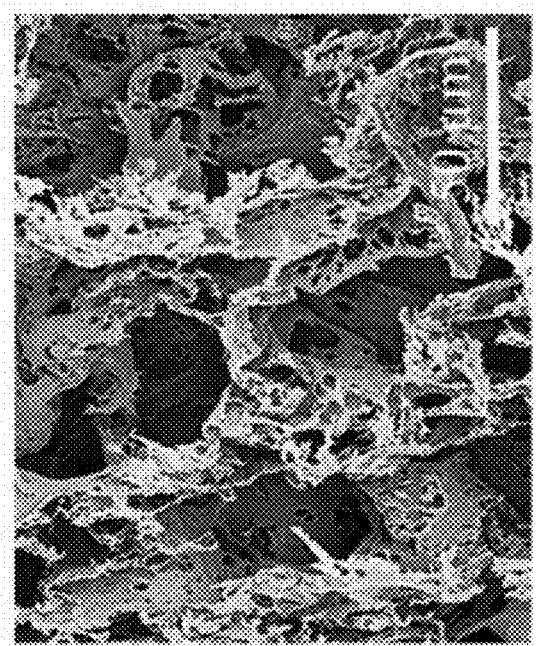
Figure 13D:
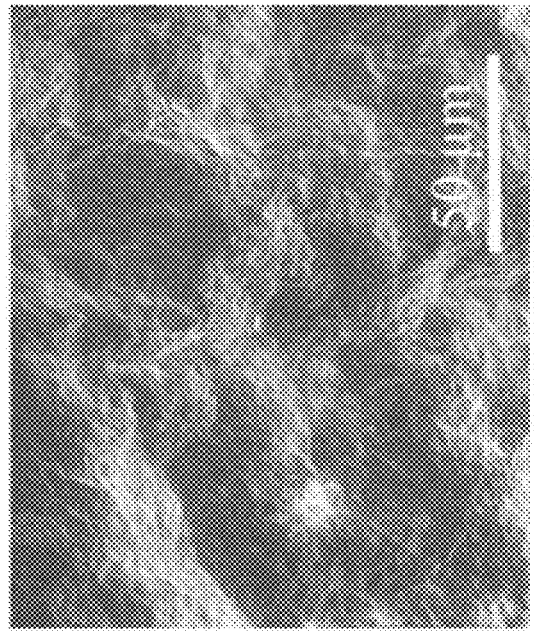

The C 1s deconvolution spectrum in FIG. 12A of the LIG revealed four typical peaks that corresponded to sp$^2$ and sp$^3$ C bonding (~285 eV), epoxy and hydroxyl (C—O, ~286 eV), carbonyl (C=O, ~287 eV), and carboxyl groups (O—C=O, ~289 eV) of graphene, whereas in FIGS. 12B-12D, LIG-GO membranes showed only three major peaks, sp$^2$ and sp$^3$ C bonding (~285 eV), carbonyl (C=O, ~287 eV), and carboxyl groups (O—C=O, ~289 eV). The absence of the C—OH peak in the LIG-GO membranes indicated that these were the probable attachment points for the glutaraldehyde crosslinker. The static water contact angle measurement was applied to characterize the change of surface wetting properties of the membranes after deposition of the GO nanosheets. See TABLE I below. Compared to the LIG support membrane with a contact angle of 35.0°, the LIG-GO membranes were statistically less hydrophilic (p=0.016) with contact angles between 52.8-48.2°, although the LIG-GO membranes L, M, and H were not statistically different from each other (p=0.679). These analysis techniques showed a complete GO covering on the surface, however they were unsuitable for detection of pinholes or small pores in the coating.

FIG. 3A-3D shows the surface morphology of the LIG, LIG-GO L, LIG-GO M, and LIG-GO H membranes, respectively, at high magnification. The large micron sized pores of the LIG support membranes were covered after deposition with GO, and the GO layer was visibly rough, reflecting the underlying substrate.

Stability Test of LIG and LIG-GO L Membranes in Aqueous Solutions

The stability of LIG and LIG-GO L membranes was examined in an aqueous solution. LIG and LIG-GO L membranes were immersed in DI water and sonicated for 30 min. Sonication is widely used in exfoliating and detaching stacked graphene sheets, and the LIG substrate showed removal of LIG from the surface. In contrast, the LIG-GO L, visibly did not show significant detachment of the GO. LIG membranes were severely damaged under sonication in both acidic (pH 2) and alkaline (pH 12) conditions, however the LIG-GO L membrane remained highly stable with minor detachment at both pH values. GO filtered on porous supports was unstable under both acid and alkaline conditions. However, it was observed that crosslinking with glutaraldehyde drastically enhanced stability of the LIG-GO hybrid membrane under both alkaline and acidic conditions and underlines the role of the crosslinker for stabilizing the LIG-GO membrane in aqueous solution.

Performance Testing of the Membranes

The pure water permeability and rejection of bovine serum albumin (BSA) was measured using a dead-end filtration cell for LIG-GO membranes as shown in FIG. 14A. Comparison of the series of LIG-GO L, M, and H membranes, LIG-GO L showed the highest permeability (421.5 LMH bar$^{-1}$), with ~28% BSA rejection. As the amount of GO increased, the water flux decreased to 78.5 LMH bar$^{-1}$ and the observed rejection of BSA increased to 69% for the LIG-GO H membrane. The decline in water flux is believed to be attributed mainly to the increase of mass transfer resistance of the increasing thickness of the GO layers. For comparison to a commercial polymer membrane, the US100 (100 kDa MWCO) was chosen because of the similar MWCO. Under the same testing conditions, the US100 membrane had much higher permeability. The MWCOs, defined as the molecular weight of PEG where ~90% rejection is observed, of the LIG-GO hybrid membranes were evaluated by measuring the rejection of PEG 35, 100, 200, and 400 kDa. See FIG. 14B with plots 1401-1403 for LIG-GO H, LIG-GO M, and LIG-GO L, respectively. The LIG-GO H membrane exhibited a MWCO~90 kDa, while the rest showed MWCO>400 kDa. This indicated that the crosslinked GO formed a material network capable of filling the micron sized pores of the LIG support material for ultrafiltration purposes, which is different from uncrosslinked GO membranes capable of nanofiltration, and underlines the importance of the underlying support. Membrane performance values for the LIG support membrane, the US100 (UF membrane) and all LIG-GO membranes are reported in TABLE I below.

TABLE I

Comparison of membrane properties. The performance tested using a dead-end filtration cell.

| Membrane name | Pure water flux (LMH bar$^{-1}$) | BSA rejection % | BSA adsorption % | Bacteria removal % | Contact angle (°) |
|---|---|---|---|---|---|
| LIG support | 24801 ± 18 | 4 ± 1 | 2.5 ± 0.4 | 18 ± 5 | 35 ± 5 |
| US100 | 1245 ± 22 | 18 ± 1 | 20.3 ± 1.7 | 81 ± 4 | 73 ± 5 |
| LIG-GO UL | 1247 ± 12 | 17 ± 2 | 10.8 ± 0.7 | 83 ± 2 | 55.5 ± 5.2 |
| LIG-GO L | 425 ± 10 | 24 ± 2 | 8.3 ± 0.4 | 95 ± 2 | 52.8 ± 13 |
| LIG-GO M | 125 ± 8 | 45 ± 2 | 3.3 ± 0.4 | 99.1 ± 0.5 | 50.9 ± 5.2 |
| LIG-GO H | 78 ± 7 | 69 ± 2 | 1.5 ± 0.3 | 99.9 ± 0.1 | 48.2 ± 4.9 |

Antifouling Performance of the Membranes

Both dead-end and cross-flow filtration systems were used to evaluate the effects of protein fouling, flux decline and recovery testing with BSA as a model foulant. When the membranes were exposed to a BSA solution, the flux decreased probably due to membrane fouling. The LIG-GO L membrane lost approximately 37% of its original flux when exposed to the BSA solution to give 268 LMH. For LIG-GO M, the flux decline was less (27%, 92 LMH), and the LIG-GO H membrane indicated the lowest fouling tendency during the filtration of BSA where only 17% of its original flux was lost to give 65 LMH. The initial fast flux decline was probably caused by adsorptive fouling and pore blocking.

The lower flux loss of the LIG-GO H was believed to be due to its higher BSA rejection, which prevents BSA penetration and adsorption into the surface for less adsorptive fouling and pore blocking. The degree of irreversible membrane fouling can be seen by the amount of flux recovery (FR). After cleaning the BSA-fouled surfaces with DI water, the FRR of the LIG-GO membranes were ~78, 85 and 91% for LIG-GO L, LIG-GO M and LIG-GO H, respectively. This increasing trend again indicates that less irreversible BSA adsorption and pore blocking can be occurring on membranes where less BSA can permeate.

In addition to the dynamic fouling measurements, the static protein adsorption test was performed to estimate the surface susceptibility to organic foulants. Compared to the polymer membrane (20%), the GO surfaces (2%-8%) showed a reduced protein adsorption on the surface. See FIG. 14C. Since BSA mainly binds to GO through hydrophobic forces, hydrogen bonding, van der Waals and $\pi$-$\pi^*$ stacking interactions, the more hydrophilic LIG-GO surfaces (compared to the polymer control surface) led to less BSA adsorption. The minor differences seen within the LIG-GO membranes were believed to be because surface binding primarily occurs on the less permeable LIG-GO H, whereas BSA can penetrate LIG-GO L and M leading to slightly more adsorption capacities and this also agrees with the dynamic fouling test. For filtration of bacterial cells, the LIG-GO membranes were tested with a mixed culture of bacteria (~10$^6$ CFU mL$^{-1}$). The highest removal of ~99.9% was seen with LIG-GO H followed by LIG-GO M (99.1%) and LIG-GO L (95%). See FIG. 14D. This is an improvement over the previously reported LIG filters where bacteria removal by filtration alone was low.

Figure 15A:
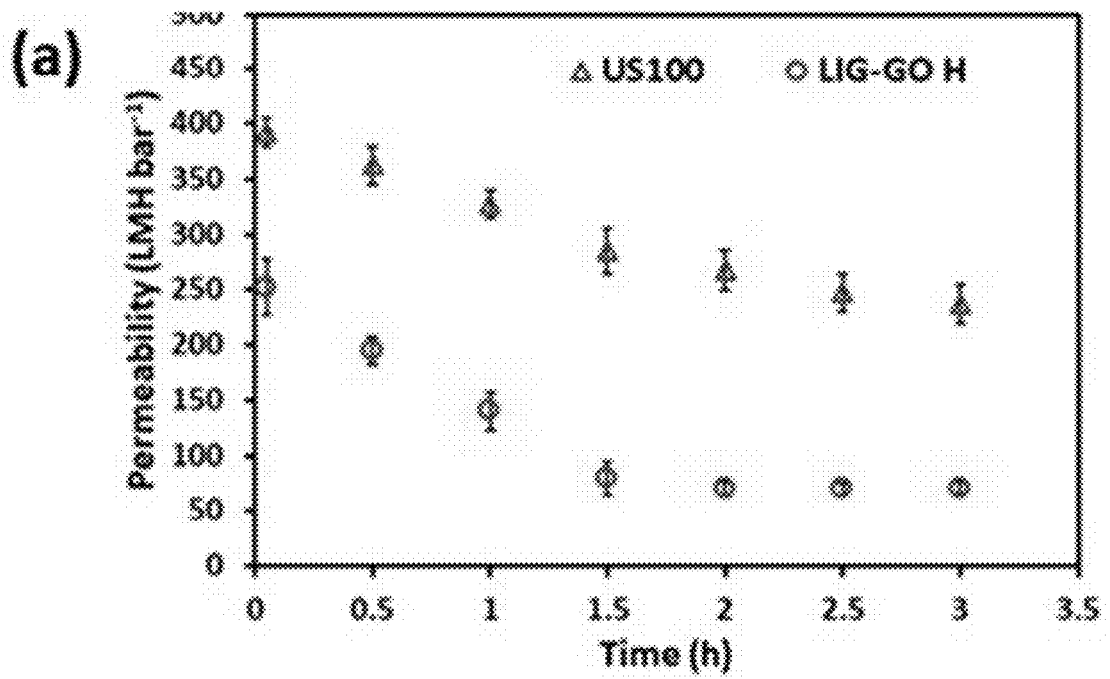
FIGS. 15A-15C show performance of LIG-GO H membranes tested in a cross-flow filtration cell.
Figure 15B:
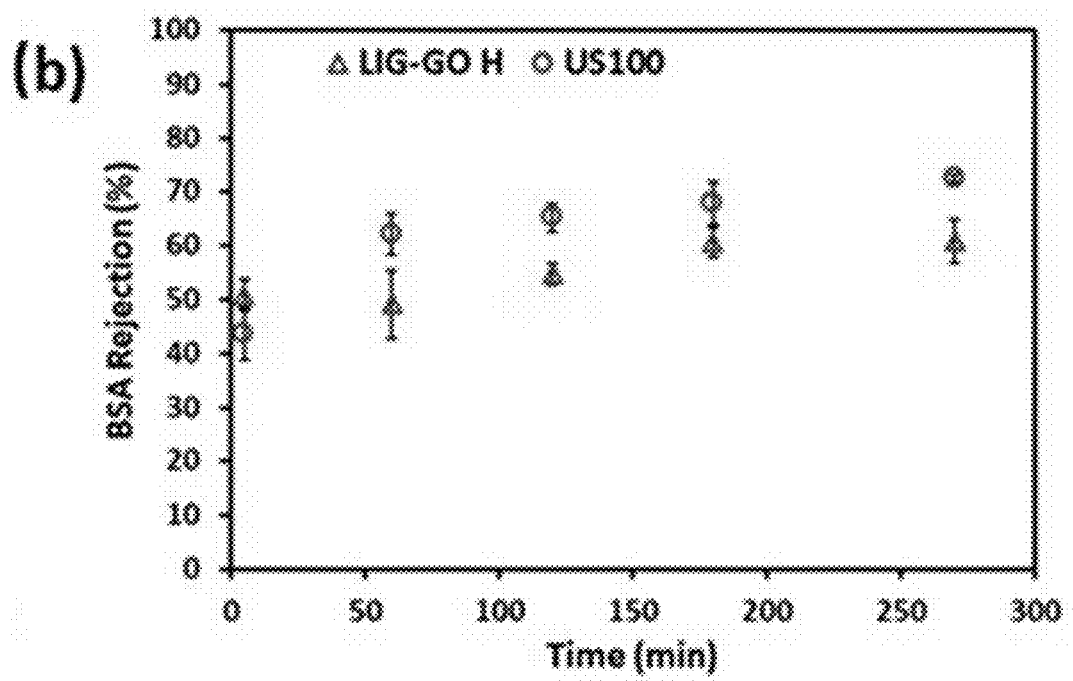

For cross-flow filtration experiments the LIG-GO H membrane was fabricated as described above but a larger custom made filter was used to deposit the GO/GA mixture onto the LIG support. After fabrication, the rectangular membrane coupons were placed in the cross-flow system and after compacting the membranes at 1.5 bar for 3 hours, the water permeability of LIG-GO H was stable at 70±1 LMH bar$^{-1}$ and a BSA rejection of 55±2% was measured after 2 hours. See FIGS. 15A-15B.

Figure 15C:
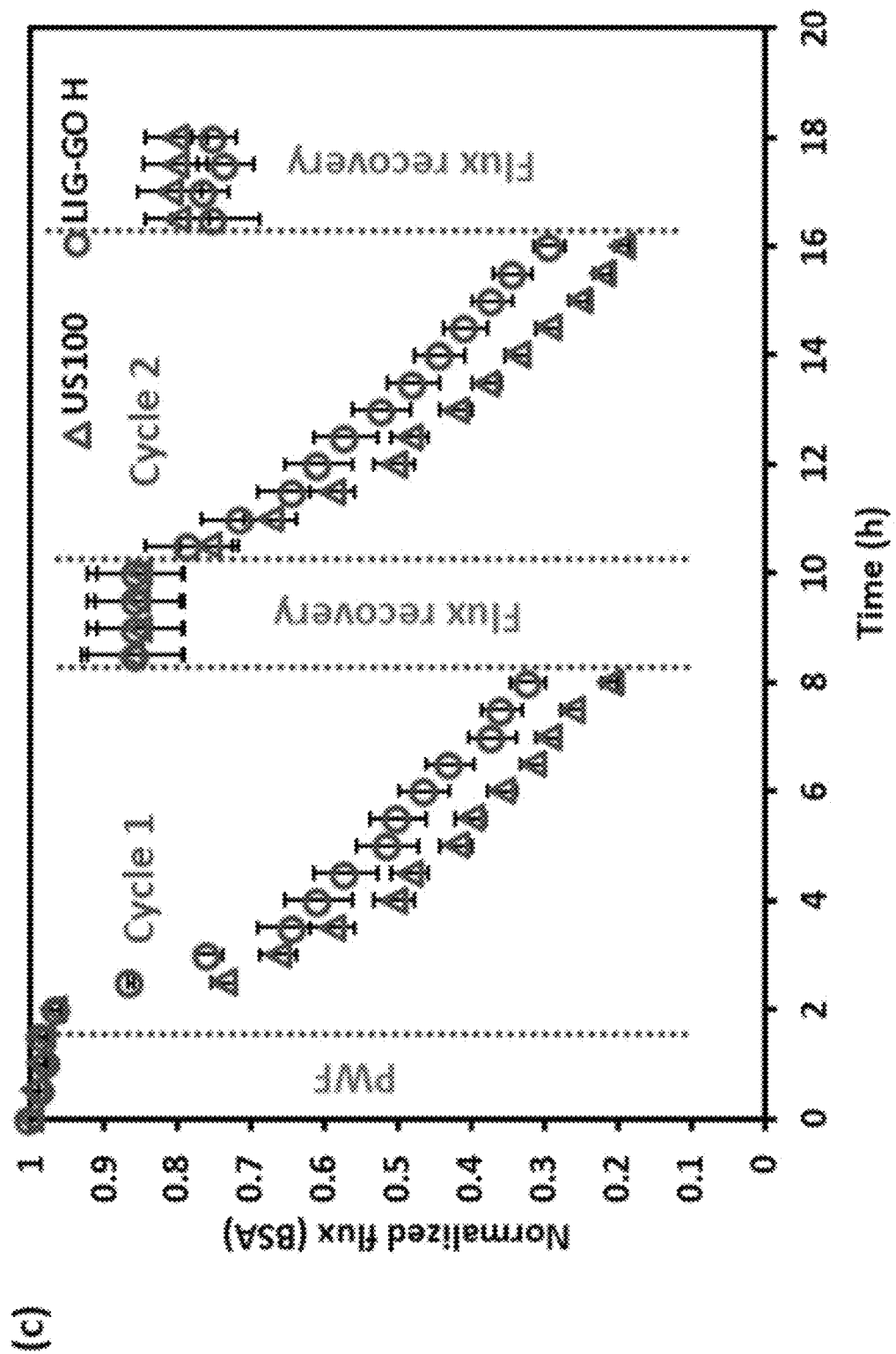

A commercial UF membrane (US100) with a similar BSA rejection of 65±3% was chosen for the control membrane. In general, the performance was similar, but the LIG-GO H membrane exhibited slightly less flux decline after 6 h of BSA fouling compared to the control membrane. See FIG. 15C. The average recovery rate over two cycles for both the control and LIG-GO H membranes were also similar at 83% and 80%, respectively, and was comparable to other GO composite membranes. The flux recovery decreased with each cycle probably due to irreversible BSA fouling and prevented a full recovery for both the LIG-GO H and control membranes. TABLE II compares the present LIG-GO membranes with other selected GO composite membranes found in the literature.

TABLE II

Comparison of LIG GO membrane performance with literature

| Membranes | Prep. method | PWF (LMH bar$^{-1}$) | BSA reject. (%) | FRR (%) | Remarks |
|---|---|---|---|---|---|
| LIG-GO L | Vacuum-filtration/pressure deposited of GO/GA solutions on LIG substrate. | 421.5 | 28 | 78 | Herein. |
| LIG-GO M | | 100 | 45 | 85 | |
| LIG-GO H | | 78.5 | 69 | 91 | Both flow-through and cross-flow filtration mode was used to study the antibacterial/antibiofilm activity with and without electric field for 48 h. |

TABLE II-continued

Comparison of LIG GO membrane performance with literature

| Membranes | Prep. method | PWF (LMH bar$^{-1}$) | BSA reject. (%) | FRR (%) | Remarks |
|---|---|---|---|---|---|
| PES/SPSf/GO [Liu 2015] | Non-solvent induced phase separation (NIPS) Method. | 817 | 99.5 | 92.4 | Antibacterial performance was tested in agar plate (static condition). |
| PES with different GO and pore forming agents [Hu 2010] | NIPS method. | 50-250 | 70-90 | 40-65 | Antibacterial activity/antibiofilm was not reported. |
| PES/GO [Faria 2018] | Phase inversion. | 30-120 | 100 | 50-80 | Antibacterial/antibiofilm activity was not reported/studied. |
| Nano-GO PSF [Fu 2017] | Phase inversion. | NR | NR | NR | Biofouling test performed in static mode. |
| UiO-66 @ GO/PES [Zhou 2018] | Phase inversion. | For GO/PES with GO contents of 0.5-4.0 (wt %): 4.5-9.0 kg m$^{-2}$ h$^{-1}$ | NR | For GO/PES with GO contents of 0.0-3.0 (wt %): 42.9-85.4 72.8-85.1 | Antibacterial/antibiofilm activity was not reported/studied. |
| Polyvinylidene fluoride (PVDF)-oxidized carbon nanotubes (OMWCNTs); PVDF-graphene oxide (GO); and PVDF-OMWCNTs-GO composite ultrafiltration membranes [Peng 2015] | Phase inversion. | 120-200 | 81-87 | | Antibacterial/antibiofilm activity was not reported/studied. |
| GO-PVDF [Zhang 2018] | Phase inversion. | 398.7 | ~90 | ~60 | Photocatalytic properties of membranes were reported. Antibacterial/antibiofilm activity was not reported/studied. |
| Hyperbranched polyethylenimine (HPEI)-GO/PES [Chu 2016] | Phase inversion | 153-199 | 25-51 μg cm$^{-2}$ (static adsorp.) | 92.1 (on the first cycle); 88.7 (on the second cycle). | Antibacterial properties tested in both static and dynamic conditions. The water flux drop on the HPEI-GO/PES membrane for bacteria suspension (E. coli) was about 23% from 170.4 to 130.8 Lm$^{-2}$ h$^{-1}$ including 15% which is due to the effect of the medium. reported BSA adsorption in static conditions only showed the flux during filtration of BSA solution in dynamic (cross-flow) conditions. |
| Fe$_3$O$_4$/GO-PVDF [Singh 2017] | Magnetic field induced casting and a | For GO mem. made w/out mag. | For GO mem. made w/out mag. | For GO mem. made w/out mag. | Antibacterial/antibiofilm activity NR. |

TABLE II-continued

Comparison of LIG GO membrane performance with literature

| Membranes | Prep. method | PWF (LMH bar$^{-1}$) | BSA reject. (%) | FRR (%) | Remarks |
|---|---|---|---|---|---|
| | phase inversion method | field: 398.7 | field: 92.6 | field: 79.3 | |
| PVDF/GO/ OMWCNTs; one-dimensional oxidized carbon nanotubes (OMWCNTs) [Singh I 2018] | Phase inversion | For GO/ OMWCNTs (10:0): 216.32 | NR (10:0): 75-90 | For GO/ OMWCNTs NR. | Antibacterial activity |

Figure 16:
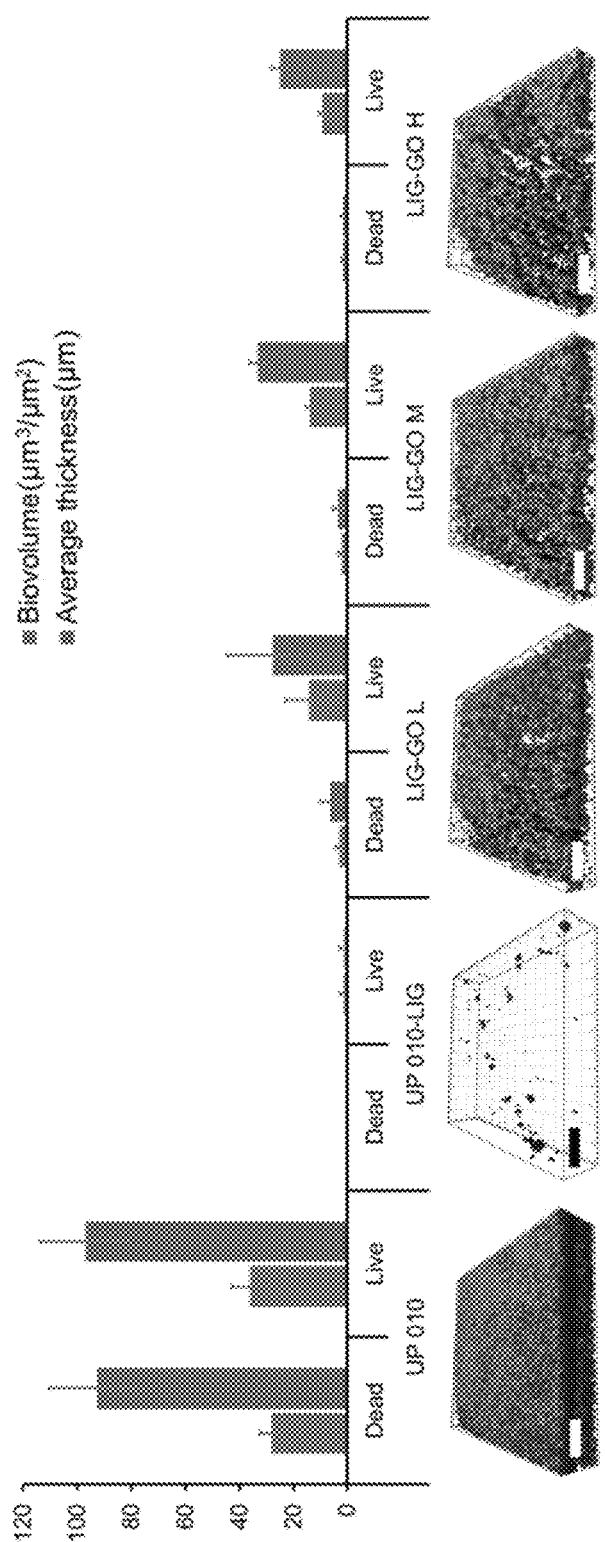
FIG. 16 shows biofilm growth on the polymeric membrane UP010, LIG as fabricated on the UP010 support, and the series of LIG-GO membranes with low (L) medium (M) and high (H) amounts of deposited GO. Associated representative images are shown that were generated using IMARIS software. The light and dark colors represents live and dead bacteria, respectively. Scale bar: 100 µm

* PWF-pure water flux (with $J_{w1}$, L m$^{-2}$ h$^{-1}$ bar$^{-1}$ abbreviated as LMH bar$^{-1}$); FRR-flux recovery ratio; NR-Not reported Anti-Adhesion and Antibiofouling Performance Biofilm formation is a challenge in membrane-based filtration processes. LIG-GO membranes of the present invention along with the control surfaces (an LIG support membrane and a commercial polymeric membrane (UP010)) were evaluated for biofouling with a mixed bacterial culture containing a variety of Gram positive and Gram negative species. The quantitative and qualitative biofilm in terms of biovolume and average thickness for live and dead cells was measured. See FIG. 16. The LIG-GO H showed ~82% less biofilm formation (biovolume) as compared to the polymeric membrane surfaces and there was no significant difference (p=0.07) between the LIG-GO membranes with different amounts of GO.

However, the LIG-GO membranes showed more biofilm growth than the LIG support membrane alone, which was extremely biofilm resistant. Since the unique structure of LIG including its 3D texture, nanofibers and micropores was shown to be a contributing factor for the biofilm resistance, the GO layer on top of the LIG support layer might have eliminated this effect, allowing more biofilm growth. Also the LIG surface was more hydrophilic)(~35°) than the LIG-GO surfaces (48-52°). A more hydrophilic surface can form a hydration layer which can resist foulants from adsorbing onto the surface.

For the LIG-GO membranes, the relatively low biofilm growth seen on the surfaces might be due to the microbial inhibitory effects of GO, which could contribute to an unfavourable environment for bacterial biofilm growth or although direct bacterial toxicity was not observed using CLSM. However, SEM images (low and high magnification) were obtained after fixation of the biofilm (FIGS. 17A-17J), and the LIG support membrane had the least amount of bacterial cells on the surface (FIGS. 17A-17B), whereas, a uniform layer of healthy bacterial cells could be seen on the polymer membrane (FIG. 17D). In comparison, the shape of the bacterial cells on LIG-GO surfaces were flatter and might indicate a loss in cellular integrity (FIGS. 17F, 1711, and 17J), and indicate that GO toxicity might play a role in the biofilm inhibitory effect although further evidence would be needed.

Thus in general, the material used in an LIG composite, and the resulting composite structure can be important factors when considering the design of an LIG-based membrane with antifouling properties. Nonetheless, LIG-GO membranes demonstrate potential for use in water and wastewater treatment technologies and other properties of LIG-GO such as the electrical conductivity of the LIG support layer can lead to functional surfaces.

Electrical Effects of LIG-GO Membranes Under Filtration Mode

An LIG-GO membrane with high permeability was needed to test the electrical effects of the membrane in dead-end filtration mode for bacteria viability and inactivation on the surface of the LIG-GO membrane using the filtration design, such as described in Singh I 2018. In comparison to the other LIG-GO membranes fabricated as described above, ultra low amounts of GO was deposited on the LIG support (LIG-GO UL; see TABLE I) and investigated for bacterial inhibition with applied voltages in filtration mode.

Figure 18A:
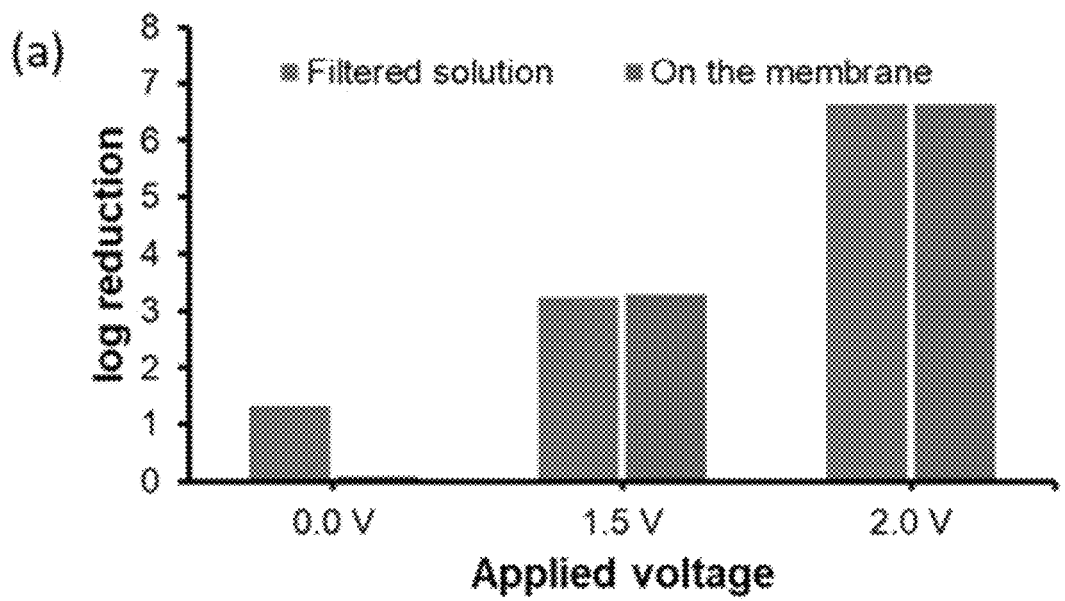
FIG. 18A is a graph that shows the effect of applied voltage on bacterial cell viability with two LIG-GO UL membranes stacked in the dead-end filtration mode using a mixed bacterial culture suspension (~$10^6$ CFU mL$^{-1}$ in 0.9% NaCl solution) at a flow rate of ~100 L m$^{-2}$ h$^{-1}$. Standard deviations are too small to be seen on log scale.

To assemble the filtration setup, carbon threads were connected to two membranes and protected with epoxy glue and these were stacked in a dead-end filtration membrane flow-through system described in Singh I 2018. In this configuration, ~10$^6$ CFU mL$^{-1}$ were filtered through the LIG-GO UL membranes at ~100 LMH and resulted in ~6 log inhibition at 2.0 V, and more than –3 log inhibition at 1.5 V (FIG. 18A) in the permeate and also on the membrane surface. Without the applied voltage, ~95% bacterial removal was seen, whereas at 2V, complete disinfection was seen. The different membrane parameters for the LIG-GO UL membrane is summarized in TABLE I.

Figure 18B:
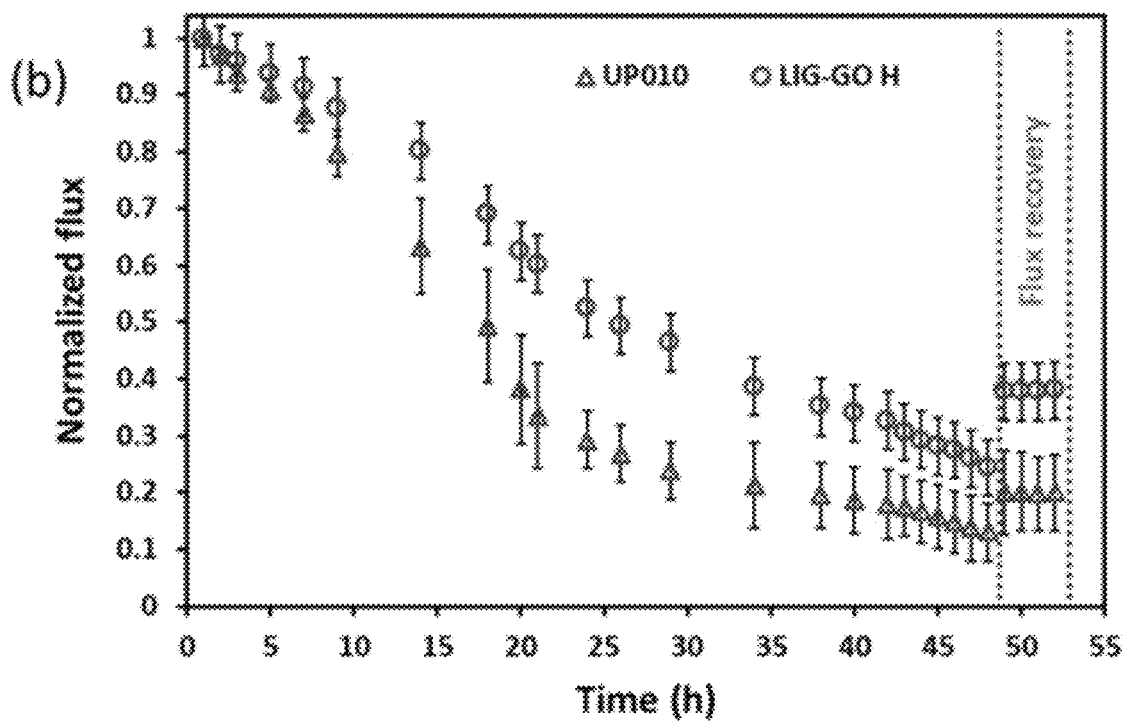
FIG. 18B is a graph that shows the effect of DC voltage (3.0 V) on normalized permeability of LIG-GO H membranes during 48 h cross-flow filtration with $10^4$ CFU/mL of *P. aeruginosghffha*. UP010 served as a control.

In addition, to test the electrical effects of the membrane with high amounts of GO using cross-flow filtration, the LIG-GO H membrane was investigated under biofilm growth conditions at 3V for 48 h. The UP010 membrane was chosen as a comparison because it gave a similar flux as the LIG-GO H at 1 bar. The cross-flow system more closely mimicked real conditions and was more indicative of actual membrane fouling effects. Thus, using a feed solution dosed with bacteria, the normalized permeation rate of the LIG-GO H membrane was reduced by ca. 75%, which was better than a commercial polymeric control membrane, in which the normalized flux was reduced by 87%. See FIG. 18B. Moreover, under the electric field, the flux recovery was 37% for LIG-GO H compared to 20% for the polymeric control membrane. This improvement is believed to be due to electrical effects.

Uses of LIG-GO Membranes

The present functional LIG-based composite filters with tailorable protein and bacterial rejection using a GO cross-linked network as the embedded separation material. The resulting LIG-GO composite membranes yielded superior antifouling properties and inhibition of biofilm when compared to a commercial polymer-based UF membrane. Increasing the amount of crosslinked GO on the LIG surface resulted in increased rejection of bovine serum albumin (BSA) up to 69%, and bacterial rejection was increased from 20 to 99.9%, which agreed with the measured molecular weight cut-off determination that approached ~90 kDa as the GO content increased. Higher flux recovery ratios and lower BSA adsorption were seen with LIG-GO membranes, and the hybrid membranes showed comparatively good antifouling. These composite membranes showed 83% less biofilm growth compared to a typical polymer ultrafiltration membrane under non-filtration condition.

The LIG supporting layer maintained its electrical conductivity and the LIG-GO membrane used as electrodes showed complete elimination of bacterial viability with potent antimicrobial killing effects when treated with mixed bacterial culture. The electrically conductive LIG support layer imparted electrical functionality and the LIG-GO used as porous electrodes showed complete elimination of bacterial viability with potent antimicrobial effects when filtered with mixed bacterial culture.

In cross-flow filtration, LIG-GO membranes with 3V anodic electric field showed 11% improvement of flux as compared to typical polymer ultrafiltration membrane. Thus, in cross-flow filtration conditions, the LIG-GO H membrane performed better than a commercial polymeric membrane.

The LIG-GO membranes can be utilized in membrane separation applications, such as ultrafiltration.

Laser-Induced Graphene-PVA Composite as Robust Electrically Conductive Water Treatment Membranes Some embodiments of the present invention provide mechanically robust electrically conductive LIG-poly(vinyl alcohol) (PVA) composite membranes, which can, for example, be tailored to have separation properties suitable for ultrafiltration processes. PVA has outstanding chemical and physical stability with good film-forming properties and is a biocompatible and nontoxic polymer. Compared to LIG coated filters, the PVA-LIG composite membrane filters exhibited up to 63% increased bovine serum albumin rejection and up to ~99.9% bacterial rejection, which corresponded well to the measured molecular weight cutoff ~90 kDa. Compared to LIG fabricated on a polymer membrane control, the composite membranes show excellent antifouling properties including low protein adsorption, and the anti-biofilm effects are more pronounced at lower PVA concentrations. Notably for the antibacterial capabilities, the LIG supporting layer maintained its electrical conductivity and LIG-PVA composites can be used as electrodes for complete elimination of mixed bacterial culture viability and the potent antimicrobial killing effects were maintained in the composite. These embodiments of the present invention can be utilized for industrial filtration applications.

Methods of LIG-PVA Composite Membrane Fabrication

Figure 19A:
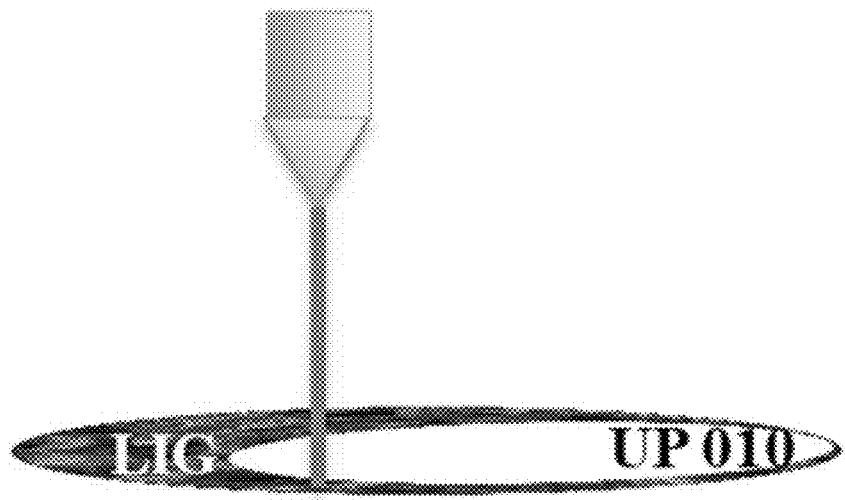
FIG. 19A is an illustration of LIG generated on UP 010 membranes using a 10.6 µm $CO_2$ laser.
Figure 19B:
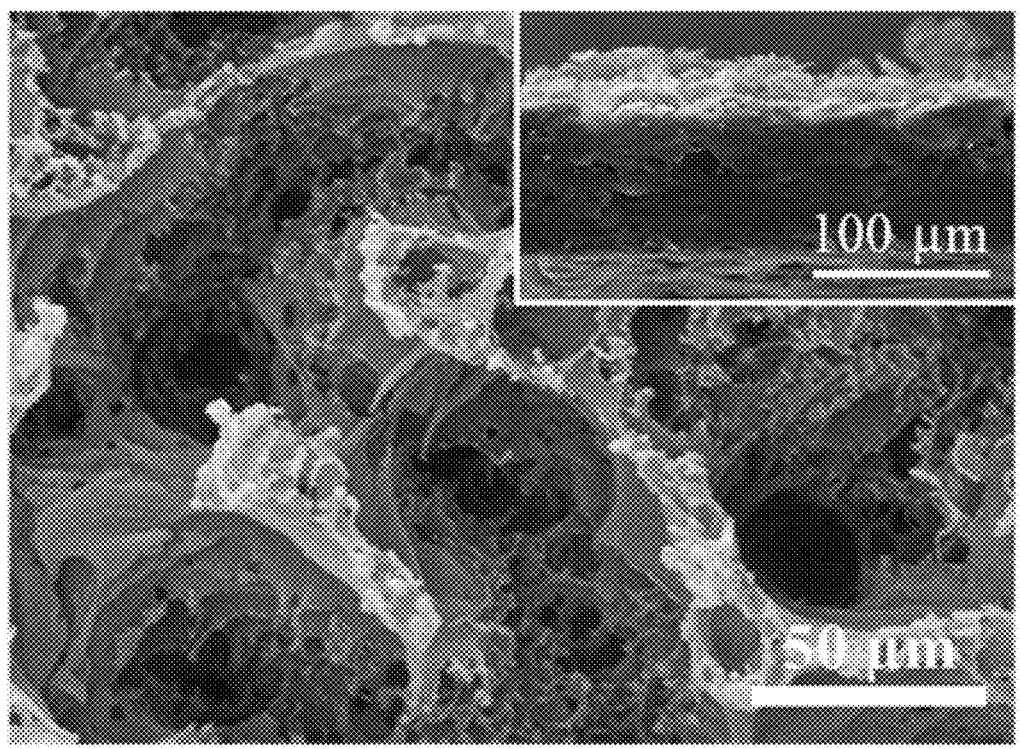
FIG. 19B is SEM images of the as prepared LIG including cross-section (inset).
Figure 19C:
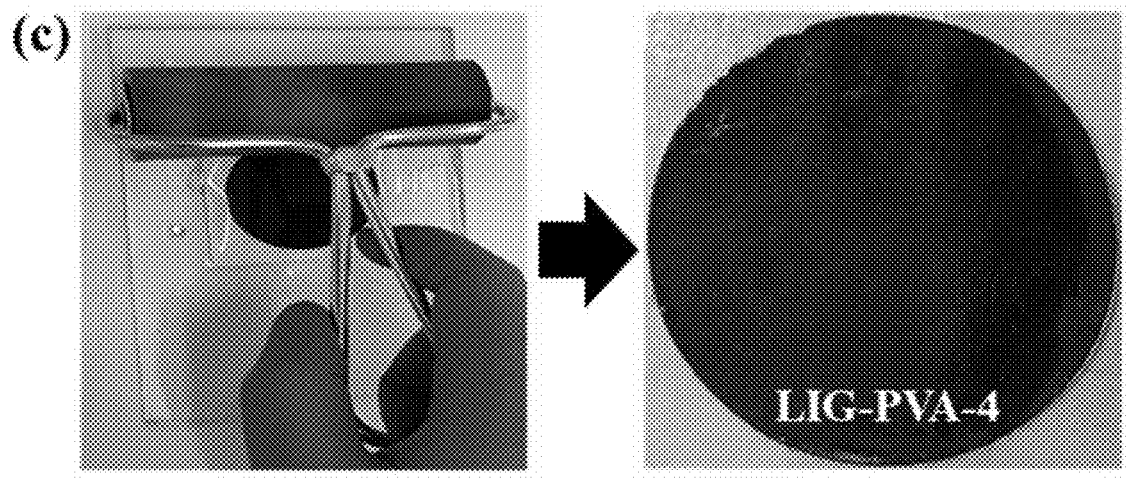
FIG. 19C shows a preparation method for LIG-PVA-4 membrane showing excess PVA solution removal with a rubber roller.

A two-step process can be used for the design and fabrication of LIG-PVA composite membranes, such as shown in FIGS. 19A and 19C. Firstly, the fabrication of LIG on a substrate (such as a commercial PES polymer membrane substrate) can be performed using a $CO_2$ laser in an ambient atmosphere as described above. See FIG. 19A. This can then be followed by PVA surface coating and crosslinking, such as with glutaraldehyde. See FIG. 19C.

For instance, LIG was generated on the surface of porous polyethersulfone membranes (UP 010) using a 10.6 μm carbon dioxide ($CO_2$) laser cutting system (Universal VLS 3.50 Laser cutter platform). Settings of power (0.1% of full power 50 W), image density (1000 pulse per inch), and scan rate (25%) were used under ambient conditions. SEM images indicated that the LIG had a 3D porous structure and was characteristic of LIG previously reported having a broad distribution of pore sizes. See FIG. 19B.

LIG-PVA membranes were prepared by surface modification of the LIG filter by PVA as follows: A known amount of PVA (0.5, 1, 2, 3 and 4%, w/v) was dissolved in DI water at 80° C. with vigorous stirring for 4 h followed by cooling to room temperature. The LIG membrane support (5.5 cm×5.5 cm) was fixed on a clean glass plate with cello tape, and 5 mL of the PVA aqueous solution was gently poured on top of the LIG substrate and allowed to contact for 10 min. Then, after removing the excess solution using a soft rubber roller, the resulting LIG substrates imbibed with PVA were dried at 50° C. in a vacuum oven for 12 h. Afterward, the obtained PVA coated LIG substrates were then immersed into a crosslinking solution consisting of 5 wt % glutaraldehyde, 0.5% HCl and acetone for 12 h at 50° C. Finally, the cross-linked membranes were thoroughly washed with acetone and dried in air at room temperature for 12 h before use and characterization. The membranes prepared with different PVA concentrations were designated as LIG-PVA-0.5, LIG-PVA-1, LIG-PVA-2, LIG-PVA-3 and LIG-PVA-4 membranes, corresponding to the concentration of PVA in the coating solution, 0.5%, 1%, 2%, 3%, and 4%, respectively. The LIG support membranes were used as controls.

Figure 19D:
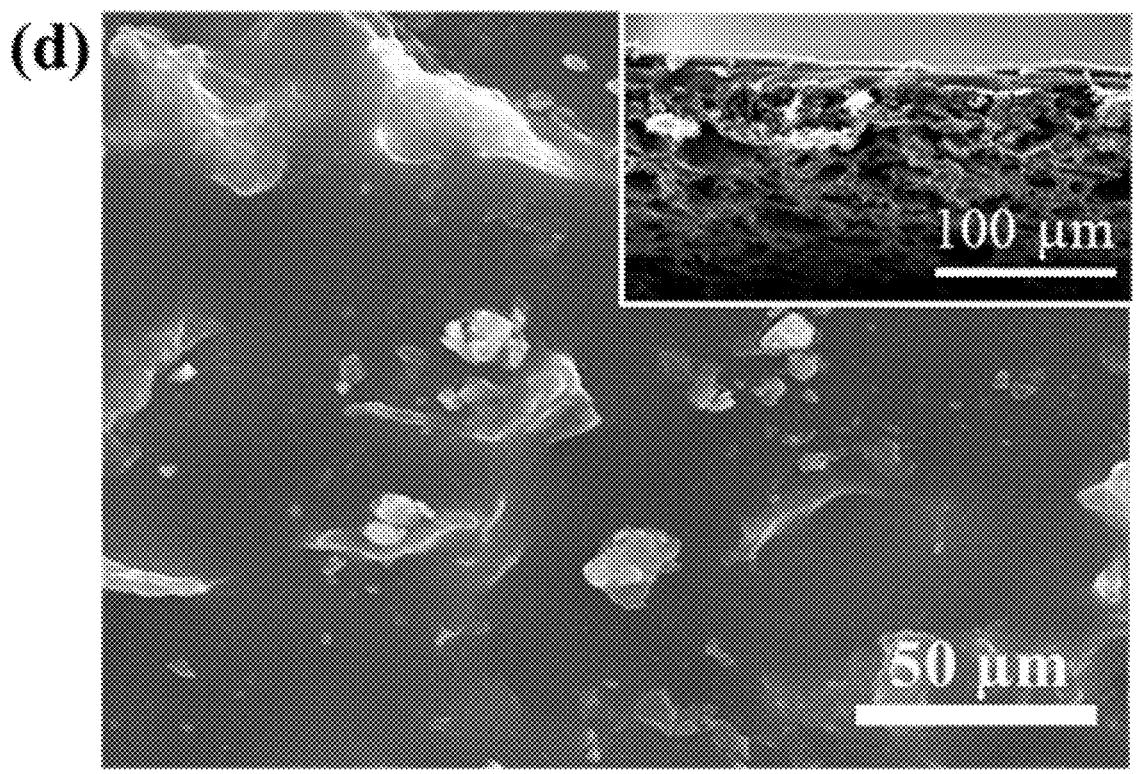
FIG. 19D is SEM images of LIG-PVA-4, including cross-section (inset).

The surface morphology of the composite membranes at high magnification is shown in FIGS. 20A-20F for (a) LIG (b) LIG-PVA-0.5 (c) LIG-PVA-1 (d) LIG-PVA-2 (e) LIG-PVA-3 and (f) LIG-PVA-4 membranes, respectively. Coating with higher concentrations of PVA resulted first in the smaller pores to be filled in, and at the highest concentrations the very large pores are filled (see FIGS. 20A-2F), resulting in a reduction in pore size. Only the SEM image of the membrane made with the highest concentration of PVA (LIG-PVA-4) (FIGS. 19D and 20F) clearly showed a uniformly coated layer of PVA on the LIG substrate, with the LIG structure almost completely covered and no visible pores or pinholes were observed. Indeed the smoother covering of the PVA layer compared to the highly porous LIG substrate control can also be seen upon inspection of the cross-section SEM images. See FIGS. 19B and 19D.

Fourier transform infrared spectroscopy spectra of the LIG-PVA-4 membrane also indicated a complete covering and showed PVA adsorption bands at 3300-3400 $cm^{-1}$, and 2925 $cm^{-1}$ associated with the stretching vibration of the hydroxyl (—OH) groups, and the CH asymmetric stretching vibration, respectively. In addition, the band observed at 1050-1140 $cm^{-1}$ could indicate the formation of C—O—C groups by glutaraldehyde cross-linking. Raman spectra showed the typical D, G and 2D bands corresponding to the LIG.

Figure 21A:
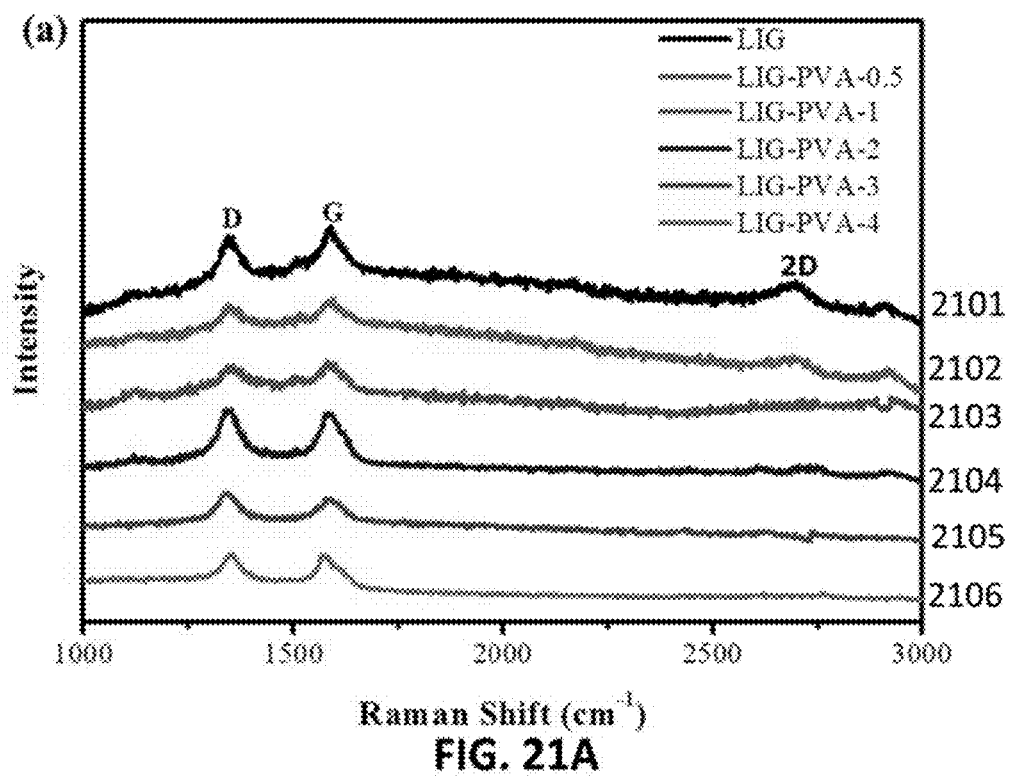
FIGS. 21A-21B are, respectively, Raman spectra and water contact angle of the LIG-PVA composite membranes.
Figure 21B:
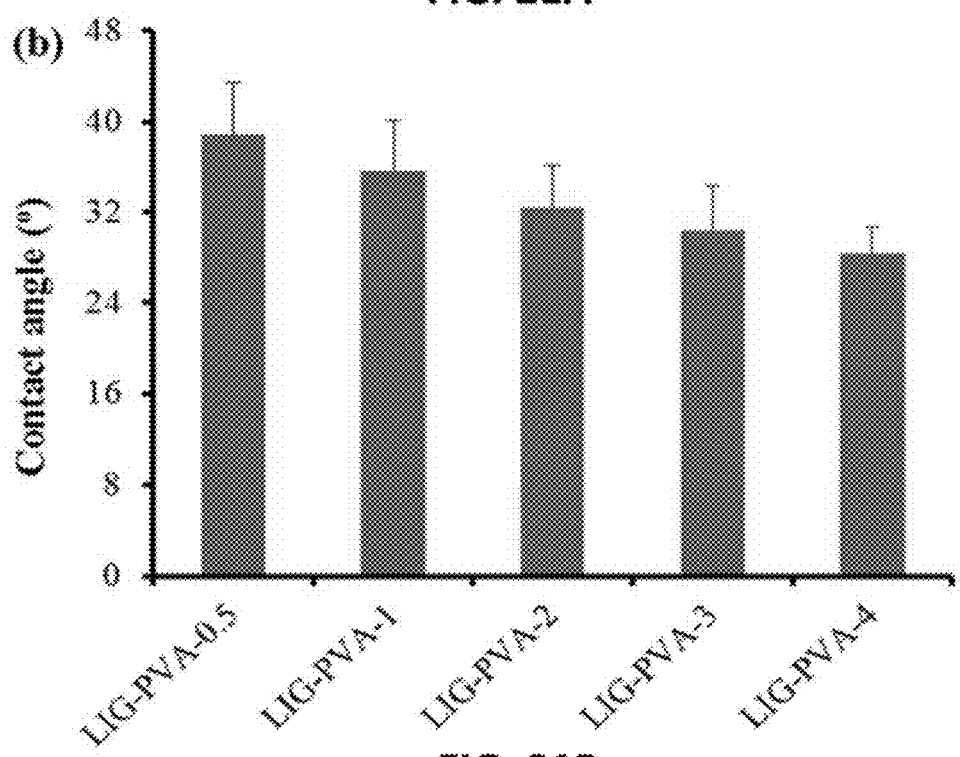

In general, as the amount of PVA increased, the 2D bands disappeared, and indicated that the covering amount of PVA on the membranes had increased. See FIG. 21A with plots 2101-2106 corresponding to (a) LIG (b) LIG-PVA-0.5 (c) LIG-PVA-1 (d) LIG-PVA-2 (e) LIG-PVA-3 and (f) LIG-PVA-4 membranes, respectively. Contact angle analysis was performed to determine the surface wettability of the LIG-PVA composite membranes (FIG. 21B), and showed that as the amount of PVA increased, the hydrophilicity of the surface increased. The contact angles of LIG-PVA-0.5, LIG-PVA-1, LIG-PVA-2, LIG-PVA-3 and LIG-PVA-4 were 38.9°, 35.7°, 32.4°, 30.3° and 28.4°, respectively.

Mechanical Stability of the LIG and LIG-PVA Composite Membranes

The LIG and the LIG-PVA-0.5 membrane were exposed to ultrasonic agitation for 30 min in water to test the mechanical stability of the LIG and LIG-PVA composite membrane. The LIG substrate showed the loss of LIG in contrast to the LIG-PVA-0.5 membrane, which did not exhibit any signs of disintegration or loss of LIG or PVA.

For longer term stability tests, the LIG and LIG-PVA-0.5 membranes were subjected to 4.5 hours of ultrasonic agitation, including 2 hours at 50° C. Again, the LIG membrane was significantly damaged, compared to the undamaged LIG composite membrane. After 1 hour ultrasonic agitation of the LIG-PVA-0.5 and the LIG-PVA-4 membranes, the permeability and rejection differences between the membranes before or after treatment were <2%. See TABLE III.

TABLE III

LIG-PVA-0.5 and LIG-PVA-4 membrane performance before and after 1 hour sonication

| Parameters | LIG-PVA-0.5 | LIG-PVA-4 |
|---|---|---|
| Before sonication | | |
| Water flux (LMH bar$^{-1}$) | 5569 ± 28 | 222.8 ± 10.5 |
| BSA rejection (%) | 9.7 ± 1.5 | 61.8 ± 1.2 |
| After sonication | | |
| Water flux (LMH bar$^{-1}$) | 5484 ± 27 | 219.7 ± 10.6 |
| BSA rejection (%) | 9.5 ± 1.9 | 60.9 ± 1.4 |

In addition to the ultrasonic agitation, a tape test for assessing the durability of the membranes was performed. When a piece of adhesive tape was pressed onto the surface of LIG and removed, LIG powder was separated from the substrate. However, when the procedure was performed with the LIG-PVA-0.5 membrane, the tape was visually clean with no damage to the substrate surface giving evidence that the composite formation imparts a significantly improved mechanical stability to the LIG membrane surface.

Performance of LIG-PVA Composite Membranes

Figure 22A:
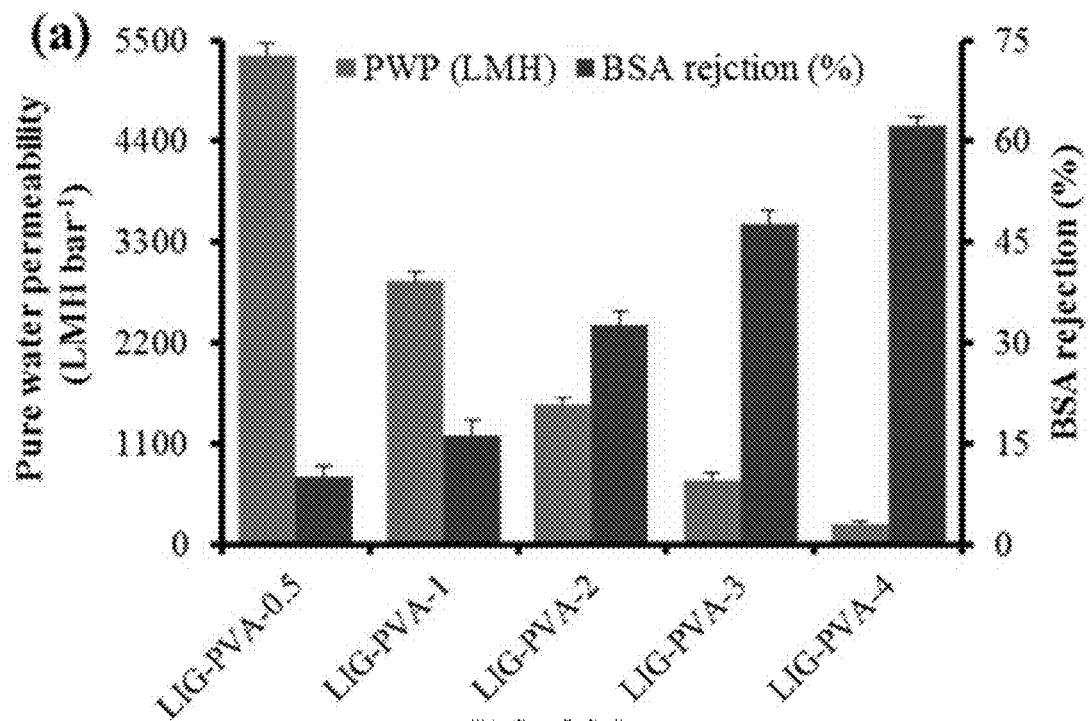
FIGS. 22A-22B show performance parameters for LIG-PVA composite membranes, which are, respectively, (a) pure water permeability (left axis) and BSA rejection (right axis), and (b) rejection of various PEG compounds with the LIG-PVA composite membranes.

The results of permeability and BSA rejection of the LIG-PVA membranes are shown in FIG. 22A. The LIG-PVA-0.5 membrane had the highest initial PWP (~5440 LMH, bar$^{-1}$) while the LIG-PVA-1, LIG-PVA-2, LIG-PVA-3 and LIG-PVA-4 membranes exhibited decreasing PWPs of 2865, 1514, 707 and 225 LMH bar$^{-1}$), respectively, and indicated a correlation to the PVA concentration. The increased PVA concentration covered the porous structure of the LIG support more effectively, which can decrease the effective pore size and reduce the membrane flux. The separation performances of the LIG-PVA membranes were evaluated by filtration of BSA protein FIG. 22A. It is believed that the LIG-PVA-0.5 membrane rejected less than 11% of BSA probably because the large pores were not completely filled. In contrast, increased concentrations (1%-4%) of PVA on the LIG support enhanced rejection of BSA to 16%, ~32%, ~48% and ~63%, respectively.

Figure 22B:
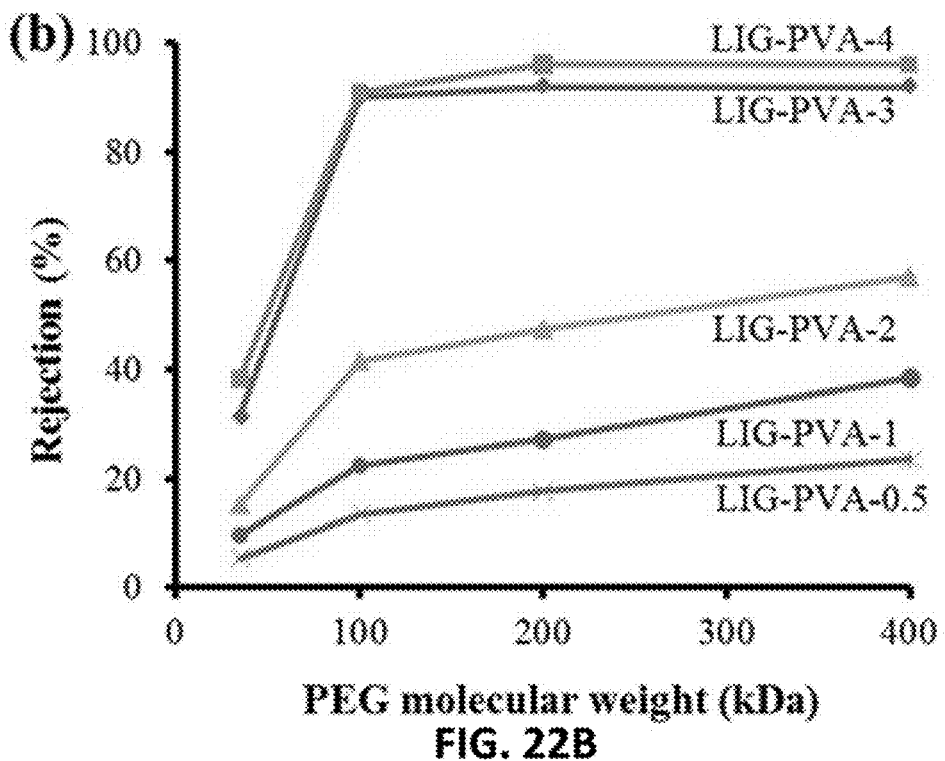
Figure 23A:
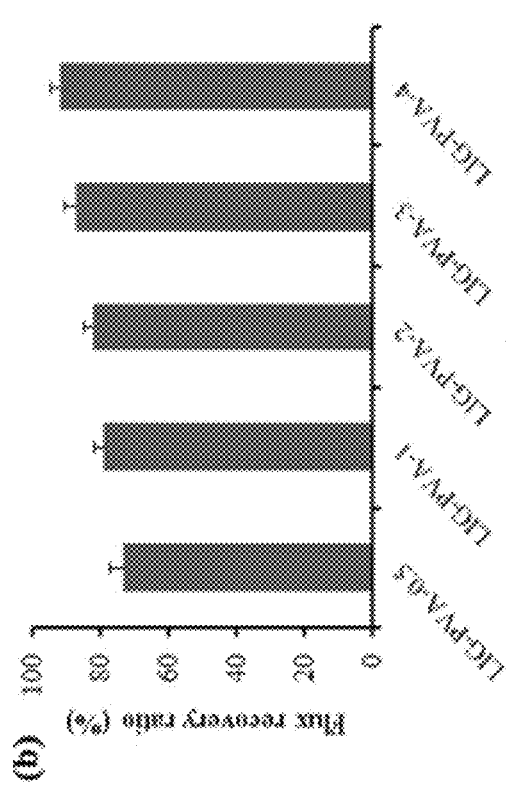
FIGS. 23A-23D are graphs showing, respectively, (a) BSA permeability: aqueous feed solution (1.0 g L$^{-1}$), (b) flux recovery ratio, (c) BSA static adsorption; and (d) bacterial cells removal for different membranes.

The MWCO, defined as the molecular weight of PEG where 90% rejection was observed, of the LIG-PVA composite membranes by measuring the rejection of PEG 35, 100, 200, and 400 kDa (FIG. 22B). Among these prepared membranes, LIG-PVA-3 and LIG-PVA-4 exhibited the highest ability to reject solutes with a MWCO~90 kDa, while the rest showed MWCO>400 kDa. Accordingly, with a mixed culture of bacteria (~10$^6$ CFU mL$^{-1}$), the highest removal of ~99.9% was seen with LIG-PVA-4 followed by LIG-PVA-3 (99.1%), LIG-PVA-2 (98.5%), LIG-PVA-1 (72.5%) and LIG-PVA-0.5 (38.5%) (FIG. 23D), an improved rejection over the previously reported LIG filter. See TABLE IV.

TABLE IV

Membrane performance for LIG control membrane

| Parameters | Values |
|---|---|
| Water flux (LMH bar$^{-1}$) | 24801 ± 18 |
| BSA absorption (%) | 2.5 ± 0.4 |
| BSA rejection (%) | 3.9 ± 1.3 |
| Bacteria removal (%) | 18.3 ± 4.9 |

Antifouling Performance of the LIG-PVA Composite Membranes

Protein fouling, flux decline and recovery testing were performed using BSA as a model foulant in a dead-end filtration system to evaluate the antifouling ability of the LIG-PVA composite membranes. Filtration of BSA solution resulted in flux decreases for the composite membranes, indicating BSA accumulation in the pores and on the surface of the membranes. See FIG. 23A. The LIG-PVA-0.5 approximately lost 36% of its initial flux due to the fouling and the LIG composite membranes with a higher content of PVA (1%-4%) exhibited lower flux declines, with LIG-PVA-4 losing ~19% of its original flux from filtration of the BSA solution. The decrease in flux decline is most likely due to the enhanced hydrophilicity from the addition of PVA and is directly related to the amount of PVA contained within the LIG composites, which might prevent BSA adsorption. A hydrophilic surface is likely to form a hydrated layer that resists foulants. Also, the higher rejection of the LIG-PVA-4 membranes might prevent BSA from penetrating into the membrane causing less pore blocking.

Figure 23B:
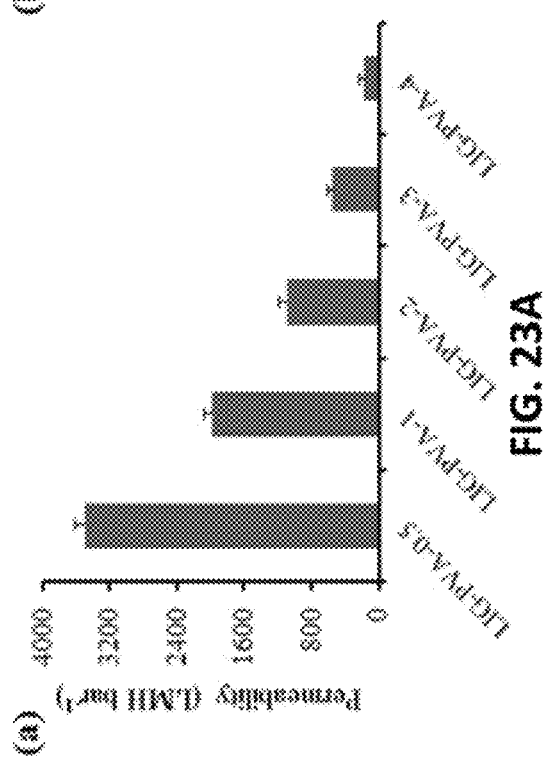

The degree of irreversible membrane fouling was evident by the amount of flux recovery (FRR). The flux returned to ~73, 78, 82, 87, and ~92% of the original flux for LIG-PVA-0.5, LIG-PVA-1, LIG-PVA-2, LIG-PVA-3 and LIG-PVA-4, respectively, after gentle cleaning of the BSA-fouled membrane surfaces with DI water (FIG. 23B). Compared to the LIG-PVA-0.5 membrane, the greater FRR values of the LIG-PVA-4 membrane indicated a greater cleaning efficiency with increased PVA concentration.

Figure 23C:
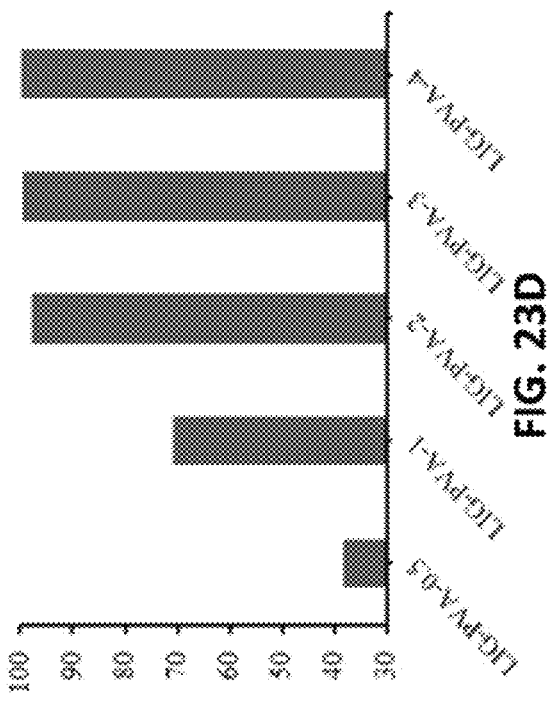
Figure 23D:
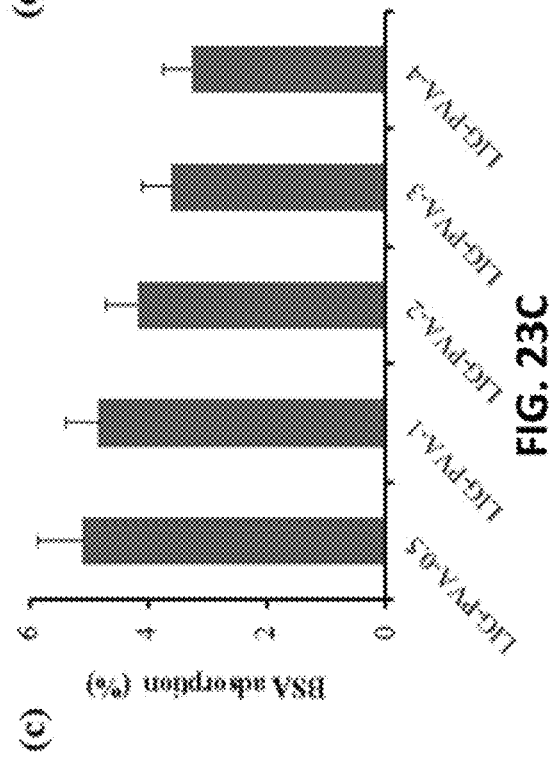

In addition to the dynamic fouling measurements, the static protein adsorption test was performed to estimate the surface susceptibility to organic foulants. The protein adsorption slightly decreased (FIG. 23C) from 5.0% to 3.3%, as the amount of PVA increased. Thus, the properties of the polymer used in the LIG composite affect the fouling resistance of the membrane.

Biofilm Growth and Adhesion Analysis

Figure 24:
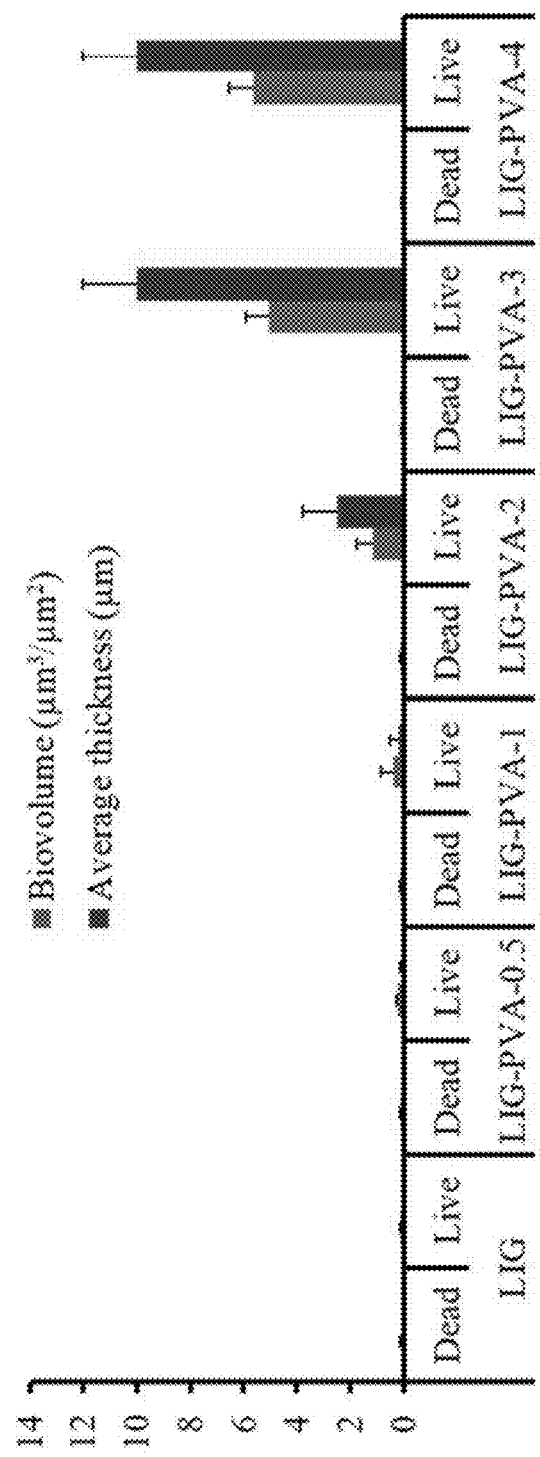
FIG. 24 shows biofilm growth on the LIG as fabricated on the UP010 support and a series of LIG-PVA composite membranes.

The biofouling of LIG-PVA composite membranes along with an LIG control surface were examined using a mixed bacterial culture containing a variety of Gram positive and Gram negative species. The quantitative biovolume and average thickness for live and dead cells is shown in FIG. 24.

The LIG-PVA-0.5, LIG-PVA-1 membrane showed almost no biofilm formation similarly to the LIG control. The composite membranes made with increased PVA concentrations resulted in increased biofilm growth. Since the unique structure of LIG including its 3D texture, nanofibers, and micropores was shown to be a contributing factor for the biofilm resistance, the coating of PVA on top of the LIG support might have eliminated this effect, allowing more biofilm growth on LIG-PVA membranes, and again underlining the importance of the polymer in the composite formation.

Figure 25:
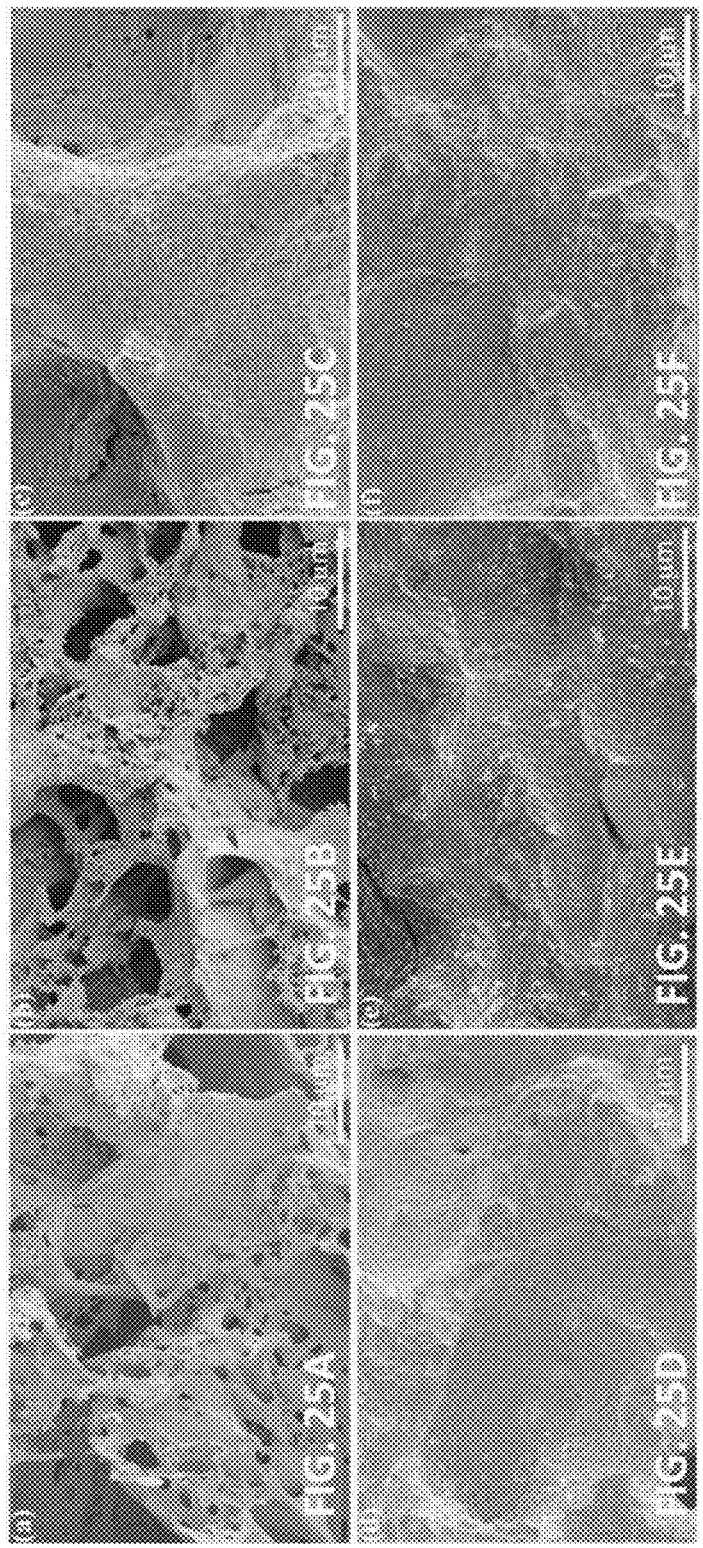
FIGS. 25A-25F are SEM images showing biofilm extent on the surface after biofilm growth experiments for, respectively, (a) LIG, (b) LIG-PVA-0.5, (c) LIG-PVA-1, (d) LIG-PVA-2, (e) LIG-PVA-3, and (f) LIG-PVA-4 membranes.

SEM images were obtained after fixation of the biofilm (FIGS. 25A-25F), which showed that the LIG support membrane and LIG-PVA-0.5 membrane had the least amount of bacterial cells on the surface (FIGS. 25A-25B), whereas, substantially more cells could be seen on the LIG-PVA-1, LIG-PVA-2 and LIG-PVA-4, respectively (FIGS. 25C-25D and 25F).

Thus, in addition to the material used in an LIG composite, the resulting composite structure might also be a contributing factor in the design of functional electrically conductive LIG composite membrane with antifouling properties.

Electrical Effects of LIG-PVA Composite Membranes: Bacteria Inactivation

The LIG-PVA-0.5 membrane had the highest surface electrical conductivity, was the most resistant to biofilm growth, and had the highest pure water permeability in comparison to the other LIG composite membranes. Bacterial inhibition with applied voltages in filtration mode was tested on the LIG-PVA-0.5 membrane. Carbon threads were connected to two membranes and protected with epoxy glue and these were stacked in a dead-end filtration membrane flow-through system design as described in Singh I 2018.

Figure 26:
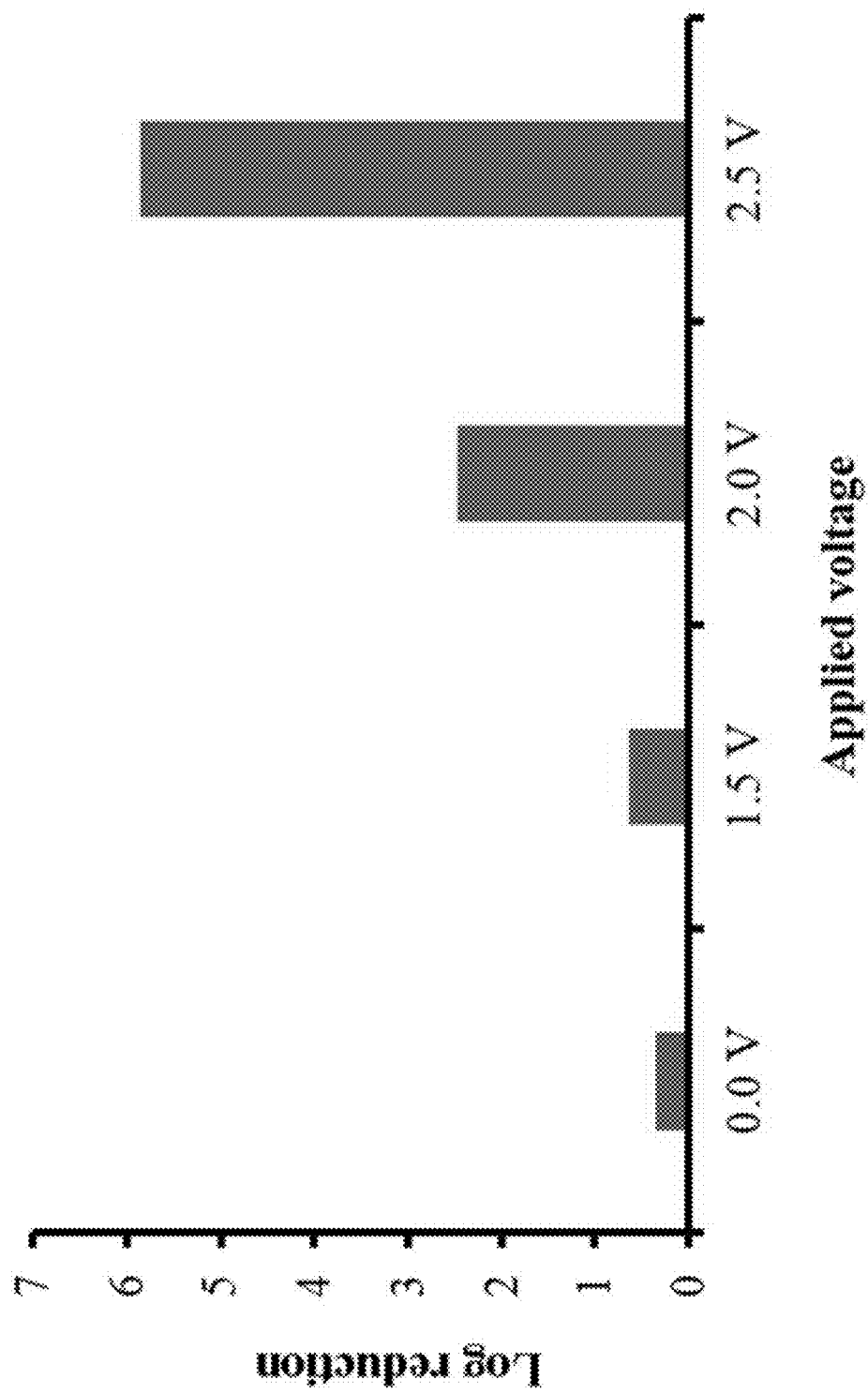
FIG. 26 shows the effect of applied voltage on bacterial cell viability with two LIG-PVA-0.5 membranes stacked in the dead end filtration mode using a mixed bacterial culture suspension (~$10^6$ CFU mL$^{-1}$ in 0.9% NaCl solution) at a flow rate of ~500 L m$^{-2}$ h$^{-1}$.

In this configuration, ~$10^6$ cfu mL$^{-1}$ were filtered through the LIG-PVA-0.5 membranes at ~500 LMH and resulted in ~6 log inhibition at 2.5V, and around ~3 log inhibition at 2V (FIG. 26) in the permeate. Without the applied voltage, ~39% bacterial removal was seen, whereas at 2.5V, complete disinfection was seen.

The electrical conductivity of the LIG-PVA-0.5 surface was measured to be ca. 5% less than the parent LIG surface and thus the mechanism of voltage dependent antimicrobial action was probably similar to previously reports. Briefly, both electrical and chemical effects were believed to play a role. A rapid physical destruction of the bacteria or direct oxidation of bacterial components can occur as bacteria contact the electrode surface. Chemical effects include the electrochemical generation of species toxic to bacteria such as hydrogen peroxide, which are believed to exist at high concentrations very near the electrode surface.

Uses of LIG-PVA Composite Membranes

This embodiment of the present invention shows functional LIG-PVA composite membranes fabricated on LIG membrane supports by coating of PVA and crosslinking. The LIG-PVA composite membranes greatly improve the mechanical robustness of the LIG and as the PVA concentration increased, the protein and bacterial rejection also increased. The composite membranes also were resistant to fouling and had good FRR, but as the concentration of PVA increased, the water flux significantly decreased and the surfaces were more susceptible to biofilm growth. An antibacterial activity effect was observed with applied voltage and was seen in filtration mode. The polymer component (PVA) of the composite determines the extent of the antifouling effect although advantages of PVA might include that it is a water soluble polymer with many hydroxyl functionalities available to be cross-linked in three-dimensional networks or possibly grafted with functional groups. These offer another means to vary the surface properties and functionality of the composite membrane. Composite membranes including LIG might broaden the application of LIG in various water treatment processes.

The mechanically robust electrically conductive LIG-PVA composite membranes can be tailored with separation properties suitable for ultrafiltration processes. PVA has outstanding chemical and physical stability with good film-forming properties and is a biocompatible and nontoxic polymer. Compared to LIG coated filters, the PVA-LIG composite membrane filters exhibited up to 63% increased bovine serum albumin rejection and up to ~99.9% bacterial rejection, which corresponded well to the measured molecular weight cutoff ~90 kDa.

Compared to LIG fabricated on a polymer membrane control, the composite membranes showed similarly excellent antifouling properties including low protein adsorption, and the anti-biofilm effects were more pronounced at lower PVA concentrations. For the antibacterial capabilities, the LIG supporting layer maintained its electrical conductivity and a selected LIG-PVA composite used as electrodes showed complete elimination of mixed bacterial culture viability and indicated that the potent antimicrobial killing effects were maintained in the composite. This demonstrates the use of LIG for practical industrial filtration applications.

Laminated Laser-Induced Graphene Composites

Some embodiments of the present invention provide methods for efficiently forming large areas of multifunctional, robust, multilayered, and patterned LIG composites that are compatible with industrially scalable roll-to-roll processing. Fabrication, transfer, and encapsulation of LIG devices can be performed with various thermoplastic polymers using an inexpensive modified thermal laminator. Applications of these composites include triboelectric nanogenerators (TENGs) and biomedical surfaces. (LIG composites that can be utilized in TENGs and biomedical surfaces can also be made by the methods previously described herein for forming LIG composites).

Methods of Fabrication

FIGS. 27A-27B show a schematic of a LIG synthesis on a substrate (which, as shown is PI) that is utilized in a lamination process of the LIG into various thermoplastics with removal of the substrate. As shown in FIG. 27A-27B, LIG can be formed through irradiation of polyimide (PI) with a commercial laser cutter, and then subsequently transferred to a thermoplastic via a modified thermal laminator. The LIG/polyimide 2701 formed in the irradiation process shown in FIG. 27A is fed through the thermal laminator with thermoplastic 2702 and moved along the thermal laminator utilizing the rollers 2704 so that they can be laminated, such as at 180°. Then utilizing a peeling process 2705 (or other separation process), the polyimide 2707 is then separated, which leaves the thermoplastic/LIG composite 2706.

Patterned composites can be easily formed through direct laser-writing of the LIG pattern on PI followed by lamination of the PI-supported LIG film with the polymer of interest. Multi-layer composites can be formed via addition of a polymer film to the composite layers by subsequent lamination passes, as demonstrated through the composite in FIG. 27C.

Addition of reinforcement materials is likewise possible. For instance, FIGS. 28B and 29B and FIGS. 28F and 29G exhibits multilayer composites with tissue paper and cheesecloth, respectively, embedded as reinforcements.

Figure 27D:
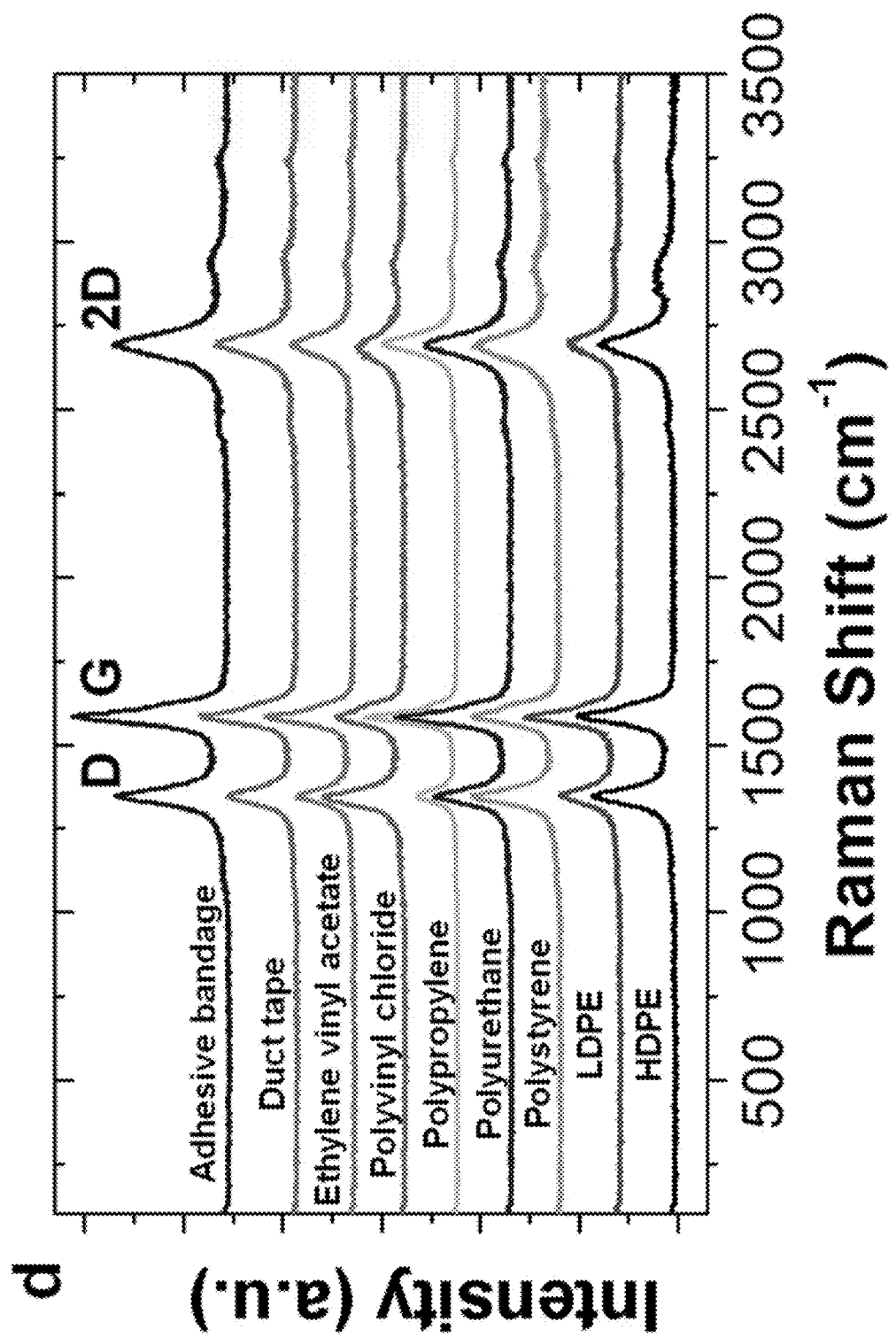
FIG. 27D is Raman spectra of various LIG composites.
Figure 30:
FIG. 30 is an SEM image of LIG formed on PI prior to compositing, which exhibits an intrinsic gradient of morphologies, ranging from an apical carpet of laser-induced graphene fibers (LIGF) to a basal layer of foam-like laser-induced graphene attached to polyimide.
Figure 31:
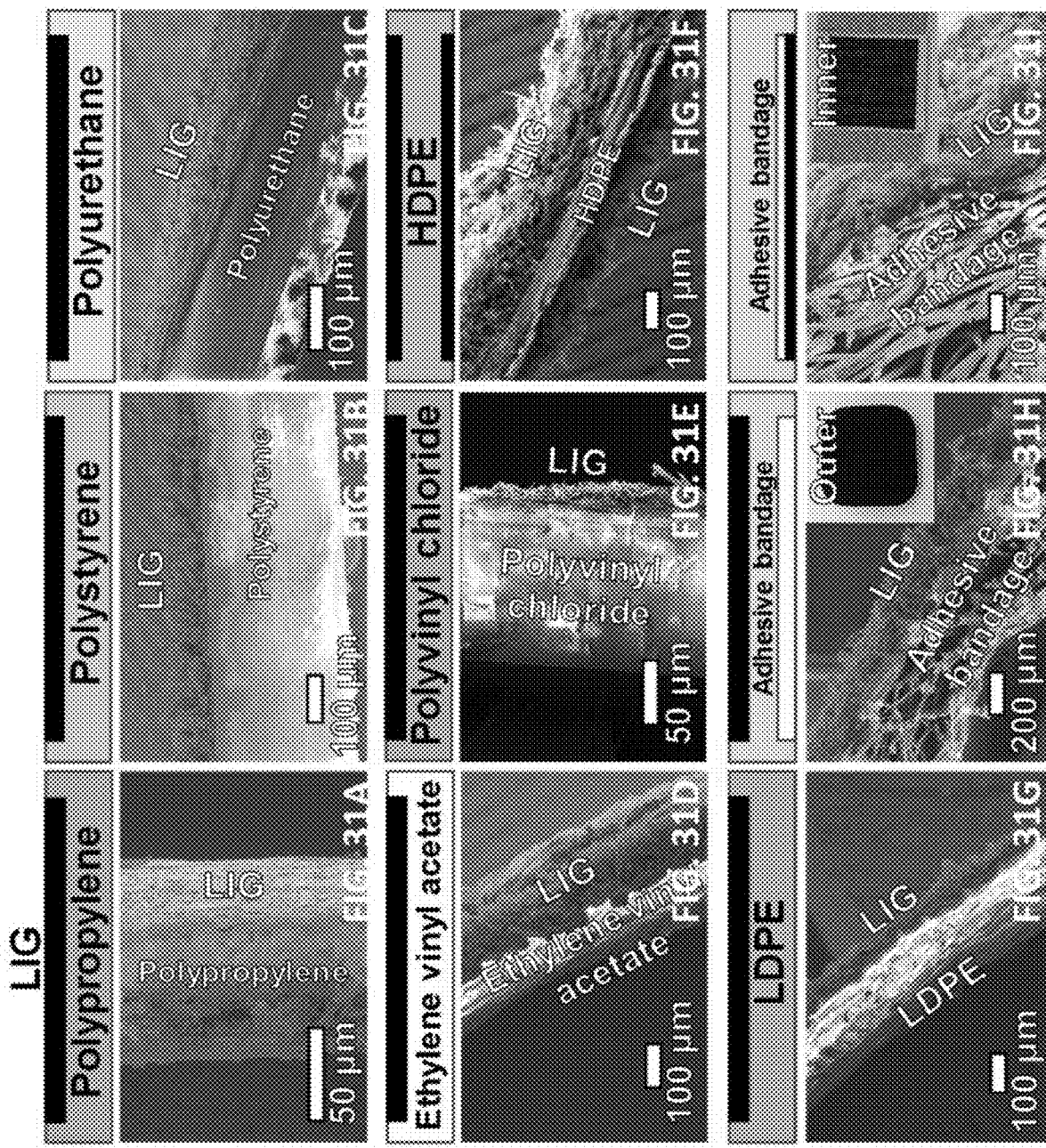
FIGS. 31A-31I are SEM cross-section images and layer diagrams of LIG composites made by laminating with a variety of thermoplastics.
Figure 32:
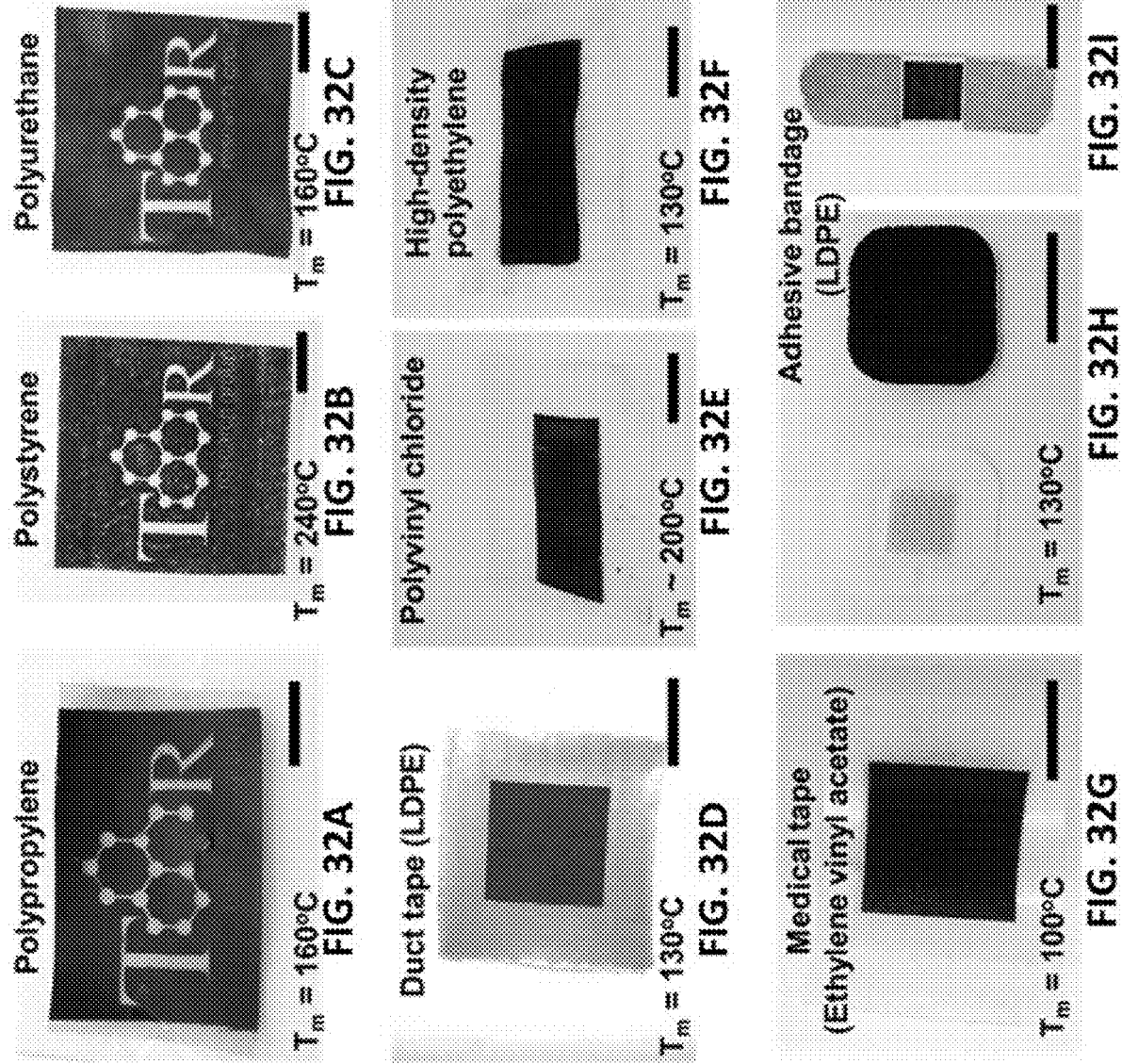
FIGS. 32A-32I are optical images of a few selected LIG/Polymer composites that were formed utilizing a lamination process.

Various Raman shift spectra of the LIG composites are shown in FIG. 27D. The presence of the 2D peak in the spectra indicates that graphene was formed, and subsequently, successfully embedded within the polymer matrix materials. The morphology of LIG can be controlled by proper adjustment of laser conditions. Therefore, the composites formed will exhibit morphologies characteristic of the adjustable lasing parameters and the thermoplastic used. For example, laser settings chosen for the formation of LIG can form a carpet of laser-induced graphene fibers (LIGF) growing out of a basal layer of laser-induced graphene (LIG) foam. Thus, there is an intrinsic gradient which progresses as one moves away from the surface of the PI (or other substrate), from the LIG to the LIGF morphology, as shown in FIG. 30.

Cross-section SEM images of various composites are shown in FIGS. 31A-31I. It was seen that the degree of transfer varied depending on the polymer. For all composites, the LIG was embedded within the top 50-100 µm of composite. Some polymers exhibited selective transfer of the LIGF carpet morphology, leading to fibrous surface microstructure, as demonstrated by the LIG/LDPE composite, whereas other polymer matrices, as displayed through the LIG/PP composite, led to transfer of the basal LIG foam layer as well, yielding surface microstructure that resembles a porous foam. The lamination process can be used to form a composite either on a single side or on both sides of a polymer film through a single pass through the modified thermal laminator, as demonstrated by the LIG/HDPE/LIG composite. Optical images of the composites are shown in FIGS. 28A-28F and 32A-32I.

Figure 33:
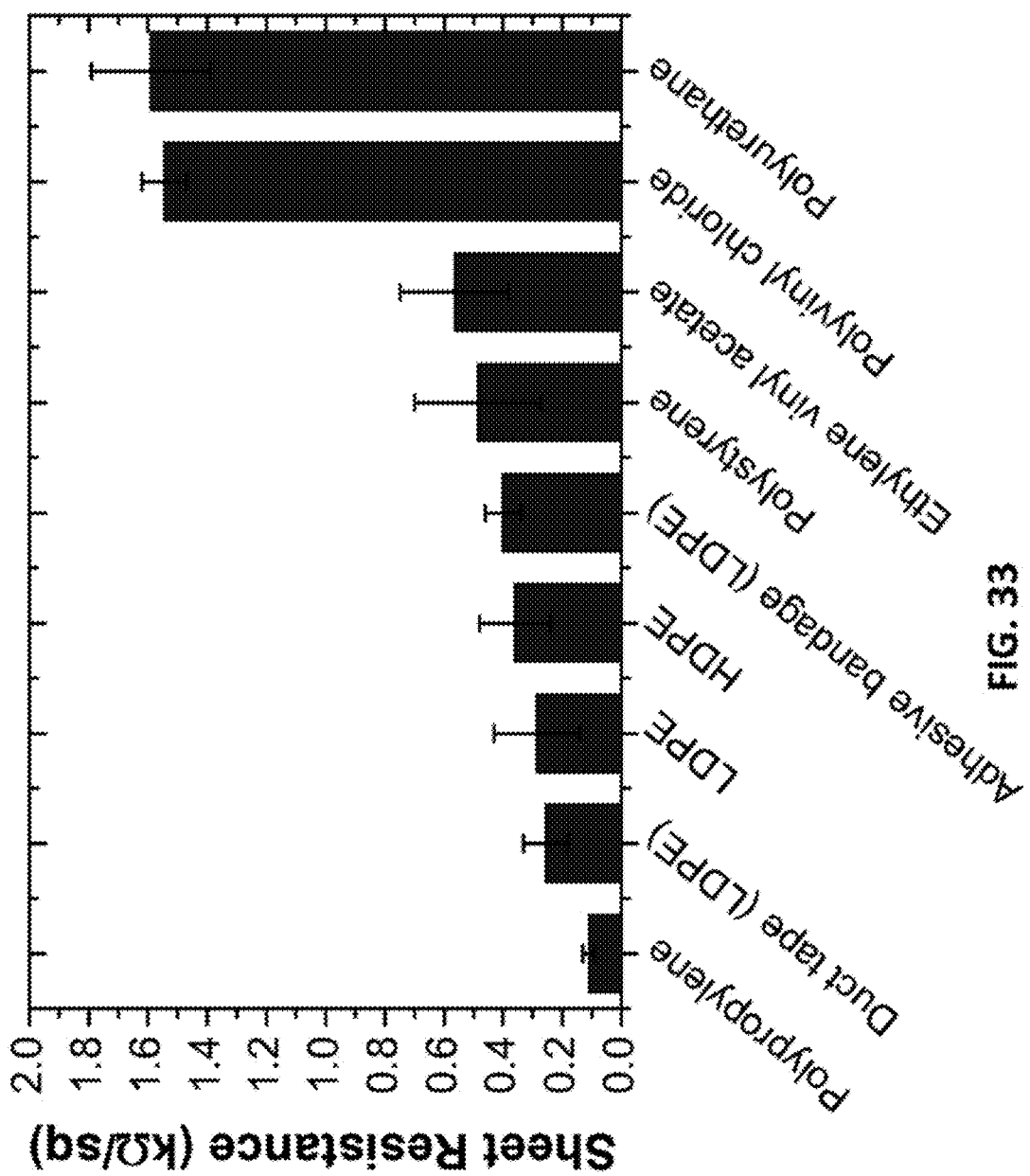
FIG. 33 shows sheet resistance values for LIG composited with a variety of materials utilizing a lamination process. All LIG was generated under the same conditions.
Figure 34:
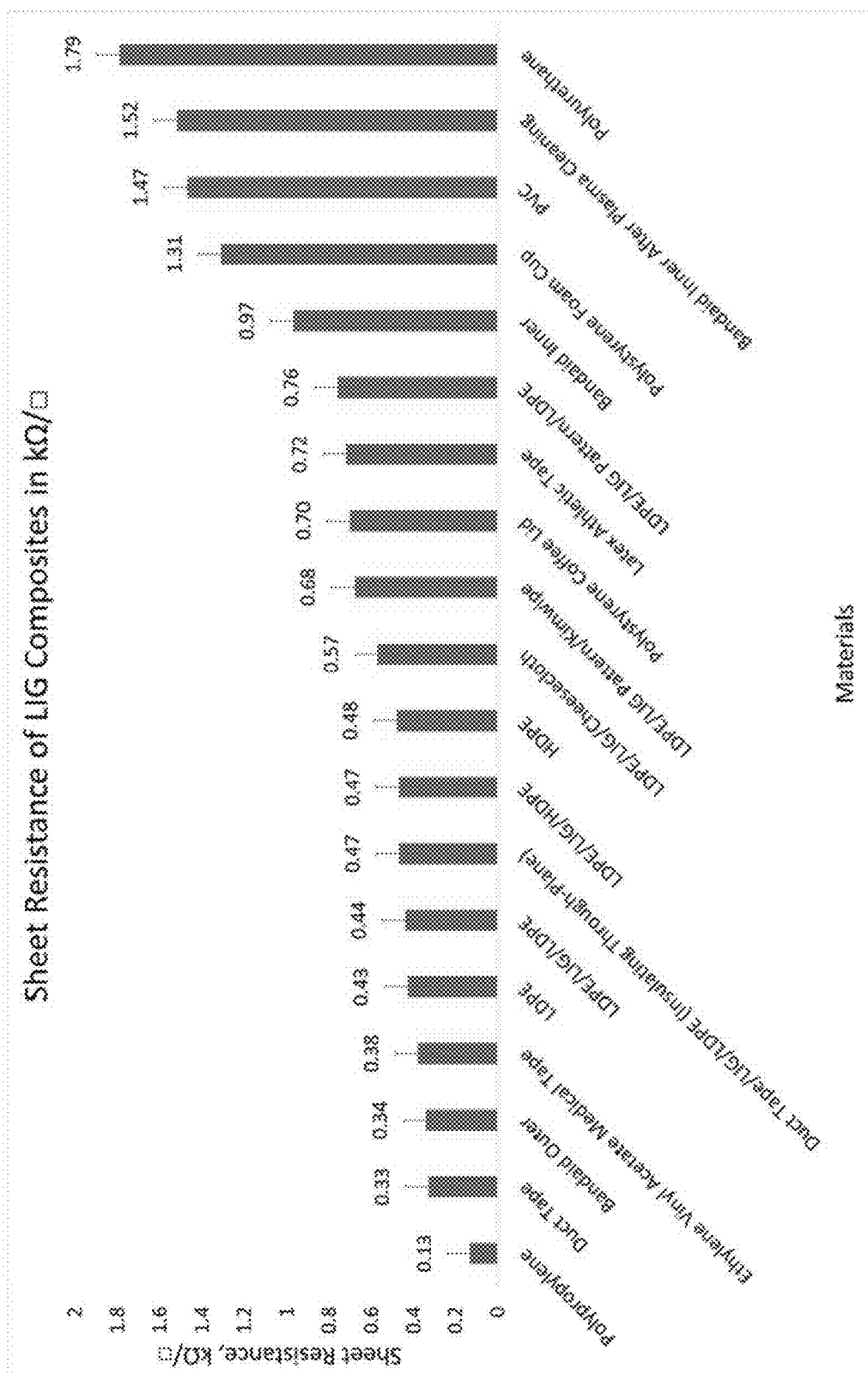
FIG. 34 show sheet resistances of a further variety of LIG composites formed utilizing a lamination process.

Sheet resistances of some composites are shown in FIGS. 33-34. Since the LIG is the conductive component, composites formed from smooth uniform polymer films have the highest conductivity, due to even embedment of LIG within the entire surface area of the polymer film. Compositing into a discontinuous surface, as shown through the athletic medical tape (ethylene vinyl acetate) and the Styrofoam cup, decreases conductivity, as the resulting composite will likewise exhibit discontinuities.

For patterned composites, the sheet resistances are increased due to the decreased surface area of the polymer film that is composited with LIG, as demonstrated through the composites with lace patterns, such as shown in FIG. 27C and FIGS. 28A-28C. However, patterning increases functionality through allowing the direct inclusion of LIG devices, and simultaneously yields additional durability against delamination through the formation of interlayer "rivets" or fastening points by direct fusion of neighboring layers of plastic in certain selected regions.

In some cases, where reinforcement fibers are added, such as in the LDPE/Cheesecloth/LIG/LDPE composite shown in FIG. 29B, the fibers may cut into the LIG/polymer composite, thereby increasing the sheet resistance through introduction of discontinuities. Therefore, coarse fiber reinforcements can instead be placed between non-LIG-composited surfaces of the multilayer structures.

Conductive Electrode Integration

Figure 35A:
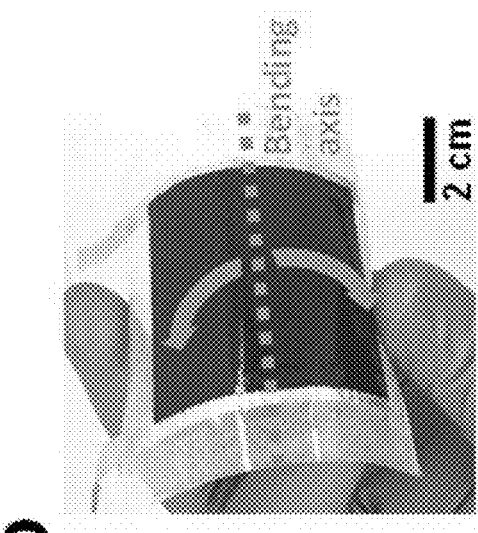
FIG. 35A shows a schematic showing the lamination of Cu electrodes onto LIG.

The compositing process also allows for the direct integration of robust electrodes including other materials into the composites, such as shown in FIG. 35A. FIG. 35A shows the process by which electrodes are directly embedded within LIG composites. Namely, an LIG composite with LDPE was fabricated. Copper film was then placed against the LIG composite and a top layer of LDPE is laminated over the Cu. This presses the Cu film into the composite and encapsulates the Cu and LIG between sheets of LDPE to form robust and flexible contact. For instance, A LIG/LDPE composite was formed through lamination. Then, copper strips were placed along the edge of the composite. A piece of LDPE film was then placed on top of the copper strips, thus sandwiching the copper strips between the LIG/LDPE composite and LDPE. The entire structure was then passed through the laminator.

Figure 35B:
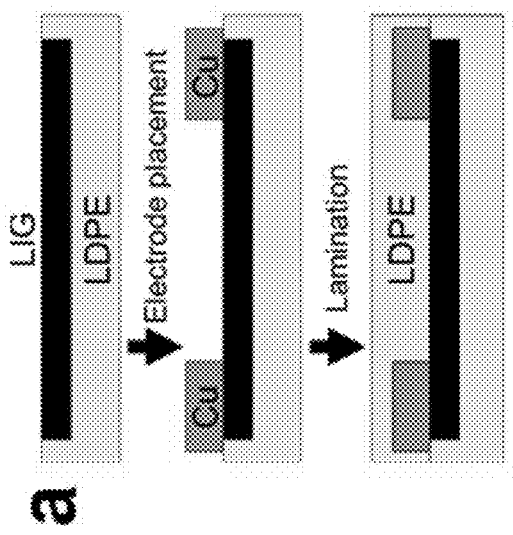
FIG. 35B shows an optical image of LIG encapsulated in LDPE with copper electrodes.

The composite was subsequently bent for many cycles (FIG. 35B) to demonstrate that the contact between the copper electrode and the LIG inside the composite does not substantially degrade after 1000 bending cycles at a bend radius of 1.5 cm.

Figure 35C:
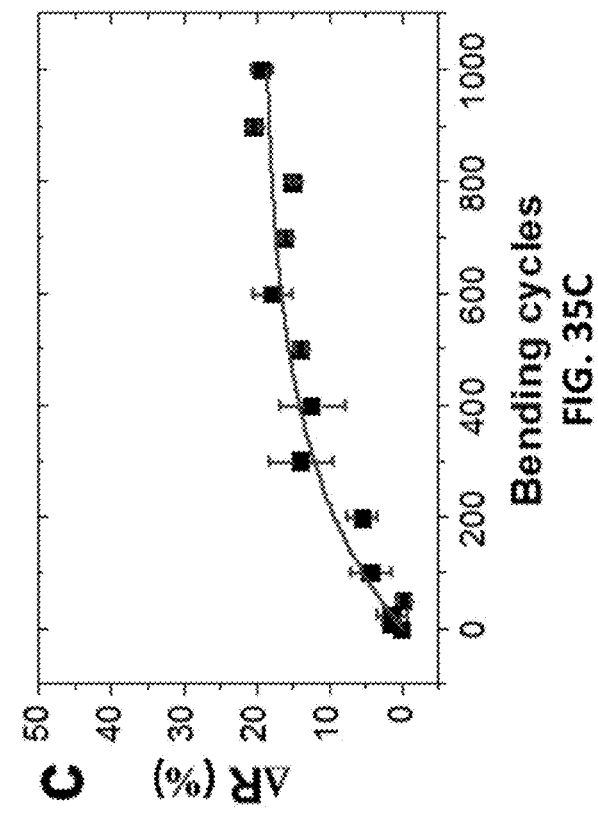
FIG. 35C shows the change in electrical resistance across the LIG as a function of bending cycles averaged for 2 separate devices. An exponential fit of the data is overlaid.

In FIG. 35C, a 17% increase in resistance is observed over ~500 bending cycles, but the electrical conductivity does not significantly degrade between 500-1000 bending cycles. This represents a significant improvement in formation of electrical contacts with LIG, as contact materials such as silver paint will crack and delaminate when subjected to similar bending tests.

Puncture Detector

Figure 36A:
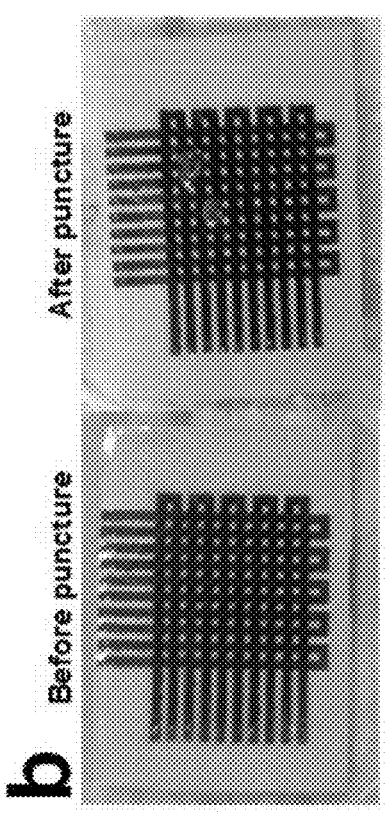
FIG. 36A is a schematic of an LDPE/LIG/LDPE/LIG/Tape multilayer composite puncture detector.

Likewise, the conductivity of LIG patterns, along with the possibility of subsequent loss of conductivity due to damage, can be used to sense puncture. An LIG puncture detector is shown in FIG. 36A. The LIG puncture sensor was directly formed on the LDPE surface of duct tape, thus allowing easy conformal adhesion to various surfaces of interest. This device incorporates multiple layers of conductive LIG channels insulated from one another with a laminated LDPE film. A conductive skin that enables direct acquisition of information on surface status is of interest for industrial applications, such as in aerospace defense. A large increase of resistance by several orders of magnitude is observed when puncture occurs, thus indicating the position of continuity loss.

Figure 36B:
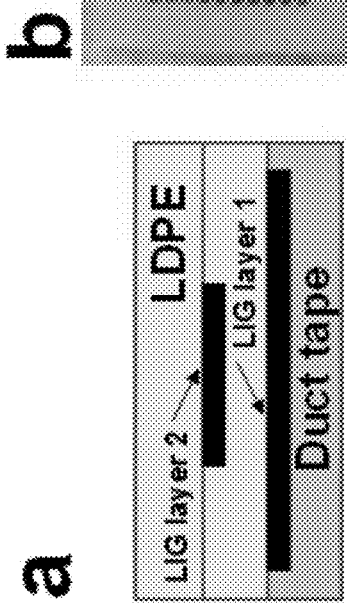
FIG. 36B is an optical images of the device before and after puncture.
Figure 36C:
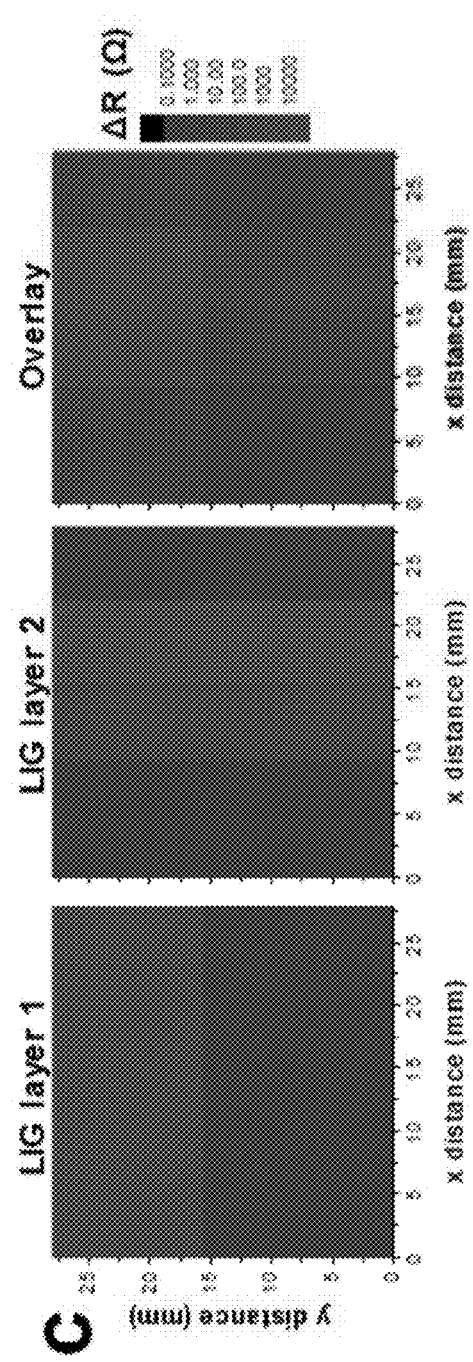
FIG. 36C is a heat map of resistance increase, indicating the positions of the puncture sites.

For instance, to develop a puncture detector, patterns of five u-shaped paths were lased. Then, as shown in FIG. 36A, the pattern was transferred to a piece of duct tape. Another pattern was transferred to a piece of LDPE. Subsequently, the LIG/LDPE composite was laminated in a perpendicular orientation onto the LIG/Duct Tape composite. The LIG shaped paths on the two layers are not in contact. The duct tape layer allows for easy adhesion to any surface of interest. The device detects puncture through a large increase in resistance. FIG. 36B is an optical images of the device before and after puncture. FIG. 36C is a heat map of resistance increase, indicating the positions of the puncture sites.

Active Devices

Figure 37A:
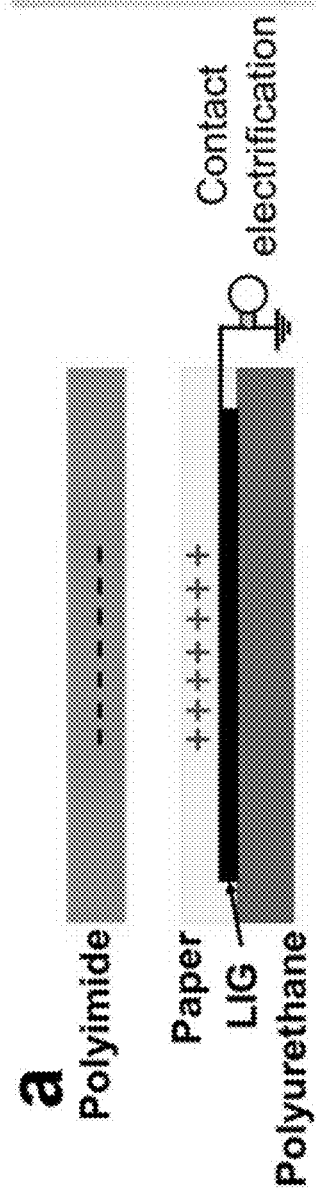
FIG. 37A is a schematic and optical image for PU/LIG/Paper triboelectric device.

As shown in FIG. 37A, the composites can be directly used as active materials in devices, such as triboelectric nanogenerators (TENGs). Optical images of a LDPE/LIG/PU TENG and a PU/LIG/Paper TENG formed through lamination compositing are shown in FIGS. 28A and 28C, respectively. For instance, a multilayer composite involving polyurethane, LIG, and paper was formed through lamination. The performance of a PU/LIG/Paper device is summarized in FIGS. 37B-37E, and its SEM cross-section is shown in FIG. 29C.

TENGs operate on the principle of charge transfer between two surfaces of dissimilar materials placed in contact, followed by subsequent separation that leads to electrical power generation via electrostatic induction. Robust LIG composites have been demonstrated for TENGs, which allows for rapid direct-write fabrication under ambient conditions of conductive electrodes. Since the triboelectric effect is dependent on the materials that are placed into contact, it is desirable to have composites with materials other than PI, which is a common tribo-negative material. Paper occupies a relatively tribo-positive position on the triboelectric series, therefore making it an ideal material to generate electrical power when contacted and separated from PI.

Figure 37B:
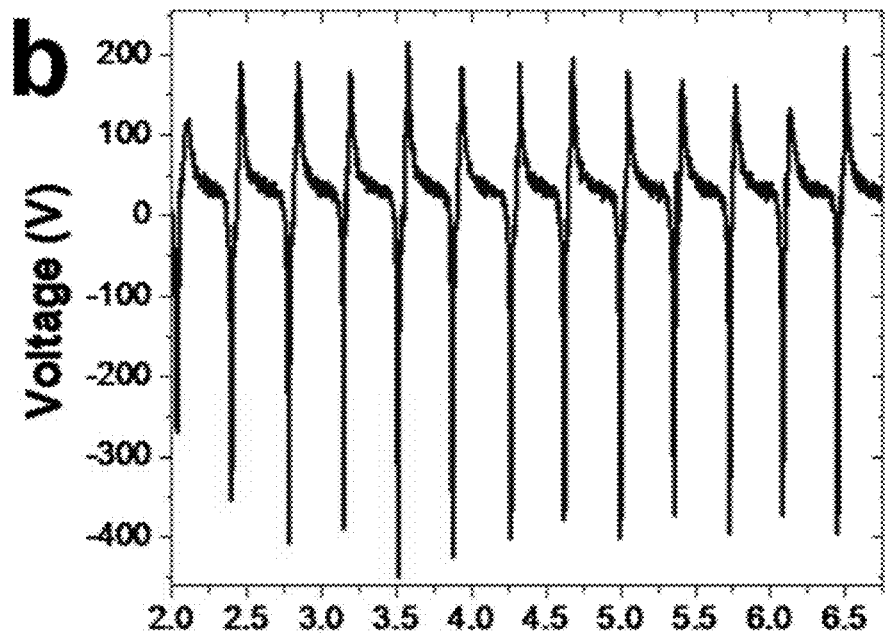
FIG. 37B is an open-circuit voltage for TENG contacted against PI.
Figure 37C:
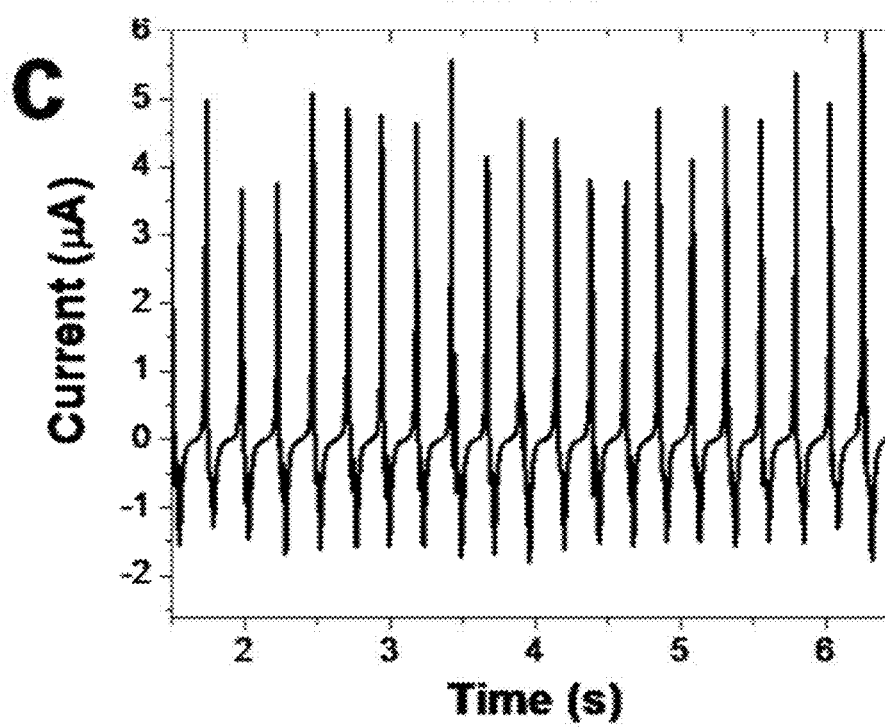
FIG. 37C is short-circuit current for TENG contacted against PI.
Figure 37D:
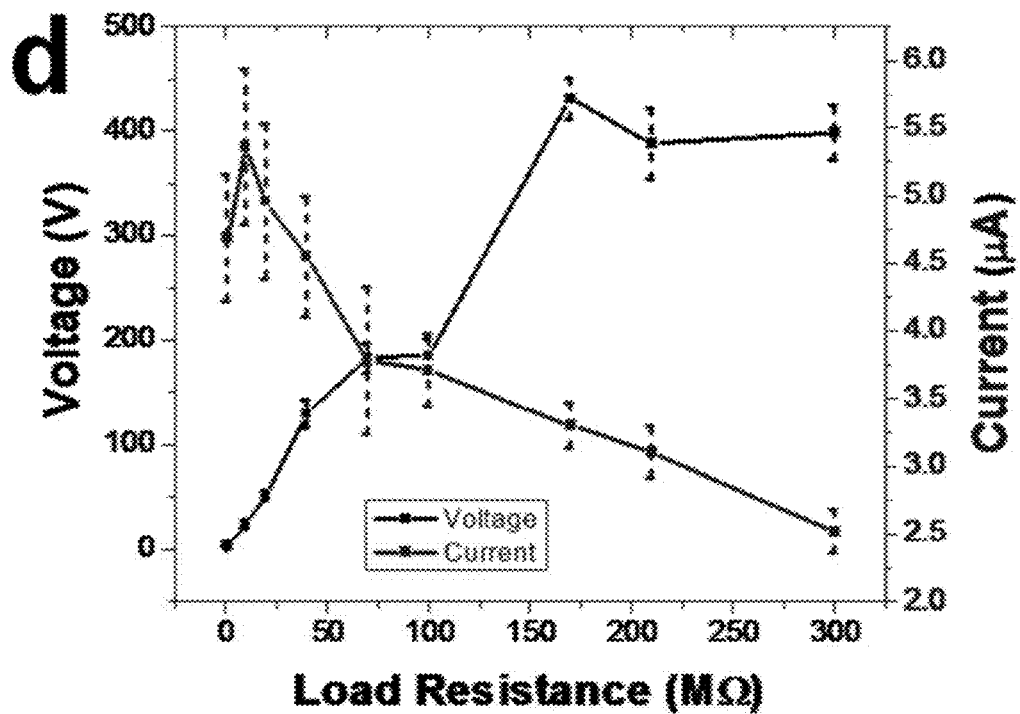
FIG. 37D is voltage and current generated as a function of load resistance.
Figure 37E:
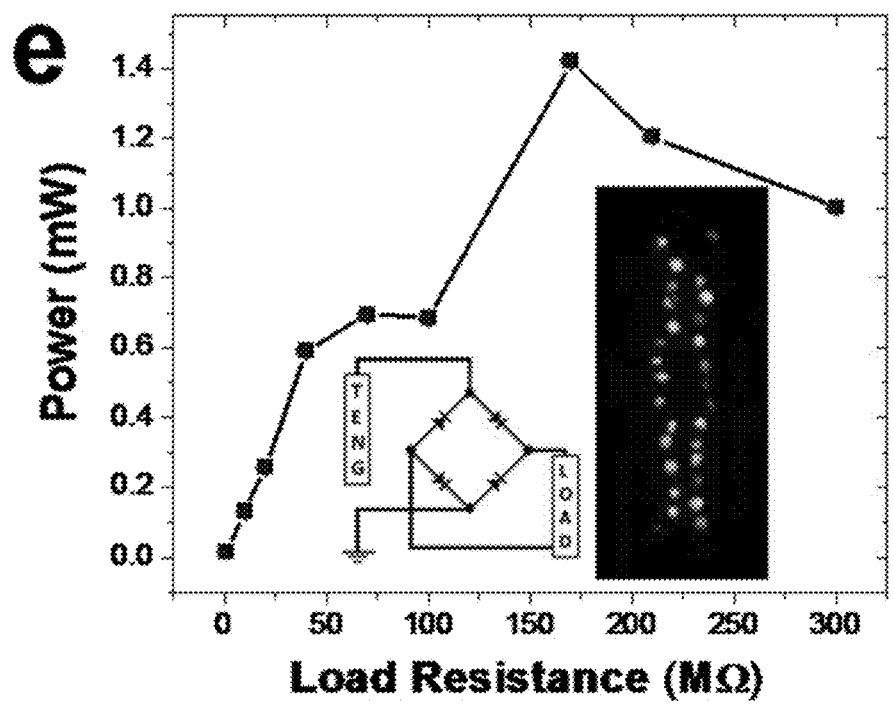
FIG. 37E is peak power generated as a function of load resistance.

FIGS. 37B-37C show that an open circuit voltage and short-circuit current of ~450V and 5.5 µA are generated, respectively. FIG. 37D reports the influence of an external load resistance on the output voltage and current characteristics, and the power output is summarized in FIG. 37E. A peak power output of ~1.4 mW is generated with a load resistance of 170 MΩ. As typical for TENGs, the power output is maximized when impedance matching with the TENG internal resistance occurs. An image of the PU/LIG/paper device lighting up 30 LEDs is shown in the inset of FIG. 37E.

Tape Composites

As the ability to adhere LIG composites and sensors to surfaces is desirable, compositing LIG with the outer layer of tapes was demonstrated. LIG/Duct Tape and LIG/Polyurethane film tape composites are shown in FIGS. 28D, 29D, and 32D and FIGS. 28A and 29A, respectively. If electrical conductivity of the exposed composite surface is undesirable but retention of conductivity by the composite layer is desirable, the addition of an outer layer of LDPE renders the previously exposed surface electrically insulated from the environment, as demonstrated in the LDPE/LIG/Duct Tape composite (FIG. 29D).

Similarly, protection of LIG devices on PI through compositing with a layer of polymer renders the devices abrasion resistant. Thus, LIG devices and patterns may be composited into the outer polymer layer of tapes, which can then be directly adhered onto surfaces of interest.

Due to their modest conductivity, LIG composites are suitable for applications that involve Joule-heating, such as thermal deicing, and, voltage application across similar LIG composites were demonstrated to exhibit active antimicrobial effects.

Biomedical Materials

For biomedical applications, a series of composites with biocompatible adhesives were also fabricated. As shown in FIG. 29I1, LIG was composited into latex PowerTape Athletic Medical Tape, which enables direct integration of LIG physiological indicator sensors for athletes and soldiers that can be easily applied on the field. Likewise, a LIG composite with ethylene vinyl acetate (EVA) 3M Transpore Surgical Medical Tape was formed (FIG. 32G). Compositing with surgical tape opens numerous possibilities for inclusion of sensors that monitor patient status, along with electrodes for application of bias voltages, to kill microorganisms through generation of reactive oxygen species (ROS), and electrostimulation to accelerate healing. Since LIG exerts antimicrobial effects, the LIG/Surgical Tape composite may yield additional protection against healthcare-associated infections. Likewise, biocompatible polymer encased LIG devices may be suitable where implantation of non-metallic soft electronics is desired, and LIG composites may be used to encase devices to enhance biocompatibility.

Due to the rapid direct-write nature of the LIG formation process, the sensors and devices may also be custom-tailored to the individual patient. For large area biosensing applications, a paper tissue paper-reinforced LDPE/LIG composite was likewise demonstrated (FIGS. 28F and 29G). Such a composite can wick away sweat for analysis by LIG devices embedded in the composite, and the adsorbent layer enables addition of fluids such as electrolyte gels, which may be crucial for the function of certain devices.

Bandage, Contact Angle Testing and Superhydrophobicity/Superhydrophilicity

LIG compositing with bandages was also demonstrated, as shown in FIGS. 38A-38E.

Composites with Band-aid® Sheer Strips were produced through direct lamination. See FIGS. 32H-32I. To form the internal composite surface that will be directly in contact with the wound, the skin-contacting surface of the adsorbent pad of the bandage was placed in contact with LIG on PI and laminated, to form a thin LIG/LDPE composite on the surface of the cotton pad. Since the LIG/LDPE composite surface was superhydrophobic as formed, having a contact angle of >150°, as shown FIG. 38C, but a superhydrophilic wound-contacting surface is desired, a 10 min treatment with an oxygen plasma using a Fischione Instruments Model 1020 Plasma Cleaner was sufficient to convert the superhydrophobic surface into its superhydrophilic counterpart, which has a contact angle of 0°. To form the protective superhydrophobic external surface of the bandage, the external face of the bandage was placed in contact with LIG on PI and laminated, leading to the direct formation of a superhydrophobic LIG/LDPE composite outer layer.

The LIG composites were engineered to have a superhydrophilic adsorbent pad surface that prevents undesirable adhesion to the wound. Previous studies demonstrated that superhydrophilic surfaces typically do not exhibit adhesion to biological materials, as there will perpetually exist an adsorbed layer of water on the superhydrophilic surface that shields the surface from adhesive interactions with wound tissue. Since the initially formed composite with the thin wound-contacting LDPE film that covers the adsorbent pad is superhydrophobic, as demonstrated through a contact angle of 159° that exceeds the 150° criteria for superhydrophobicity (FIG. 38C), treatment with oxygen plasma was necessary to make the surface superhydrophilic, as demonstrated by the contact angle measurement shown in FIG. 38D.

Figure 38A:
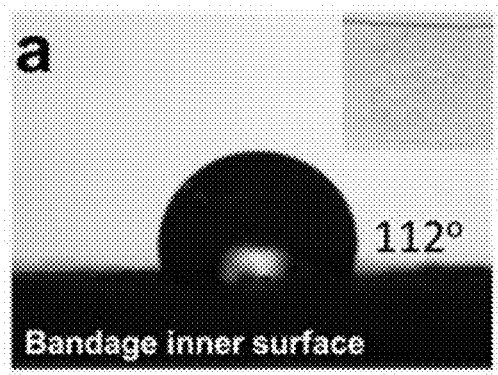
FIGS. 38A-38B show the contact angle measurements, respectively, for the (a) inner and (b) outer surface of an adhesive bandage.
Figure 38B:
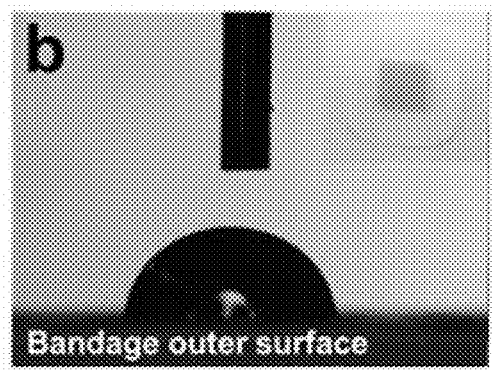
Figure 38C:
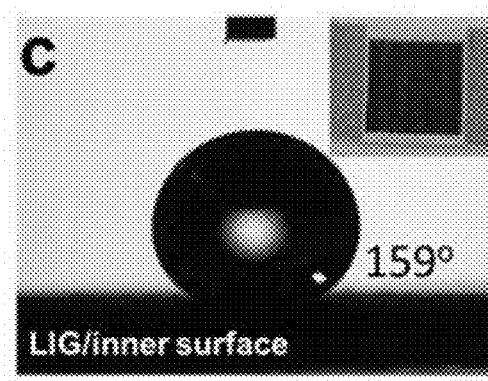
FIGS. 38C-38D show the contact angle measurements, respectively, for an adhesive bandage in which (c) LIG was laminated in the inner surface and (d) treated with 0 plasma.
Figure 38D:
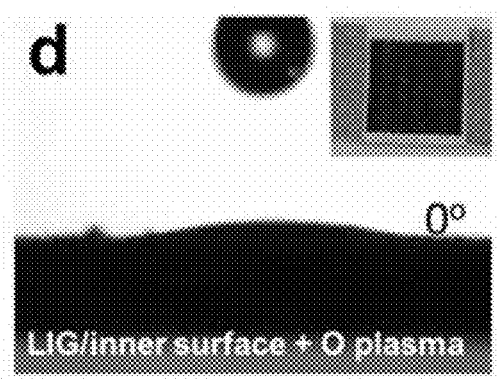
Figure 38E:
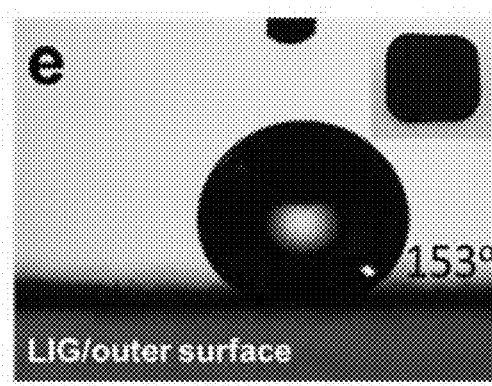
FIG. 38E shows the contact angle measurements for the LIG/LDPE composite outer surface of a bandage in which LIG was directly laminated into. Inset images of the adhesive bandages are shown in each of FIGS. 38A-38E.

The superhydrophobic to superhydrophilic conversion of LIG was shown in previous studies to be the result of radical modification of the LIG with oxygen functional groups simultaneously accompanied by a decrease morphological roughness that leads to the preference of the wet Wenzel state as opposed to the Cassie-Baxter superhydrophobic state. In contrast to the superhydrophilic non-adhesive wound-contacting inner adsorbent pad surface, the external surface of the bandage is desired to be superhydrophobic, in order to prevent contamination of the wound through wetting by fluids from the external environment. Thus, a superhydrophobic LIG/LDPE composite layer was directly formed on the external LDPE outer surface of bandages through lamination with LIG on PI (FIG. 38E). Therefore, the resulting bandage offers reduced adhesion to wounds which aids healing, along with protection from external aqueous fluids such as rain.

Also, in analogy to the surgical tape, LIG exhibits antimicrobial effects that were demonstrated in previous studies, thus preventing risk of infection. Likewise, voltage can be applied for electrostimulation to accelerate healing and for active killing of microbes through generation of ROS.

Laminator Modification

The laminator utilized in embodiments of the present invention can be a modification of commercially available laminators. For example, an AmazonBasics Model 89154U Thermal Laminator can be modified for use. To increase maximum temperature, the AUPO BF172 172° C. thermal safety fuse can be bridged by cutting out the fuse and wiring the two freed wire ends together. Then, to raise the temperature setting of the laminator, the 115° C., 125° C., and 130° C. KSD301 normally closed thermal control switches were replaced with CQC 160° C., 180° C., and 180° C. KSD301 normally closed thermal control switches, thus allowing for selection of either 160° C. or 180° C. as the desired composite lamination temperature. The second 180° C. KSD301 thermal switch enables the indicator light to signal ready when temperature exceeds 180° C. Other than bridging the thermal safety fuse and switching 3 KSD301 normally closed temperature control switches, the original laminator components can be left unchanged.

Since the laminator was primarily made of plastic, a 180° C. thermal control switch can be used to set the maximum temperature, as at temperatures beginning at 200° C. a smell of plastic decomposition vapors began, which plastic decomposition vapors could be seen originating from the laminator. For most thermoplastics, 180° C. is well sufficient, and for very thin films of low melting point plastics, the lower temperature 160° C. setting could be more suitable.

If composites of polymers with higher melting temperatures are desired, an all-metal internal component thermal laminator could be utilized, and simple replacement of the KSD301 normally closed thermal control switches will lead to achievement of the temperature of interest. However, for some cases, alternative strategies such as lamination compositing with a low melting point polymer adhesion layer followed by lamination with the high melting point polymer allows for avoidance of high temperatures that may damage decomposition-temperature-limited polymer layers within the stratified composite of interest.

Continuous Lamination Process

Figure 39:
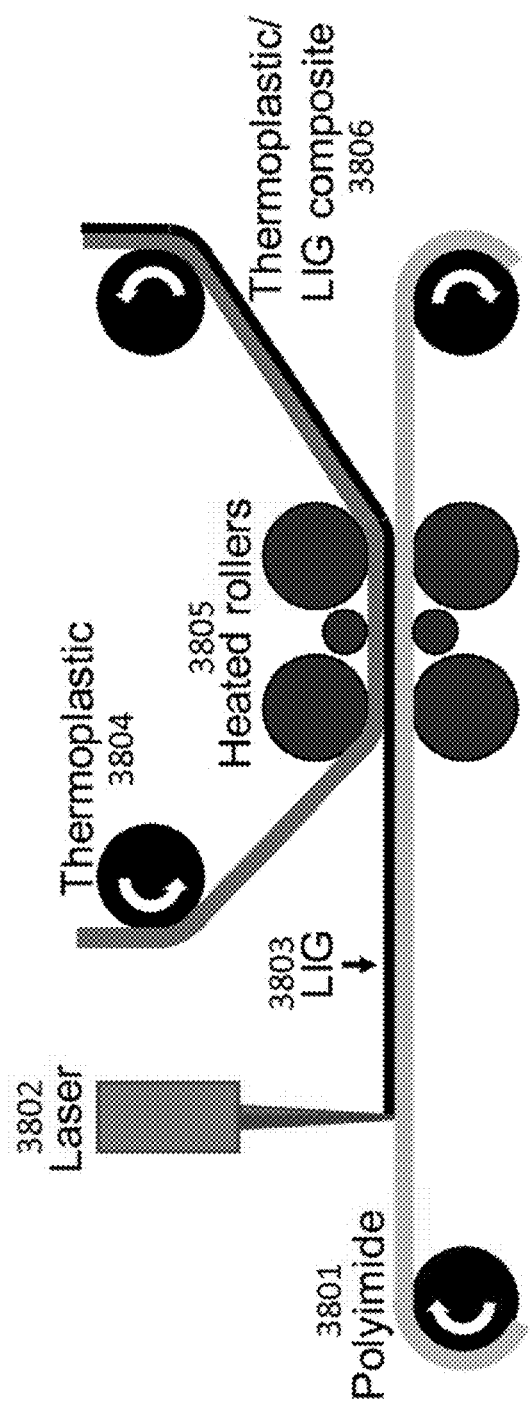
FIG. 39 is a schematic of a roll-to-roll process setup for a continuous lamination process for an embodiment of the present invention.

Techniques for scale-up of composites can be essential as the technology approaches commercialization. Schematics of the compositing processes used to produce the composites are shown in FIGS. 27A-27B. The initial LIG/polymer composites were formed by feeding the LIG on PI with the thermoplastic of interest through the laminator. A thermoset PETE polyester sleeve can be used to prevent the thermoplastic from melting onto the rollers. Afterward, the composite was peeled from the polyester lamination sleeve and PI. Such process is compatible with roll-to-roll processing, as shown in FIG. 39, and could potentially be scaled up to yield composites of any desired length. As shown FIG. 39, the PI substrate 3901 is irradiated with laser 3902 to form the LIG 3903 on the PI substrate 3901. Thermoplastic 3904 is then laminated on the LIF 3903/PI substrate 3901 composite using heated rollers 3905. The thermoplastic/LIG composite 3906 is then separated (such as by peeling) from the PI substrate 3901. By such process, continuous thermoplastic/LIG composite 3906 can be formed.

LIG Composites in Memory Devices

LIGC can be used in soft electronics, such as a component in resistive random-access memory (RRAM). RRAM has been considered as potential nonvolatile memory due to its advantages such as fast write/erase speed, low operation voltage, low power consumption and good scalability when compared to conventional flash memory. RRAM has a simple metal-insulator-metal (MIM) configuration, which has an active material sandwiched between two electrodes.

Figure 40:
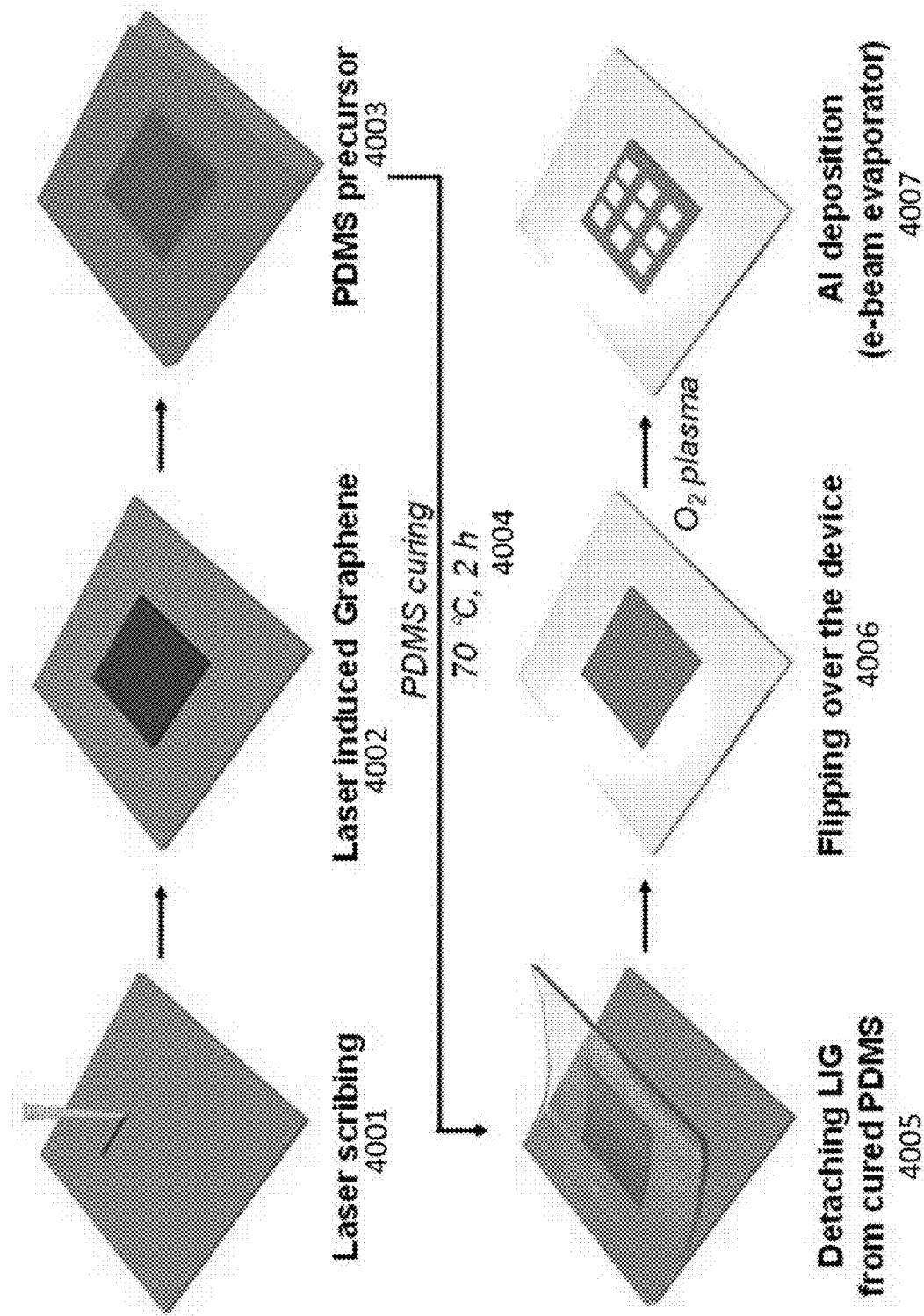
FIG. 40 is a schematic of the fabrication process flow for a memory device including a LIG composite.

FIG. 40 shows a schematic diagram of a fabrication process flow for a memory device utilizing a PI substrate and a PDMS precursor. In steps 4001-4002, LIG is synthesized by using laser scribing process. In steps 4003-4004, a LIG-PDMS precursor composite is formed. In step 4005, the LIG-PDMS composite is detached from the substrate. In step 4006, the free-standing LIG-PDMS composite is flipped over. In step 4007, a memory device based on a LIG-PDMS composite is formed by $O_2$ plasma treatment and Al deposition (e-beam evaporation).

A LIGC resistive memory was made as follows: LIG in the LIGC-PDMS was made with 1000 PPI, 5% duty cycle. 100 nm-thick Al electrodes were deposited on the LIGC-PDMS by e-beam evaporation with a shadow mask. Before the deposition of metal electrodes, the LIGC-PDMS was treated by oxygen plasma in order to modify the surface properties using reactive ion etching (RIE, $O_2$, 50 W, 20 sccm, 50 mTorr, 1~5 min).

Figure 42:
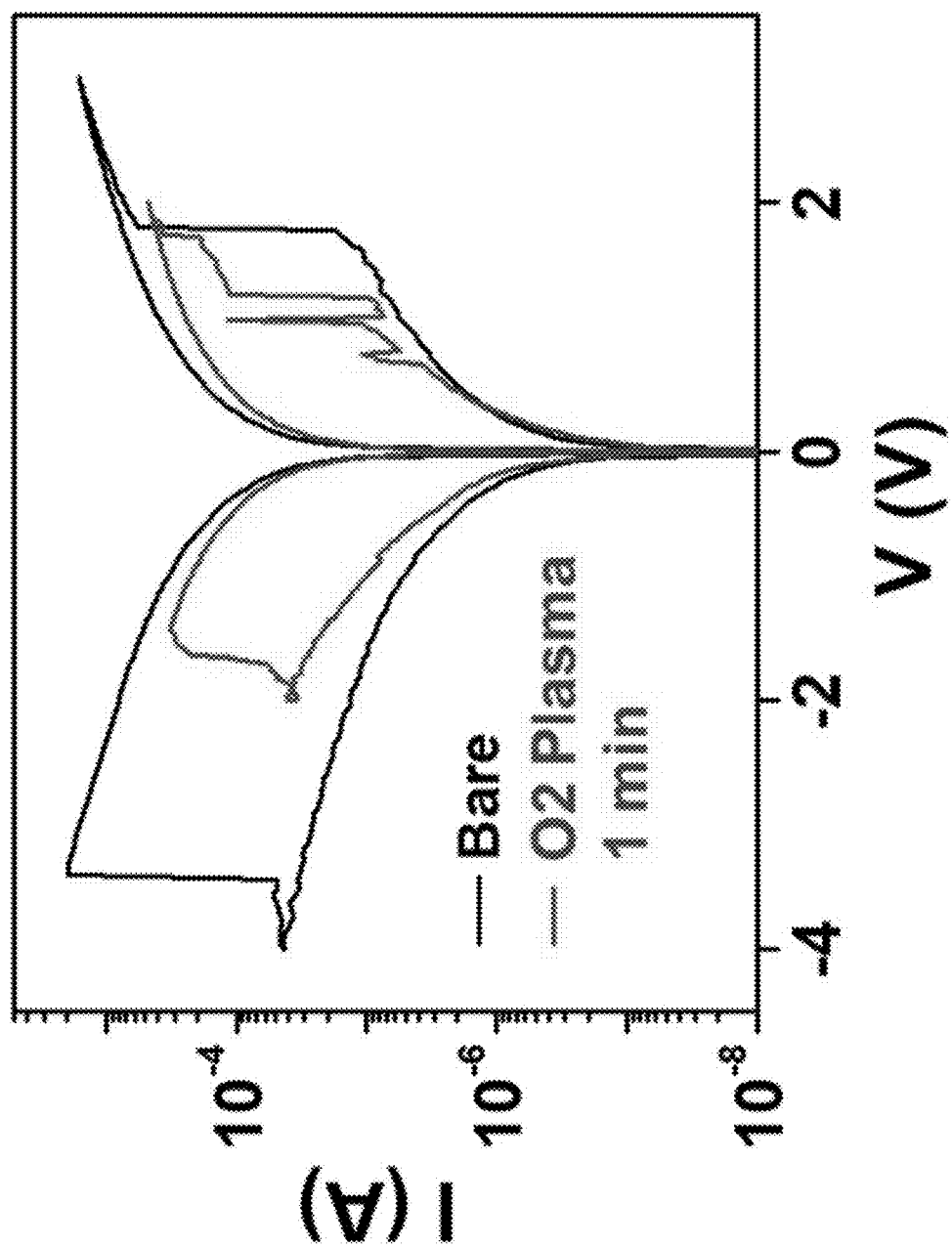
FIG. 42 is a graph showing I-V characteristics of a memory device with and without $O_2$ plasma treatment
Figure 44A:
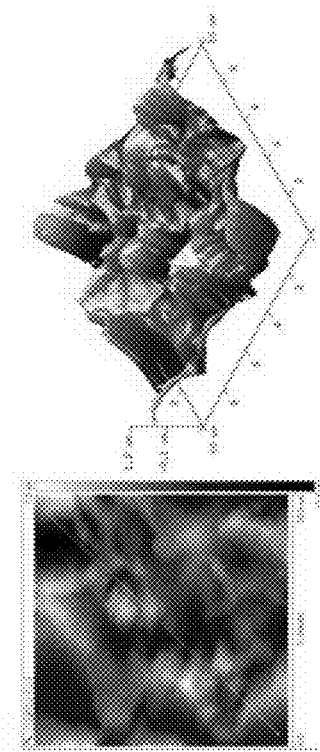
FIGS. 44A-44D are surface morphologies of LIGC-PDMS samples with and without $O_2$ plasma treatment based on AFM analysis.
Figure 44B:
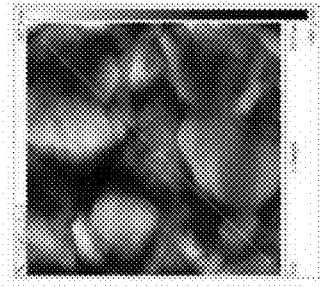
Figure 44C:
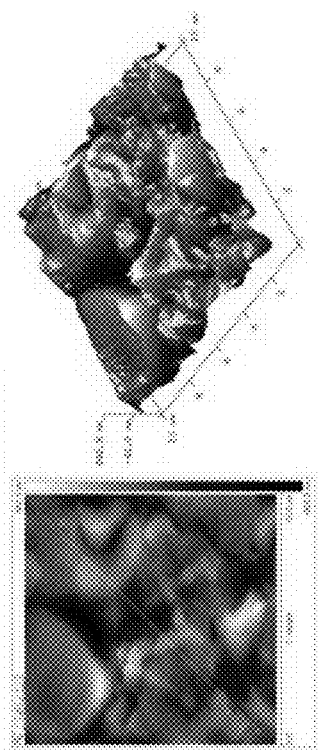
Figure 44D:
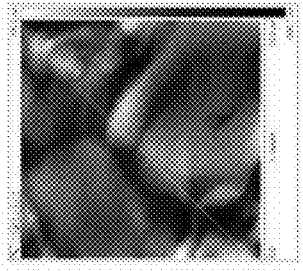

FIG. 41A shows a schematic diagram and a photograph of a fabricated LIGC-PDMS-1000 PPI memory device. As shown in FIG. 41B, the fabricated memory device displayed a typical bipolar resistive switching characteristic. The current abruptly increased at +0.8 V (SET) and decreased at −2 V (RESET) with the current ON and OFF ratio ($I_{ON}/I_{OFF}$) of $10^2$~$10^3$. Interestingly, as shown in FIG. 42, after $O_2$ plasma treatment on the surface of the composite, the operational voltage was sharply reduced. This might result because of the smoother surface and higher oxygen content after $O_2$ plasma treatment, according to SEM, atomic force microscopy (AFM) and XPS analyses. See FIGS. 43A-43D, 44A-44D, and 4A-45C and TABLE V.

TABLE V

| Atomic concentration of the LIGC-PDMS surfaces with and without O2 plasma treatment from XPS analyses. | | | | |
|---|---|---|---|---|
| | Bare | 1 min | 3 min | 5 min |
| C (%) | 46.7 | 37.9 | 36.9 | 38.6 |
| O (%) | 31.3 | 37.9 | 38.4 | 36.9 |
| Si (%) | 22.1 | 24.2 | 24.7 | 24.5 |

Figures 46A, 46B:
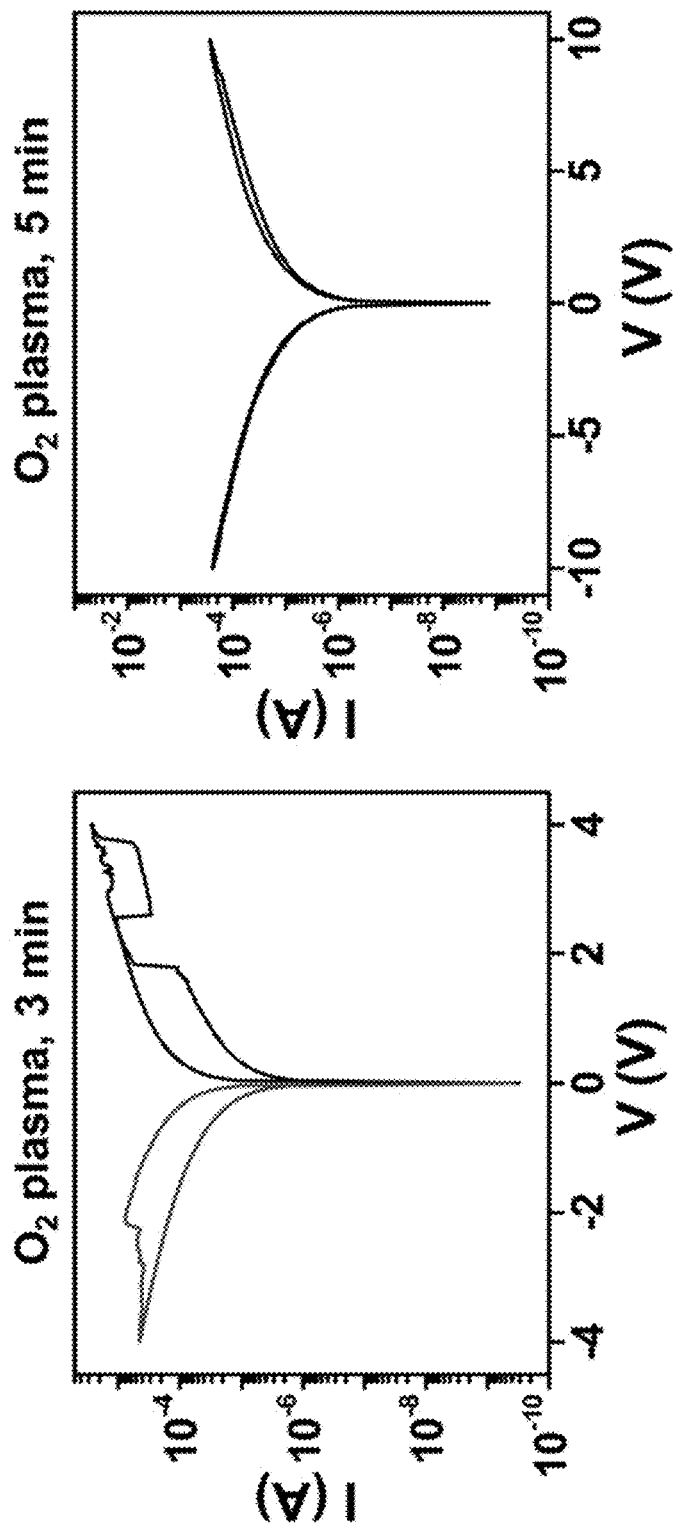
FIGS. 46A-46B show the electrical properties of the memory devices with $O_2$ plasma treatment at, respectively, (A) 3 min, and (B) 5 min.
Figures 47A, 47B, 47C, 47D:
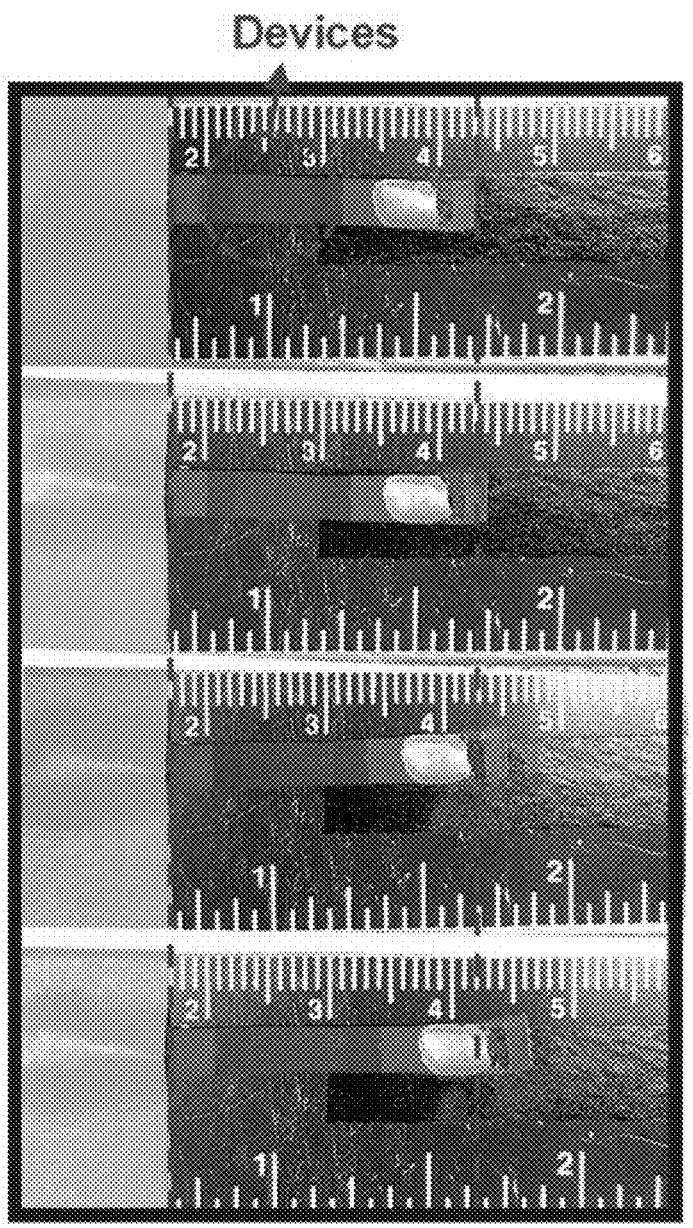
FIGS. 47A-47D are photographs of stretching test for the 1 min $O_2$ plasma treated memory device with tensile strain (ε) at, respectively, (A) 0, (B), 3.8%, (C) 7.7%, and (D) 11.5%.

$O_2$ plasma treatment for ~1 min enhanced the electrical properties of the device. The devices treated by $O_2$ plasma for 3 and 5 min showed significant degradation in the electrical properties as shown in FIGS. 46A-46B due to surface damage, producing poor electrical contact between the LIGC-PDMS-1000 PPI and electrodes.

FIGS. 41C-41D show the data retention and endurance characteristics of the resistive memory device. The current ON and OFF states were well maintained for $10^5$ seconds and 200 SET/RESET cycles with $I_{ON}/I_{OFF}$ ratio of $10^2$~$10^3$. In the endurance test, the pulse width in SET/RESET operations was 1 ms and amplitude was 2 V and −4 V, respectively, at a read voltage of 0.1 V.

Figures 48A, 48B:
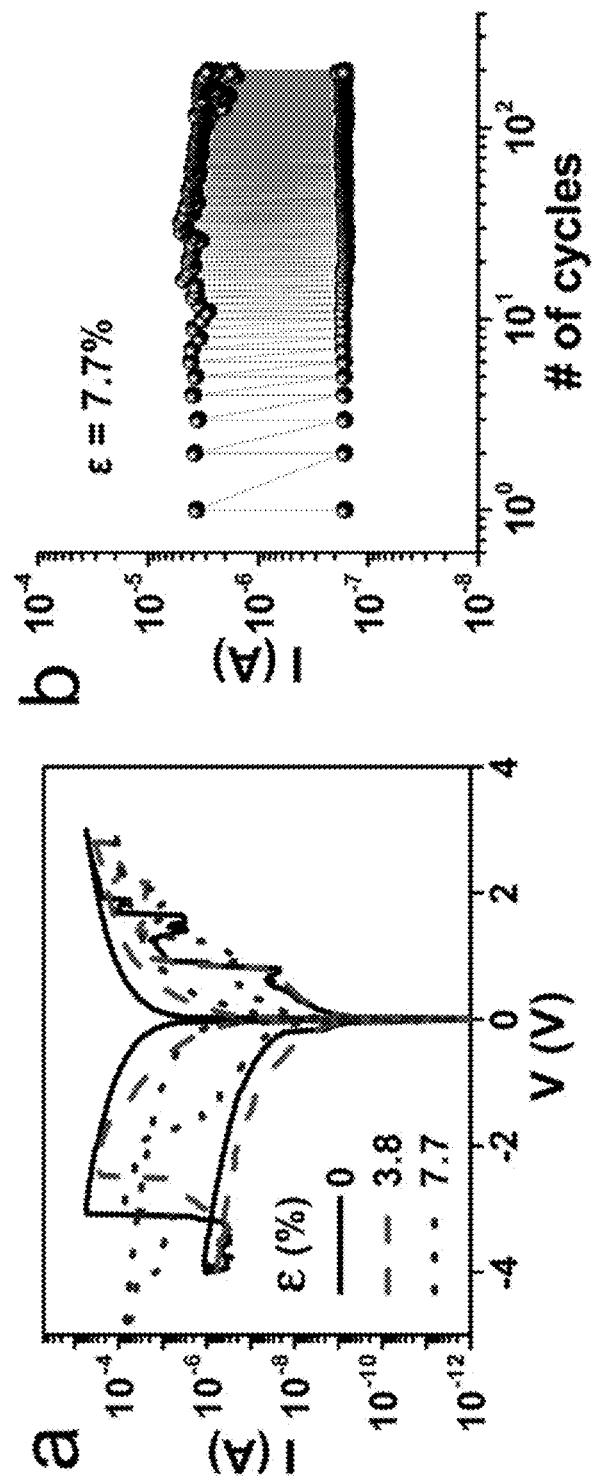
FIGS. 48A-48B show memory characteristics of the 1 min $O_2$ plasma treated device with tensile strain.
Figure 49:
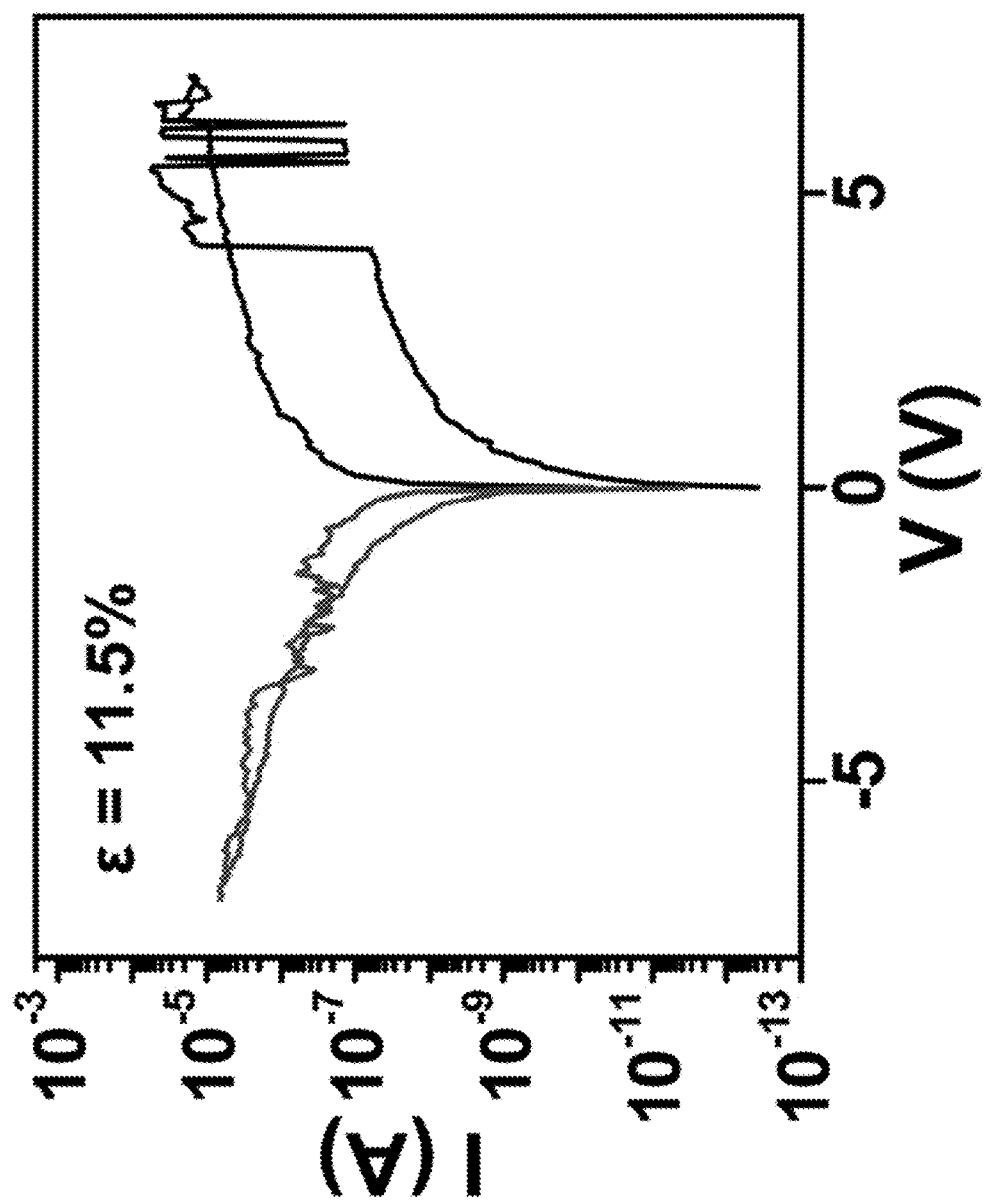
FIG. 49 shows resistive switching characteristic of the 1 min $O_2$ plasma treated device at ε=11.5%.

As shown in FIGS. 47A-47D, a stretching test of the device was performed by applying tensile strain from 0 to 11.5%. The device demonstrated resistive switching behavior up to tensile strain of 7.7%, with degradation in the electrical properties to some degree, and it was not operational at a tensile strain of 11.5%. See FIGS. 48A-48B and 49. The results reflect that LIGC-PDMS composite can be used as a stretchable nonvolatile memory device.

Figure 50B:
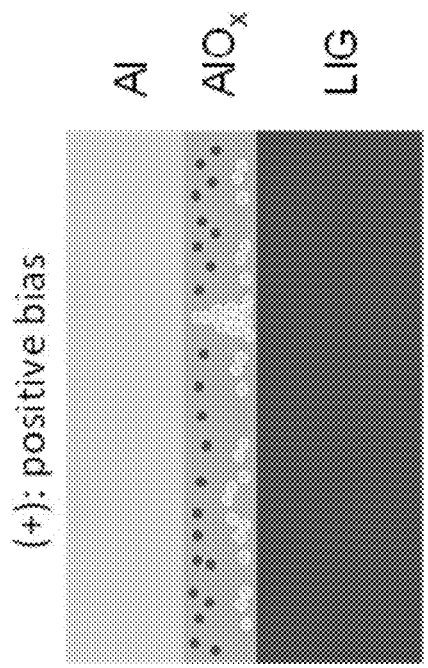
FIGS. 50A-50C show a resistive switching mechanism of a LIGC-PDMS resistive memory device.
Figure 50C:
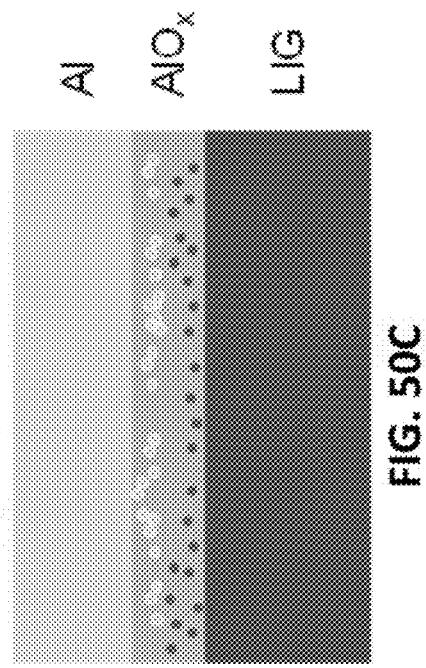
Figure 50A:
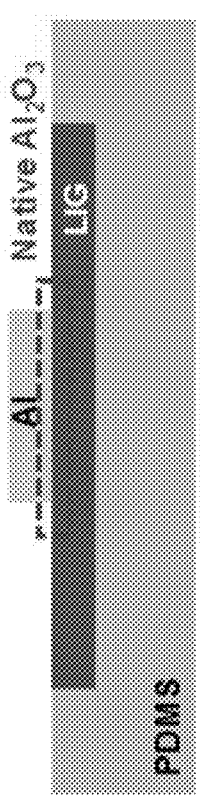

Carbon and Al contact can induce the resistive switching characteristics by the redox reaction at the interface between carbon and native $Al_2O_3$, which is a well-known material for resistive switching. The positive bias might result in the local conducting path from oxygen vacancies generated by carbon with strong affinity to oxygen, and the negative bias might annihilate oxygen vacancies due to the oxidation by oxygen in atmosphere. See FIGS. 50A-50C.

Figure 51:
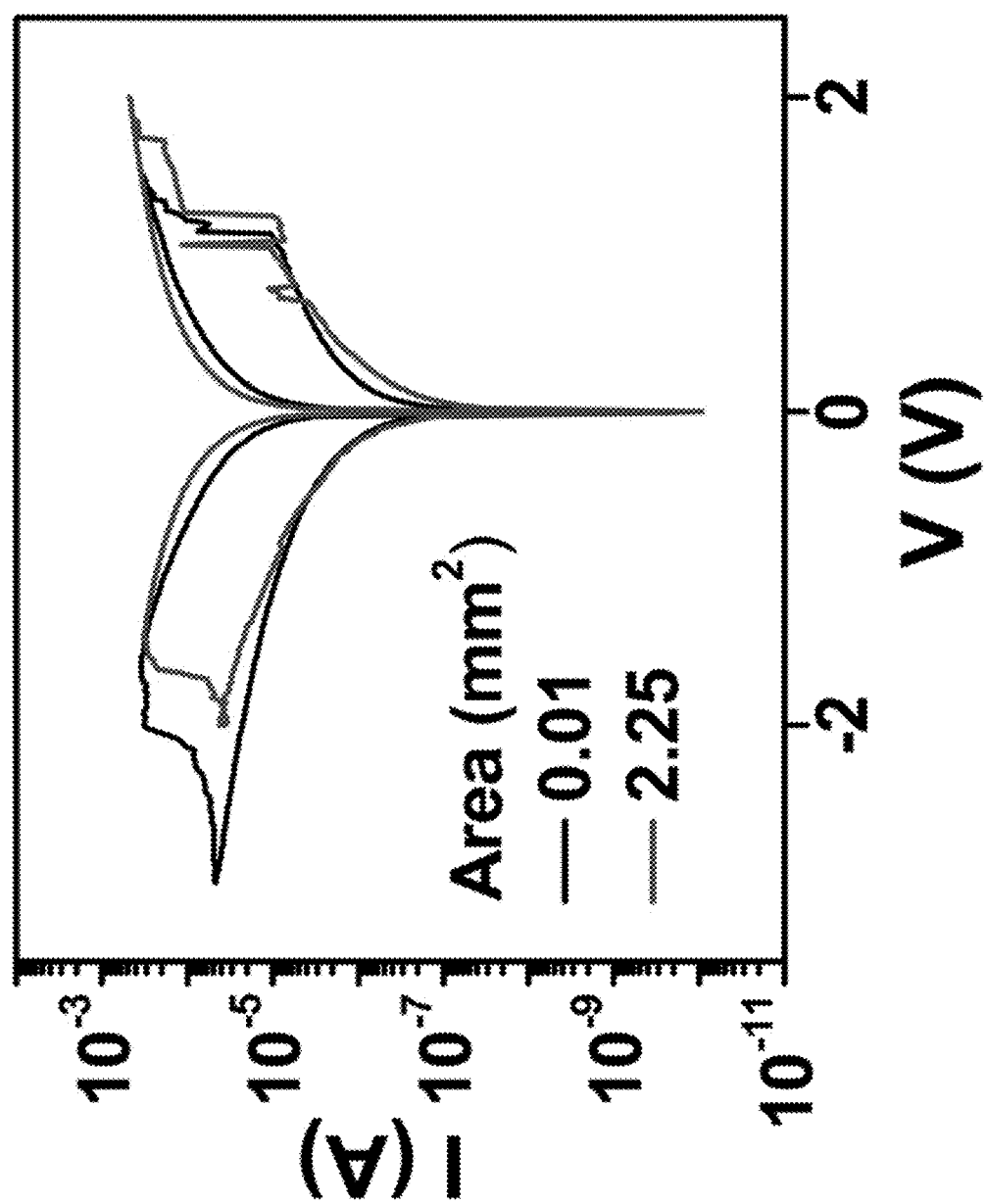
FIG. 51 shows size dependence in the resistive switching properties of the 1 min $O_2$ plasma treated memory device.

Size-independent switching characteristics of the memory devices also suggested that the resistive switching could be induced by a local conducting path. See FIG. 51.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

Amounts and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of approximately 1 to approximately 4.5 should be interpreted to include not only the explicitly recited limits of 1 to approximately 4.5, but also to include individual numerals such as 2, 3, 4, and sub-ranges such as 1 to 3, 2 to 4, etc. The same principle applies to ranges reciting only one numerical value, such as "less than approximately 4.5," which should be interpreted to include all of the above-recited values and ranges. Further, such an interpretation should apply regardless of the breadth of the range or the characteristic being described.

Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are now described.

Following long-standing patent law convention, the terms "a" and "an" mean "one or more" when used in this application, including the claims.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about" and "substantially" when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, the term "substantially perpendicular" and "substantially parallel" is meant to encompass variations of in some embodiments within ±10° of the perpendicular and parallel directions, respectively, in some embodiments within ±5° of the perpendicular and parallel directions, respectively, in some embodiments within ±1° of the perpendicular and parallel directions, respectively, and in some embodiments within ±0.5° of the perpendicular and parallel directions, respectively.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

REFERENCES

U.S. Patent Appl. Publ. No. 2017/0062821, published Mar. 2, 2017, to James M. Tour, et al. entitled "Laser Induced Graphene Materials And Their Uses In Electronic Devices" (Tour '821 Application").

Chu, K. H., et al., "Evaluation of Humic Acid and Tannic Acid Fouling in Graphene Oxide-Coated Ultrafiltration Membranes," ACS Appl. Mater. Interfaces., 2016, 8, 22270-22279 ("Chu 2016").

Faria, A. F., et al., "Elucidating the Role of Oxidative Debris in the Antimicrobial Properties of Graphene Oxide," ACS Appl. Nano Mater., 2018, 11164-1174 ("Faria 2018").

Hu, W. et al., "Graphene-based Antibacterial Paper," ACS Nano., 2010, 4, 4317-4323 ("Hu 2010").

Fu, C., et al., "Fabrication of Graphene/Titanium Carbide Nanorod Arrays for Chemical Sensor Application," Mater. Sci. Eng. C., 2017, 72, 425-432 ("Fu 2017").

G. Jessop, "Katharometers," J. Sci. Instrum. 1966, 43(11), 777-782 ("Jessop 1966").

Li, Y, et al., "Laser-Induced Graphene in Controlled Atmospheres: From Superhydrophilic to Superhydrophobic Surfaces," Adv. Mater. 2017, 1700496 ("Li 2017").

Lin, J., et al., "Laser-Induced Porous Graphene Films from Commercial Polymers," Nature Comm., 2014, 5:5714 ("Lin 2014").

Liu, G. et al., "Graphene-based Membranes," Chem. Soc. Rev., 2015, 44, 5016-5030 ("Liu 2015").

Peng, Z. et al., "Flexible Boron-Doped Laser-Induced Graphene Microsupercapacitors," ACS Nano., 2015, 9, 5868-5875. ("Peng 2015").

Singh, S. P., et al., "Sulfur-Doped Laser-Induced Porous Graphene Derived from Polysulfone-Class Polymers and Membranes," ACS Nano., 2018, 12, 289-297 ("Singh I 2018").

Singh, S. P., et al., "Laser-Induced Graphene Biofilm Inhibition: Texture Does Matter," ACS Appl. Nano Mater, 2018, 1, 1713-1720 ("Singh II 2018").

Singh, S. P., et al., "Laser-Induced Graphene Layers and Electrodes Prevents Microbial Fouling and Exerts Antimicrobial Action," ACS Appl. Mater. Interfaces., 2017, 18238-18247 ("Singh 2017").

Zhang, L., et al., "Nanocomposite Membrane with Polyethylenimine-Grafted Graphene Oxide as a Novel Additive to Enhance Pollutant Filtration Performance," Environ. Sci. Technol., 2018, 52, 5920-5930 ("Zhang 2018").

Zhou, F., et al., "Electrochemically Scalable Production of Fluorine-Modified Graphene for Flexible and High-Energy Ionogel-Based Microsupercapacitors," J. Am. Chem. Soc., 2018, 140, 8198-8205 ("Zhou 2018").

What is claimed is:

1. A gas sensor comprising laser-induced graphene (LIG), wherein the gas sensor is operable to sense a gas based on thermal conductivity changes.

2. The gas sensor of claim 1, wherein the gas sensor is operable to sense a gas selected from a group consisting of argon, carbon dioxide, dinitrogen, air, dioxygen, helium, dihydrogen, and mixtures thereof.

3. The gas sensor of claim 1, wherein the gas sensor is operable to sense a hydrocarbon gas, an ionic gas, or a dipolar gas.

4. The gas sensor of claim 1, wherein the gas sensor is operable to sense a volatile organic compound.

5. The gas sensor of claim 1, wherein the gas sensor comprises the LIG in a LIG composite.

6. The gas sensor of claim 1, wherein the gas sensor has two patterned LIG electrodes with a less than 50 μm PI gap between the two patterned LIG electrodes.

7. The gas sensor of claim 1, wherein the gas sensor has a patterned continuous LIG filament.

8. A method comprising forming a gas sensor comprising laser-induced graphene (LIG), wherein the gas sensor is operable to sense a gas based on thermal conductivity changes.

9. The method of claim 8, wherein the gas sensor is the gas sensor comprises the LIG in a LIG composite.

10. The method of claim 8, wherein the method further comprises patterning or laser-writing a laser-induced graphene wire between two electrodes.

11. A method comprising:
(a) selecting a gas sensor comprising laser-induced graphene (LIG), wherein the gas sensor is operable to sense a gas based on thermal conductivity changes; and
(b) utilizing the gas sensor to sense a gas or plasma, wherein utilizing the gas sensor to sense the gas or plasma based on thermal conductivity changes.

12. The method of claim 11, wherein the gas sensor comprises the LIG in a LIG composite.

13. The method of claim 11, wherein the gas sensor is utilized to sense a gas that is selected from a group consisting of argon, carbon dioxide, dinitrogen, air, dioxygen, helium, dihydrogen, and mixtures thereof.

14. The method of claim 11, wherein the gas sensor is utilized to sense a hydrocarbon gas, an ionic gas, or a dipolar gas.

15. The method of claim 11, wherein the gas sensor is utilized to sense a volatile organic compound.

16. The method of claim 11, wherein the gas sensor is utilized to sense the plasma.

17. The method of claim 11 further comprising repeatedly cleaning the gas sensor by applying a voltage across the laser-induced graphene which heats the gas sensor to displace adsorbates.

18. The method of claim 11, wherein the gas sensor is utilized to sense flue gas or flue gas mixtures.

* * * * *